US012720745B2

(12) United States Patent
Choi et al.

(10) Patent No.: US 12,720,745 B2
(45) Date of Patent: Aug. 25, 2026

(54) SEMICONDUCTOR MEMORY DEVICE, METHOD OF FABRICATING THE SAME, AND ELECTRONIC SYSTEM INCLUDING THE SAME

(71) Applicant: Samsung Electronics Co., Ltd., Suwon-si (KR)

(72) Inventors: Moo Rym Choi, Suwon-si (KR); Jung Tae Sung, Suwon-si (KR); Yun Sun Jang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 748 days.

(21) Appl. No.: 18/152,211

(22) Filed: Jan. 10, 2023

(65) Prior Publication Data

US 2023/0371255 A1 Nov. 16, 2023

(30) Foreign Application Priority Data

May 12, 2022 (KR) ........................ 10-2022-0058190

(51) Int. Cl.
*H10B 43/27* (2023.01)
*H10B 80/00* (2023.01)

(52) U.S. Cl.
CPC ............. *H10B 43/27* (2023.02); *H10B 80/00* (2023.02)

(58) Field of Classification Search
None
See application file for complete search history.

(56) References Cited

U.S. PATENT DOCUMENTS 8,971,118 B2 3/2015 Jin et al.
9,666,289 B2 5/2017 Lee et al.
(Continued)

FOREIGN PATENT DOCUMENTS

CN 109148469 A 1/2019
CN 109860197 A 6/2019
(Continued)

OTHER PUBLICATIONS

European Office Action corresponding to EP 23165716.4 dated Nov. 7, 2023 (9 pages).
(Continued)

*Primary Examiner* — Sarah K Salerno
(74) *Attorney, Agent, or Firm* — Wolf, Greenfield & Sacks, P.C.

(57) ABSTRACT

Provided are a memory device, a method of fabricating the same, and an electronic system including the same. The memory device includes a peripheral circuit structure and a cell structure on the peripheral circuit structure. The cell structure comprises a cell substrate including a first surface facing the peripheral circuit structure and a second surface opposite to the first surface and having a first conductivity type, gate electrodes on the first surface of the cell substrate, a channel structure intersecting the gate electrodes and connected to the cell substrate, a first impurity region that is in the cell substrate adjacent to the second surface and has a second conductivity type, and a second impurity region that is in the cell substrate and is spaced apart from the first impurity region, the second impurity region having the first conductivity type with a higher impurity concentration than that of the cell substrate.

20 Claims, 41 Drawing Sheets

(56) References Cited

U.S. PATENT DOCUMENTS

| | | | | |
|---|---|---|---|---|
| 11,158,622 | B1 | 10/2021 | Zhang | |
| 2018/0323207 | A1 | 11/2018 | Shim et al. | |
| 2020/0328225 | A1 | 10/2020 | Xiao | |
| 2021/0408034 | A1 | 12/2021 | Lee | |
| 2022/0320025 | A1* | 10/2022 | Choi | H10B 43/10 |

FOREIGN PATENT DOCUMENTS

| | | | |
|---|---|---|---|
| CN | 111180344 | A | 5/2020 |
| JP | 7039608 | B2 | 3/2022 |
| WO | 2021237492 | A1 | 12/2021 |

OTHER PUBLICATIONS

European Search Report corresponding to EP 23165716.4 dated Oct. 26, 2023 (4 pages).

* cited by examiner

FIG. 12

101 100 WC CH 102 MS1, MS2 104 104x 104y PA EXT CAR EXT PA X Y Z

FIG. 14

WC
101
100
CH
102
MS1, MS2
104
104x
104y
PA
EXT
CAR
EXT
PA
X
Y
Z

FIG. 16

WC
101
104(104)
100
CH
102
MS1, MS2
PA
EXT
CAR
EXT
PA
PA
EXT
CAR
EXT
PA
X
Y
Z

FIG. 27

R1
110
GSL
110
CH
130
134
132a
132b
130c
132

SEMICONDUCTOR MEMORY DEVICE, METHOD OF FABRICATING THE SAME, AND ELECTRONIC SYSTEM INCLUDING THE SAME

CROSS-REFERENCE TO RELATED APPLICATION

This application claims priority to Korean Patent Application No. 10-2022-0058190 filed on May 12, 2022, in the Korean Intellectual Property Office, and all the benefits accruing therefrom under 35 U.S.C. 119, the disclosure of which in its entirety is herein incorporated by reference.

BACKGROUND

The present disclosure relates to a semiconductor memory device, a method of fabricating the same, and an electronic system including the same. More specifically, the present disclosure relates to a semiconductor memory device including memory cells arranged in three dimensions, a method of fabricating the same, and an electronic system including the same.

Research is being conducted on a method of increasing the data storage capacity of a semiconductor memory device. For example, a semiconductor memory device including memory cells arranged in three dimensions has been proposed.

SUMMARY

Aspects of the present disclosure provide a semiconductor memory device with enhanced erase control performance.

Aspects of the present disclosure also provide an electronic system including a semiconductor memory device with enhanced erase control performance.

Aspects of the present disclosure also provide a method of fabricating a semiconductor memory device with enhanced erase control performance.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor memory device comprising a peripheral circuit structure, and a cell structure stacked on the peripheral circuit structure, wherein the cell structure comprises a cell substrate that includes a first surface facing the peripheral circuit structure and a second surface opposite to the first surface, the cell substrate having a first conductivity type, a plurality of gate electrodes stacked on (e.g., sequentially stacked on) the first surface of the cell substrate, a channel structure that intersects the plurality of gate electrodes and is connected to (e.g., electrically connected to) the cell substrate, a first impurity region in the cell substrate adjacent to the second surface, the first impurity region having a second conductivity type different from the first conductivity type, and a second impurity region that is in the cell substrate and is spaced apart from the first impurity region, the second impurity region having the first conductivity type with a higher impurity concentration than that of the cell substrate. In some embodiments, the channel structure that comprises a portion in the plurality of gate electrodes.

According to another aspect of the present disclosure, there is provided a semiconductor memory device comprising a peripheral circuit structure and a cell structure stacked on the peripheral circuit structure, the peripheral circuit structure comprising a peripheral circuit board, a peripheral circuit element on the peripheral circuit board, and a peripheral circuit interconnection structure electrically connected to the peripheral circuit element, and the cell structure comprising a P-type cell substrate which includes a first surface facing the peripheral circuit structure and a second surface opposite to the first surface, a mold structure comprising a plurality of gate electrodes stacked on (e.g., sequentially stacked on) the first surface of the cell substrate, a plurality of channel structures, each of which extends in a vertical direction that is not parallel to the first surface of the cell substrate, penetrates through the mold structure, and is connected to (e.g., electrically connected to) the cell substrate, a bit line connected to (e.g., electrically connected to) the channel structures and is between the peripheral circuit structure and the mold structure, a plurality of gate contacts connected to (e.g., electrically connected to) the plurality of gate electrodes, respectively and are on the mold structure, a cell interconnection structure that is electrically connected to the bit line and the plurality of gate contacts, the cell interconnection structure contacting (e.g., bonded to) the peripheral circuit interconnection structure, an N-type first impurity region overlapping the plurality of channel structures in the vertical direction, in the cell substrate adjacent to the second surface, and a P-type second impurity region surrounding (e.g., extending around) at least a portion of the first impurity region in a plan view, in the cell substrate, the second impurity region having a higher impurity concentration than that of the cell substrate.

According to still another aspect of the present disclosure, there is provided an electronic system comprising a main substrate, a semiconductor memory device that is on the main substrate and comprises a peripheral circuit structure and a cell structure stacked on the peripheral circuit structure, and a controller that is electrically connected to the semiconductor memory device and is on the main substrate, wherein the cell structure comprises a cell substrate which includes a first surface facing the peripheral circuit structure and a second surface opposite to the first surface, the cell substrate having a first conductivity type, a plurality of gate electrodes stacked on (e.g., sequentially stacked on) the first surface of the cell substrate, a channel structure which intersects the plurality of gate electrodes and is connected to (e.g., electrically connected to) the cell substrate, a first impurity region in the cell substrate adjacent to the second surface of the cell substrate, the first impurity region having a second conductivity type different from the first conductivity type, and a second impurity region that is in the cell substrate and is spaced apart from the first impurity region, the second impurity region having the first conductivity type with a higher impurity concentration than that of the cell substrate. In some embodiments, the channel structure that comprises a portion in the plurality of gate electrodes.

According to still another aspect of the present disclosure, there is provided a method of fabricating a semiconductor memory device. The method comprises providing a cell substrate which has a first conductivity type and includes a first surface and a second surface that is opposite to the first surface, forming a mold structure comprising a plurality of gate electrodes stacked on (e.g., sequentially stacked on) the first surface of the cell substrate, forming a channel structure which intersects the plurality of gate electrodes and is connected to (e.g., electrically connected to) the cell substrate, forming a cell interconnection structure on the mold structure, providing (e.g., bonding) the cell interconnection structure on a peripheral circuit structure, forming a first impurity region in the cell substrate, wherein the first impurity region has a second conductivity type different from the first conductivity type and is adjacent to the second surface, and forming a second impurity region in the cell substrate, wherein the second impurity region has the first conductivity type with a higher impurity concentration than that of the cell substrate and is spaced apart from the first impurity region. In some embodiments, the channel structure that comprises a portion in the plurality of gate electrodes.

According to another aspect of the present disclosure, there is provided a method of fabricating a semiconductor memory device. The method comprises forming a mold structure comprising a plurality of gate electrodes stacked on (e.g., sequentially stacked on) a base substrate, forming a channel structure which intersects the plurality of gate electrodes and is connected to (e.g., electrically connected to) the base substrate, exposing an end of the channel structure by removing at least a portion of the base substrate, forming a cell substrate which is connected to (e.g., electrically connected to) the end of the channel structure and has a first conductivity type, wherein the cell substrate comprises a first surface on which the mold structure is disposed, and a second surface opposite to the first surface, forming a first impurity region in the cell substrate by performing a first ion-implanting process on the second surface of the cell substrate, wherein the first impurity region has a second conductivity type different from the first conductivity type and is adjacent to the second surface, forming a second impurity region in the cell substrate by performing a second ion-implanting process on the second surface of the cell substrate, wherein the second impurity region has the first conductivity type with a higher impurity concentration than that of the cell substrate and is adjacent to the second surface, and performing a laser annealing process on the second surface of the cell substrate. In some embodiments, the channel structure that comprises a portion in the plurality of gate electrodes.

It should be noted that the effects/aspects of the present disclosure are not limited to those described above, and other effects/aspects of the present disclosure will be apparent from the following description.

BRIEF DESCRIPTION OF THE DRAWINGS

The above and other aspects and features of the present disclosure will become more apparent by describing in detail example embodiments thereof with reference to the attached drawings.

FIG. 12 is a schematic layout diagram of a first impurity region and a second impurity region of the semiconductor memory device illustrated in FIG. 11.

Figure 14:
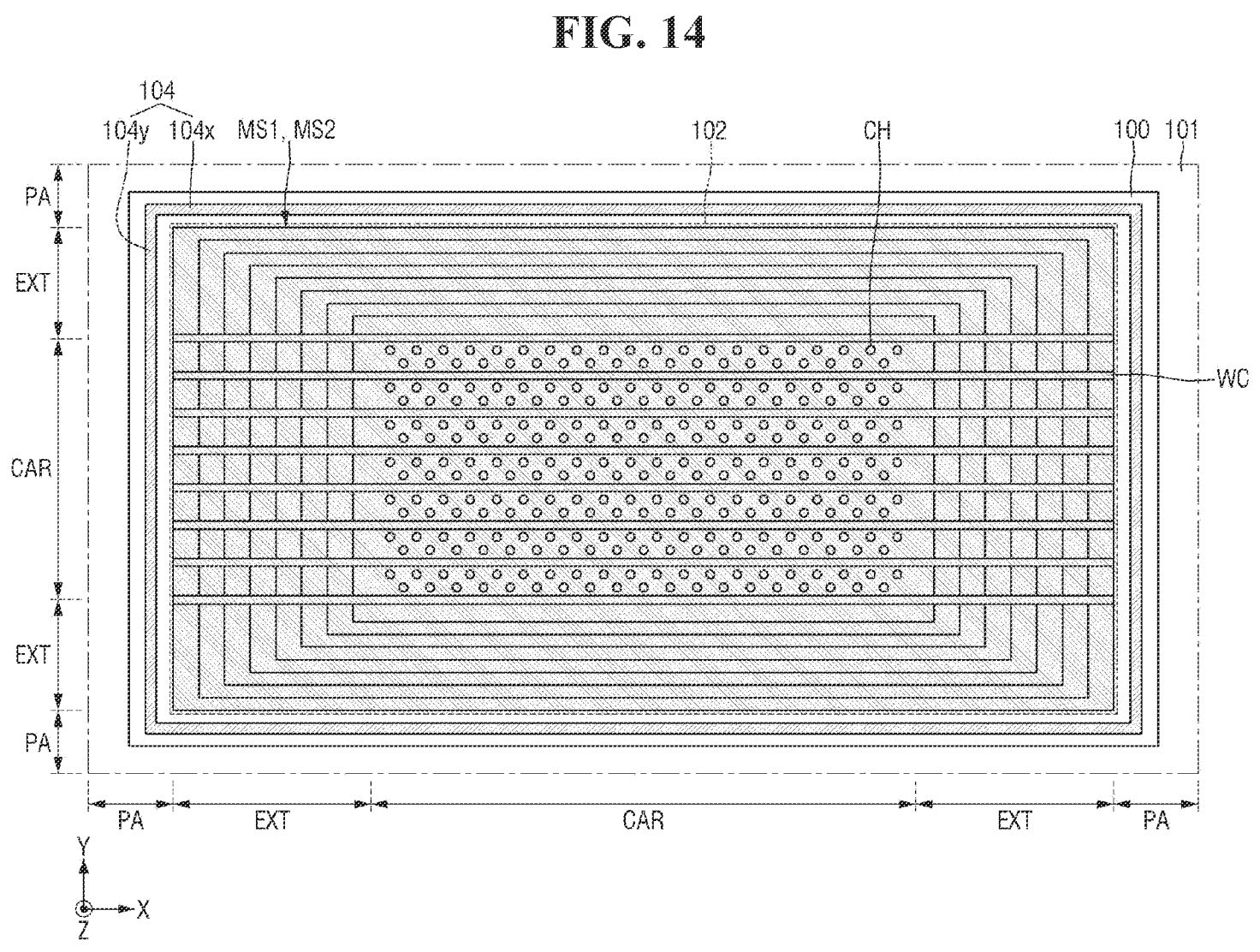

FIG. 14 is a schematic layout diagram of a first impurity region and a second impurity region of the semiconductor memory device illustrated in FIG. 13.

Figure 16:
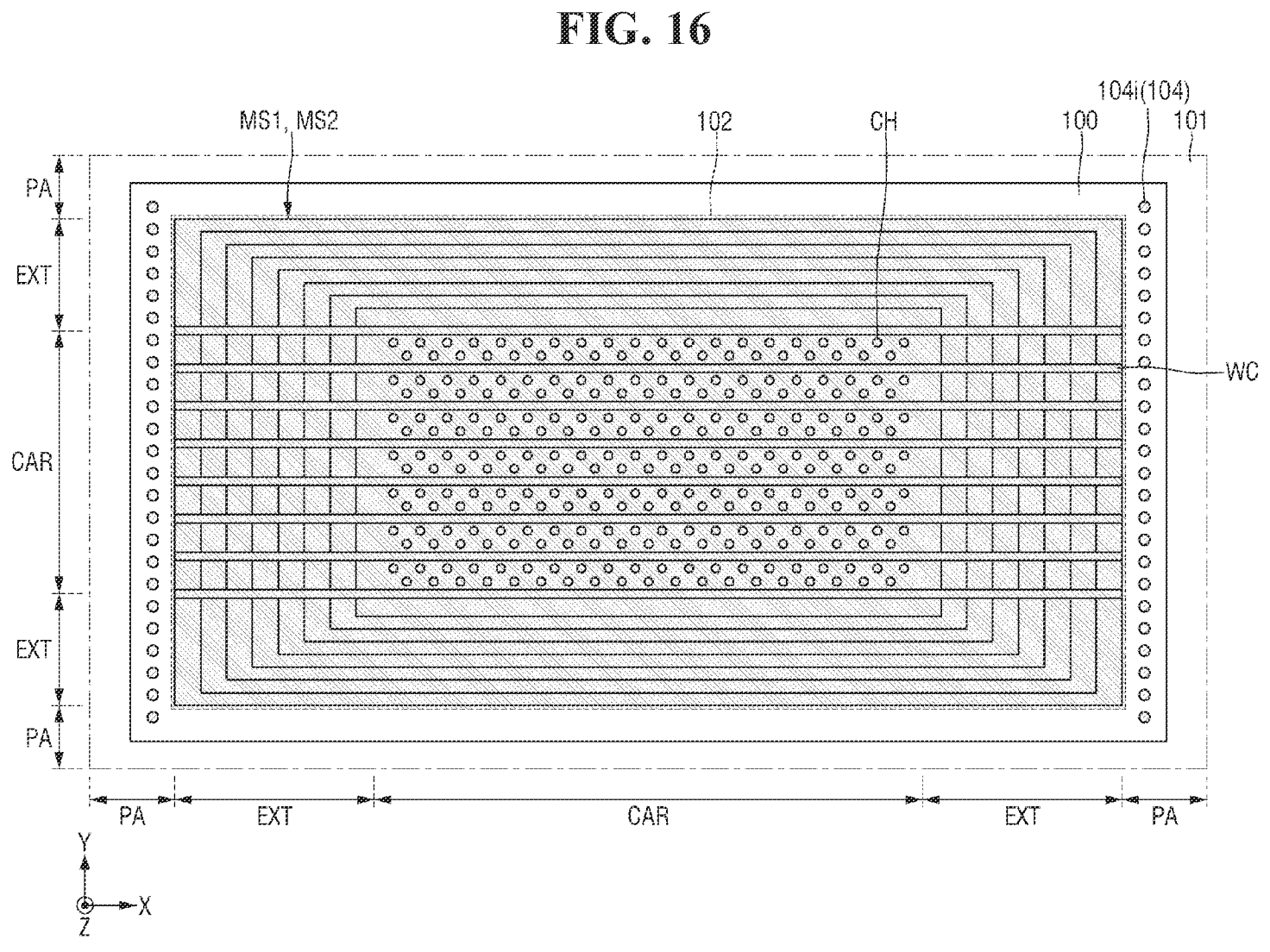

FIG. 16 is a schematic layout diagram of a first impurity region and a second impurity region of the semiconductor memory device illustrated in FIG. 15.

FIGS. 19 to 31 are views illustrating methods of fabricating a semiconductor memory device according to some embodiments.

FIGS. 32 to 35 are views illustrating methods of fabricating a semiconductor memory device according to some other embodiments.

DETAILED DESCRIPTION OF THE EMBODIMENTS

Hereinafter, example embodiments of the present invention will be described with reference to the attached drawings.

It will be understood that, although the terms first, second, and other terms may be used herein to describe various elements, these elements should not be limited by these terms. These terms are only used to distinguish one element from another. For example, a first signal may be referred to as a second signal, and, similarly a second signal may be referred to as a first signal without departing from the teachings of the disclosure.

Hereinafter, a semiconductor memory device according to example embodiments will be described with reference to FIGS. 1 to 18.

Figure 1:
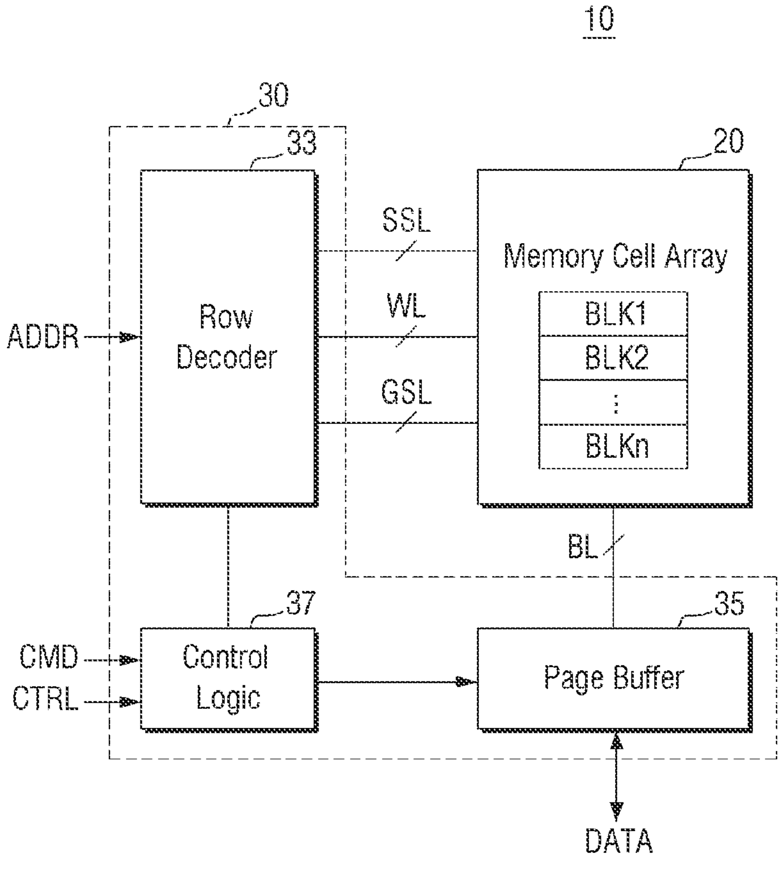
FIG. 1 is an example block diagram illustrating a semiconductor memory device according to some embodiments.

FIG. 1 is an example block diagram illustrating a semiconductor memory device according to some embodiments.

Referring to FIG. 1, a semiconductor memory device 10 according to some embodiments includes a memory cell array 20 and a peripheral circuit 30.

The memory cell array 20 may include a plurality of memory cell blocks BLK1 to BLKn. Each of the memory cell blocks BLK1 to BLKn may include a plurality of memory cells. The memory cell array 20 may be connected to the peripheral circuit 30 through bit lines BL, word lines WL, at least one string selection line SSL, and at least one ground selection line GSL. Specifically, the memory cell blocks BLK1 to BLKn may be connected to a row decoder 33 via the word lines WL, the string selection lines SSL, and the ground selection lines GSL. In addition, the memory cell blocks BLK1 to BLKn may be connected to a page buffer 35 via the bit lines BL. As used herein, "an element A connected to an element B" (or similar language) may mean that the element A is electrically connected to the element B and/or the element A contacts the element B.

The peripheral circuit 30 may receive an address ADDR, a command CMD, and a control signal CTRL from the outside of the semiconductor memory device 10, and may transmit and receive data DATA from and to a device outside the semiconductor memory device 10. The peripheral circuit 30 may include a control logic 37, the row decoder 33, and the page buffer 35. In some embodiments, the peripheral circuit 30 may further include various sub-circuits. For example, the sub-circuits may include an input/output circuit, a voltage generation circuit configured to generate various types of voltages necessary for the operation of the semiconductor memory device 10, an error correction circuit for correcting an error of data DATA read from the memory cell array 20, and the like.

The control logic 37 may be connected to the row decoder 33, the input/output circuit, and the voltage generation circuit. The control logic 37 may control overall operations of the semiconductor memory device 10. The control logic 37 may generate various internal control signals to be used in the semiconductor memory device 10 in response to the control signal CTRL. For example, the control logic 37 may adjust a voltage level which is provided to the word lines WL and the bit lines BL when a memory operation such as a program operation or an erase operation is performed.

The row decoder 33 may select at least one of the plurality of memory cell blocks BLK1 to BLKn in response to an address ADDR, and may select at least one word line WL of the selected memory cell block, at least one string selection line SSL, and at least one ground selection line GSL. In addition, the row decoder 33 may transmit a voltage for performing a memory operation to word lines of the selected memory block.

The page buffer 35 may be connected to the memory cell array 20 via the bit lines BL. The page buffer 35 may operate as a write driver or a sense amplifier. Specifically, when a program operation is performed, the page buffer 35 may operate as a write driver and apply a voltage according to data DATA to be stored in the memory cell array 20 to the bit lines BL. Meanwhile, when a read operation is performed, the page buffer 35 may operate as a sense amplifier and sense data DATA stored in the memory cell array 20.

Figure 2:
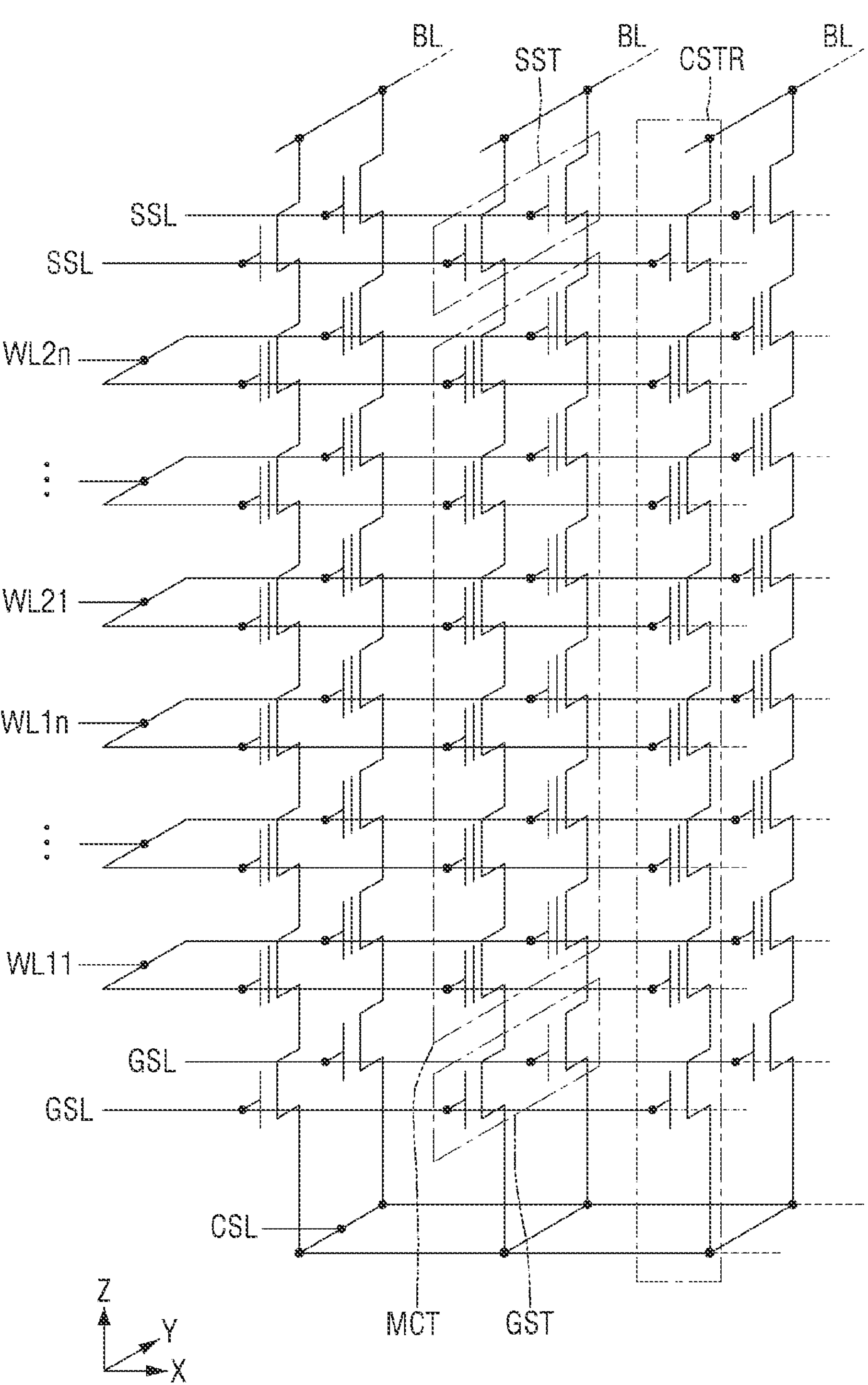
FIG. 2 is an example circuit diagram illustrating a semiconductor memory device according to some embodiments.

FIG. 2 is an example circuit diagram illustrating a semiconductor memory device according to some embodiments.

Referring to FIG. 2, a memory cell array (e.g., the memory cell array 20 in FIG. 1) of a semiconductor memory device according to some embodiments includes a common source line CSL, a plurality of bit lines BL, and a plurality of cell strings CSTR.

The plurality of bit lines BL may be arranged in two dimensions on a plane including a first direction X (also referred to as a first horizontal direction) and a second direction Y (also referred to as a second horizontal direction). For example, each of the bit lines BL may extend in the second direction Y and may be spaced apart from each other in the first direction X. The plurality of cell strings CSTR may be connected in parallel to each of the bit lines BL. The cell strings CSTR may be connected in common to the common source line CSL. That is, the plurality of cell strings CSTR may be disposed between the bit lines BL and the common source line CSL. As used herein, "an element A extends in a direction X" (or similar language) may mean that the element A extends longitudinally in the direction X.

Each of the cell strings CSTR may include a ground selection transistor GST connected to the common source line CSL, a string selection transistor SST connected to the bit line BL, and a plurality of memory cell transistors MCT disposed between the ground selection transistor GST and the string selection transistor SST. Each of the memory cell transistors MCT may include a data storage element. The ground selection transistor GST, the string selection transistor SST, and the memory cell transistors MCT may be connected in series.

The common source line CSL may be connected in common to sources of the ground selection transistors GST. Also, the ground selection lines GSL, a plurality of word lines WL11 to WL1*n* and WL21 to WL2*n*, and the string selection lines SSL may be disposed between the common source line CSL and the bit lines BL. The ground selection line GSL may be used as a gate electrode of the ground selection transistor GST, and the word lines WL11 to WL1*n* and WL21 to WL2*n* may be used as gate electrodes of the memory cell transistors MCT. The string selection line SSL may be used as a gate electrode of the string selection transistor SST.

Figure 3:
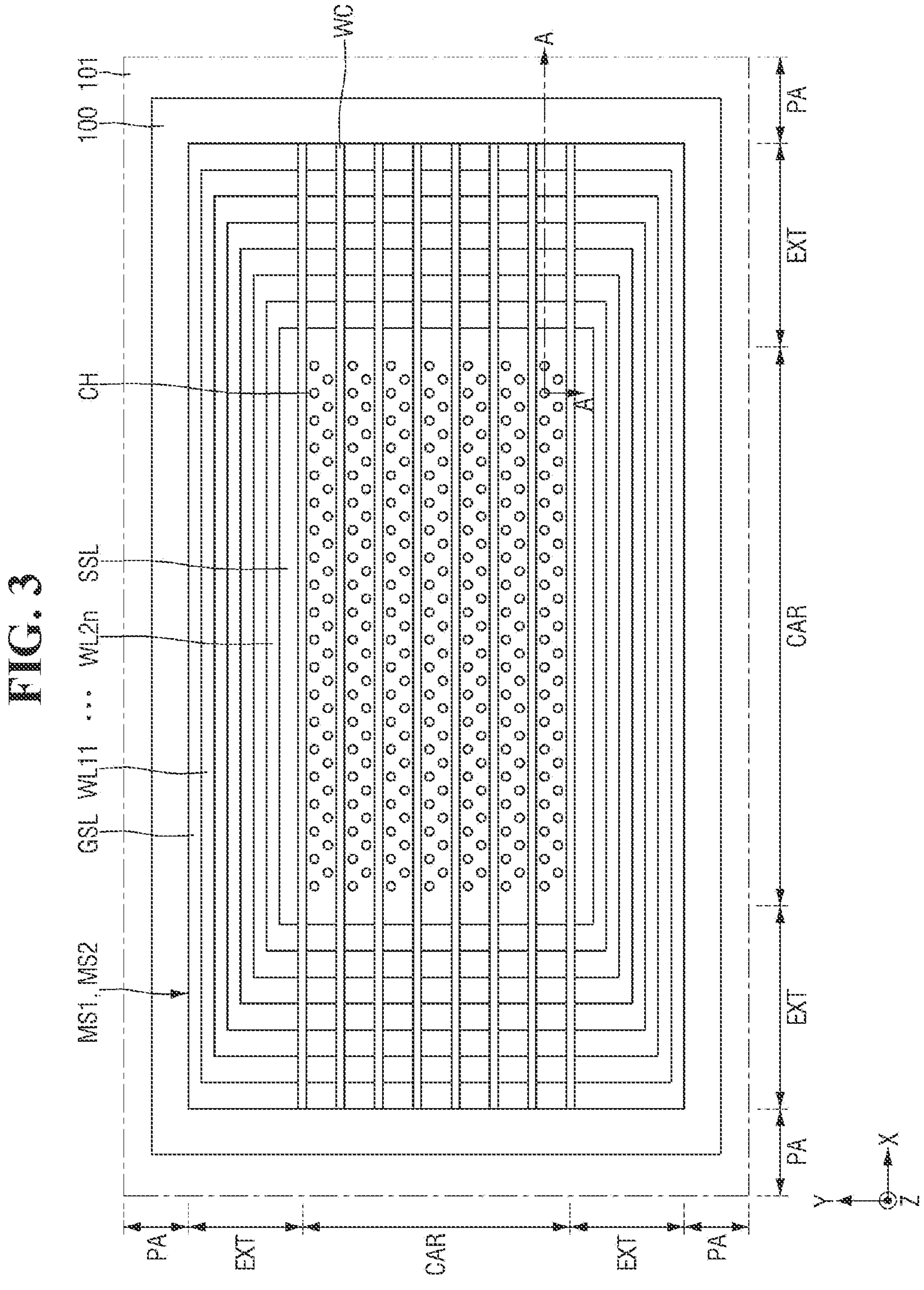
FIG. 3 is a schematic layout diagram of a semiconductor memory device according to some embodiments.
Figure 4:
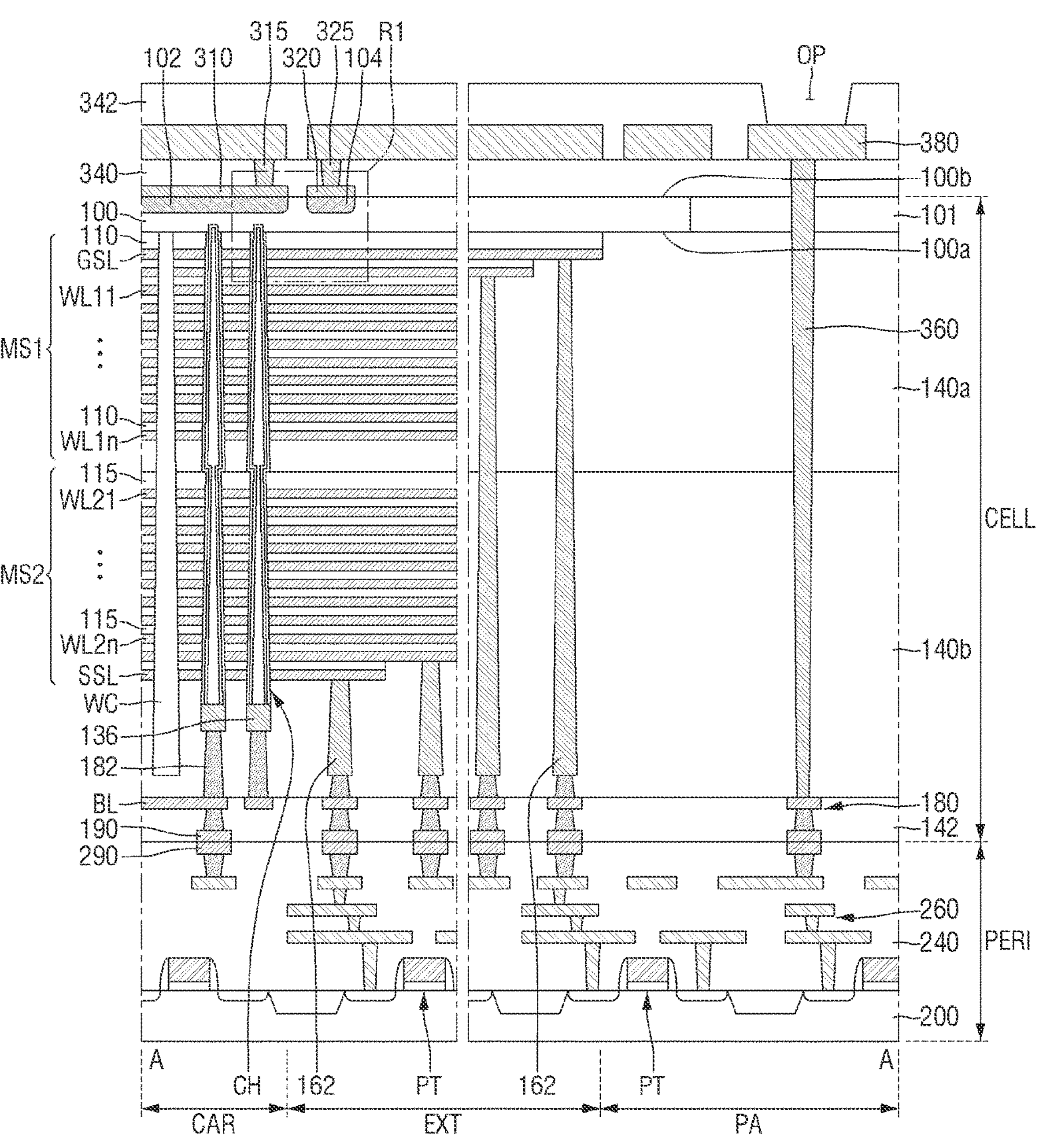
FIG. 4 is a cross-sectional view taken along the line A-A of FIG. 3.
Figure 5:
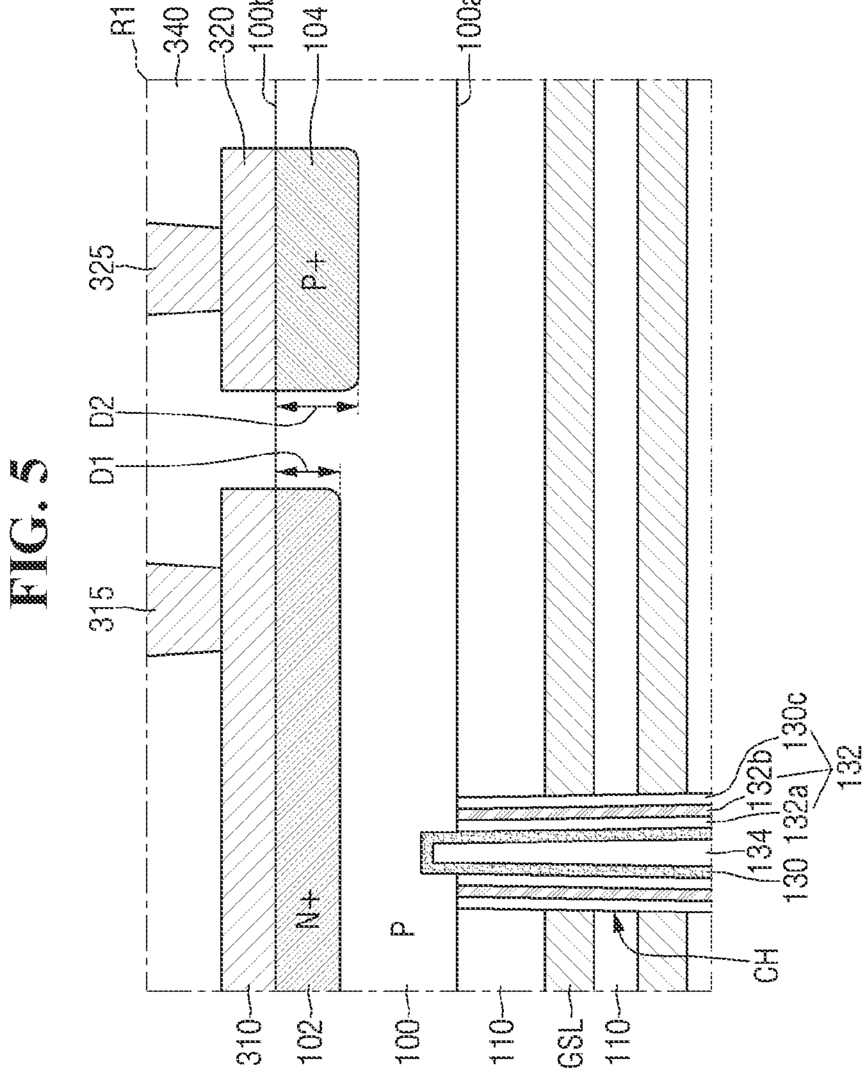
FIG. 5 is an enlarged view of the portion R1 of FIG. 4.
Figure 6:
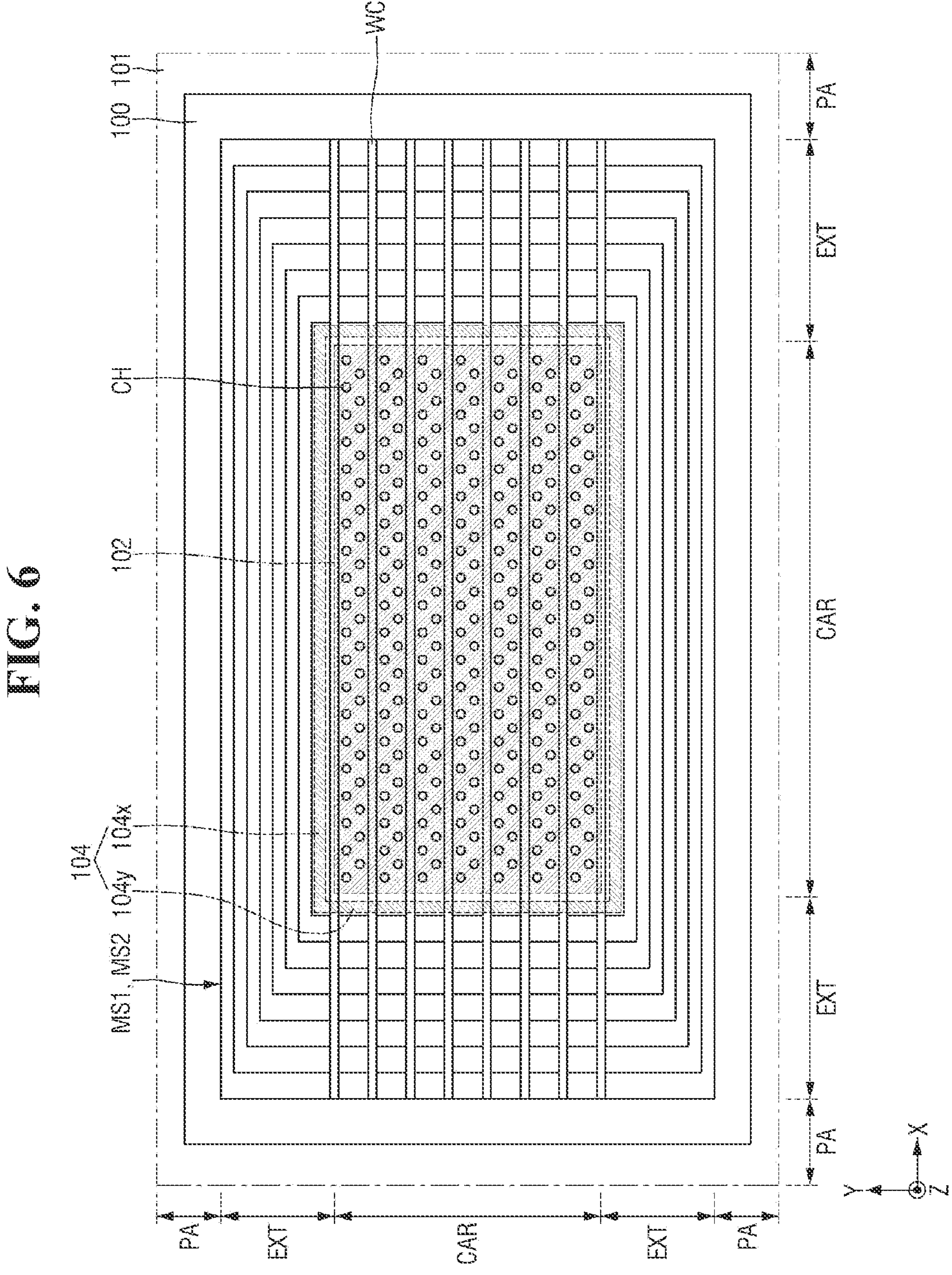
FIG. 6 is a schematic layout diagram of a first impurity region and a second impurity region of the semiconductor memory device illustrated in FIGS. 3 to 5.

FIG. 3 is a schematic layout diagram of a semiconductor memory device according to some embodiments. FIG. 4 is a cross-sectional view taken along the line A-A of FIG. 3. FIG. 5 is an enlarged view of the portion R1 of FIG. 4. FIG. 6 is a schematic layout diagram of a first impurity region and a second impurity region of the semiconductor memory device illustrated in FIGS. 3 to 5.

Referring to FIGS. 3 to 6, a semiconductor memory device according to some embodiments includes a cell structure CELL, a peripheral circuit structure PERI, and an input/output line structure 380.

The cell structure CELL may include a cell substrate 100, an insulating substrate 101, mold structures MS1 and MS2, interlayer insulation films 140*a* and 140*b*, channel structures CH, word line cut regions WC, bit lines BL, gate contacts 162, a cell interconnection structure 180, a first impurity region 102, and a second impurity region 104.

The cell substrate 100 may include a semiconductor substrate such as, for example, a silicon substrate (e.g., a portion of a silicon wafer), a germanium substrate, or a silicon-germanium substrate. In some embodiments, the cell substrate 100 may include a silicon-on-insulator (SOI) substrate or a germanium-on-insulator (GOI) substrate. In some embodiments, the cell substrate 100 may include poly silicon (Si).

In some embodiments, the cell substrate 100 may include impurities and may have a first conductivity type. For example, the cell substrate 100 may include P-type impurities (e.g., boron (B), aluminum (Al), indium (In), gallium (Ga), or the like). In the following description, the first conductivity type may be a P-type, but is merely an example, and the first conductivity type may be an N-type.

The cell substrate 100 may include portions included in a cell array region CAR and an extension region EXT of the semiconductor memory device.

A memory cell array (e.g., the memory cell array 20 in FIG. 1) including a plurality of memory cells may be formed in the cell array region CAR. For example, the channel structures CH, gate electrodes GSL, WL11 to WL1n, WL21 to WL2n, and SSL, bit lines BL, and the like, which will be described below, may be disposed in the cell array region CAR. In the following description, a surface of the cell substrate 100 on which the memory cell array is disposed may be referred to as a first surface 100a or a front side. Meanwhile, a surface of the cell substrate 100 opposite to the first surface 100a (or a front side) of the cell substrate 100 may be referred to as a second surface 100b or a back side.

The extension region EXT may be defined around the cell array region CAR. For example, the extension region EXT may surround the cell array region CAR when viewed in a plan view. The gate electrodes GSL, WL11 to WL1n, WL21 to WL2n, and SSL, which will be described below, may be stacked on the extension region EXT in a stair shape.

The insulating substrate 101 may be formed around the cell substrate 100. The insulating substrate 101 may form an insulating region around the cell substrate 100. The insulating substrate 101 may include at least one of, for example, silicon oxide, silicon nitride, and silicon oxynitride, but is not limited thereto.

A bottom surface of the insulating substrate 101 may be coplanar with a bottom surface of the cell substrate 100, but this is merely an example. In another example, the bottom surface of the insulating substrate 101 may be lower than the bottom surface of the cell substrate 100.

In some embodiments, the cell substrate 100 and the insulating substrate 101 may also include portions included in a peripheral area PA of the semiconductor memory device. The peripheral area PA may be defined the outside of the extension region EXT. For example, the peripheral area PA may surround the extension region EXT when viewed in a plan view. A contact plug 360, which will be described below, may be disposed in the peripheral area PA.

The mold structures MS1 and MS2 may be formed on the first surface 100a of the cell substrate 100. The mold structures MS1 and MS2 may include the plurality of gate electrodes GSL, WL11 to WL1n, WL21 to WL2n, and SSL stacked on the cell substrate 100 and a plurality of mold insulation films 110 and 115. The gate electrodes GSL, WL11 to WL1n, WL21 to WL2n, and SSL and the mold insulating layers 110 and 115 may each have a layered structure that extends parallel to the first surface 100a of the cell substrate 100. The gate electrodes GSL, WL11 to WL1n, WL21 to WL2n, and SSL may be separated from one another by the mold insulation films 110 and 115 and sequentially stacked on the cell substrate 100.

In some embodiments, the mold structures MS1 and MS2 may include a first mold structure MS1 and a second mold structure MS2 that are sequentially stacked on the cell substrate 100.

The first mold structure MS1 may include first gate electrodes GSL, and WL11 to WL1n and mold insulation films 110 that are alternately stacked on the cell substrate 100. In some embodiments, the first gate electrodes GSL and WL11 to WL1n may include a ground selection line GSL and a plurality of first word lines WL11 to WL1n that are sequentially stacked on the cell substrate 100. The number and arrangement of the ground selection line GSL and the first word lines WL11 to WL1n are merely examples, and those number and arrangement are not limited to that shown in the drawings.

The second mold structure MS2 may include second gate electrodes WL21 to WL2n, and SSL and second mold insulation films 115 that are alternately stacked on the first mold structure MS1. In some embodiments, the second gate electrodes WL21 to WL2n, and SSL may include a plurality of second word lines WL21 to WL2n and a string selection line SSL that are sequentially stacked on the first mold structure MS1. The number and arrangement of the second word lines WL21 to WL2n and the string selection line SSL are merely examples, and those number and arrangement are not limited to that shown in the drawings.

The gate electrodes GSL, WL11 to WL1n, WL21 to WL2n, and SSL may each include a conductive material, for example, a metal such as tungsten (W), cobalt (Co), and nickel (Ni), or a semiconductor material, such as silicon, but are not limited thereto.

The mold insulation films 110 and 115 may each include an insulating material, for example, at least one of silicon oxide, silicon nitride, or silicon oxynitride, but are not limited thereto.

The interlayer insulation film 140a and 140b may be formed on the first surface 100a of the cell substrate 100 to cover the mold structures MS1 and MS2. In some embodiments, the interlayer insulation films 140a and 140b may include a first interlayer insulation film 140a and a second interlayer insulation film 140b that are sequentially stacked on the cell substrate 100. The first interlayer insulation film 140a may cover the first mold structure MS1 and the second interlayer insulation film 140b may cover the second mold structure MS2. The interlayer insulation films 140a and 140b may include, for example, at least one of silicon oxide, silicon oxynitride, or a low dielectric constant (low-k) material having a lower dielectric constant than silicon oxide, but are not limited thereto.

A plurality of channel structures CH may be formed in the cell array region CAR of the cell substrate 100. Each of the channel structures CH may extend in a vertical direction (also referred to as a third direction Z) intersecting the first surface 100a of the cell substrate 100 to penetrate through the mold structures MS1 and MS2. For example, the channel structure CH may have a pillar shape (e.g., a columnar shape) that extends in the third direction Z. Accordingly, the channel structure CH may intersect the plurality of gate electrodes GSL, WL11 to WL1n, WL21 to WL2n, and SSL. In some embodiments, each of the channel structures CH may have a bent portion between the first mold structure MS1 and the second mold structure MS2. In some embodiments, the channel structure CH may extend through the plurality of gate electrodes GSL, WL11 to WL1n, WL21 to WL2n, and SSL.

As shown in FIG. 5, each of the channel structures CH may include a semiconductor pattern 130 and a data storage film 132.

The semiconductor pattern 130 may extend in the third direction Z to penetrate through the mold structures MS1 and MS2. Although the semiconductor pattern 130 is shown as a cup shape, this is merely an example. In some embodiments, the semiconductor pattern 130 may have various shapes such as a cylindrical shape, a rectangular barrel shape, and a solid pillar shape. The semiconductor pattern 130 may include semiconductor materials, such as, for example, single crystal silicon, polycrystalline silicon, organic semiconductor matter and/or carbon nanostructures.

In some embodiments, the semiconductor pattern 130 may penetrate through the first surface 100a of the cell substrate 100. For example, as shown in FIG. 5, one end of the semiconductor pattern 130 may be buried inside the cell substrate 100. The semiconductor pattern 130 may improve contact resistance by increasing a contact area with the cell substrate 100. In some embodiments, the data storage film 132 may extend from the first surface 100*a* of the cell substrate 100.

The data storage film 132 may be interposed between the semiconductor pattern 130 and the respective gate electrodes GSL, WL11 to WL1*n*, WL21 to WL2*n*, and SSL. For example, the data storage film 132 may extend along the outer side surfaces of the semiconductor pattern 130. The data storage film 132 may include, for example, at least one of silicon oxide, silicon nitride, silicon oxynitride, or a high dielectric constant material having a higher dielectric constant than that of silicon oxide. The high dielectric constant material may include, for example, at least one of aluminum oxide, hafnium oxide, lanthanum oxide, tantalum oxide, titanium oxide, lanthanum hafnium oxide, lanthanum aluminum oxide, dysprosium scandium oxide, or a combination of these materials.

In some embodiments, the data storage film 132 may be formed by multi-films or a plurality of films. For example, as shown in FIG. 5, the data storage film 132 may include a tunnel insulation film 132*a*, a charge storage film 132*b*, and a blocking insulation film 132*c*, which are sequentially stacked on the outer side surface of the semiconductor pattern 130.

The tunnel insulation film 132*a* may include, for example, a silicon oxide or a high dielectric constant material (e.g., aluminum oxide ($Al_2O_3$) and/or hafnium oxide ($HfO_2$)) having a higher dielectric constant than that of silicon oxide. The charge storage film 132*b* may include, for example, silicon nitride. The blocking insulation film 132*c* may include, for example, a silicon oxide or a high dielectric constant material (e.g., aluminum oxide ($Al_2O_3$) and/or hafnium oxide ($HfO_2$)) having a higher dielectric constant than that of silicon oxide.

In some embodiments, the channel structure CH may further include a filling pattern 134. The filling pattern 134 may be formed to fill the inside of the semiconductor pattern 130 which has a cup shape. The filling pattern 134 may include, for example, an insulating material such as silicon oxide, but is not limited thereto.

In some embodiments, the channel structure CH may further include a first channel pad 136. The first channel pad 136 may be formed to be connected to the other end of the semiconductor pattern 130. The first channel pad 136 may include, for example, impurity-doped polysilicon, but is not limited thereto.

In some embodiments, a plurality of channel structures CH may be arranged in a zigzag form. For example, as shown in FIG. 3, a plurality of channel structures CH may be arranged to be offset from each other in the second direction X and the first direction Y. The plurality of channel structures CH arranged in the zigzag form may further improve the degree of integration of the semiconductor memory device. The number and arrangement of the channel structures CH are merely examples, and those number and arrangement are not limited to that shown in the drawings. In some embodiments, the plurality of channel structures CH may be arranged in a honeycomb shape.

A plurality of word line cut regions WC may be arranged in two dimensions on a plane including the first direction X and the second direction Y. For example, the word line cut regions WC may each extend in the first direction X and may be arranged apart from each other along the second direction Y.

The mold structures MS1 and MS2 may be divided by the word line cut regions WC to form a plurality of memory cell blocks (e.g., the memory cell blocks BLK1 to BLKn of FIG. 1). The word line cut regions WC may include an insulating material, for example, at least one of silicon oxide, silicon nitride, or silicon oxynitride, but are not limited thereto.

The bit lines BL may be formed on the mold structures MS1 and MS2. The bit lines BL may intersect the word line cut regions WC. For example, each of the bit lines BL may extend in the second direction Y and may be arranged apart from each other along the first direction X.

Each of the bit lines BL may be connected to the channel structures CH arranged along the second direction Y. For example, a bit line contact 182 to be connected to the first channel pad 136 may be formed inside the second interlayer insulation film 140*b*. The bit line BL may be electrically connected to the channel structures CH through the bit line contact 182.

A plurality of gate contacts 162 may be connected to the plurality of gate electrodes GSL, WL11 to WL1*n*, WL21 to WL2*n*, and SSL, respectively. For example, the gate contacts 162 may lie on the mold structures MS1 and MS2, extend in the third direction Z, and may each be connected to the corresponding gate electrode.

The cell interconnection structure 180 may be formed on the mold structures MS1 and MS2. For example, a first inter-wiring insulation film 142 may be formed on the second interlayer insulation film 140*b*, and the cell interconnection structure 180 may be formed inside the first inter-wiring insulation film 142. The cell interconnection structure 180 may be electrically connected to the bit lines BL and the gate contacts 162. Accordingly, the cell interconnection structure 180 may be electrically connected to the channel structure CH and the gate electrodes GSL, WL11 to WL1*n*, WL21 to WL2*n*, and SSL. The number of layers and arrangement of the cell interconnection structure 180 are merely examples, and the present disclosure is not limited thereto.

The first impurity region 102 may be formed inside the cell substrate 100 adjacent to the second surface 100*b*. For example, the first impurity region 102 may extend inward from the second surface 100*b* of the cell substrate 100. The first impurity region 102 may be of a second conductivity type that is different from the first conductivity type. For example, the first impurity region 102 may be formed by ion-implanting a high concentration of N-type impurities (e.g., phosphorus (P) or arsenic (As)) into the cell substrate 100 of the P-type. The first impurity region 102 may be provided as a common source line (e.g., the common source line CSL in FIG. 2) of the semiconductor memory device according to some embodiments.

In some embodiments, a source plate 310 may be formed on the second surface 100*b* of the cell substrate 100. The source plate 310 may be connected to the first impurity region 102. For example, the source plate 310 may cover the first impurity region 102. The source plate 310 may include, for example, a metal such as tungsten (W), cobalt (Co), nickel (Ni), and the like, but is not limited thereto.

In some embodiments, the first impurity region 102 may overlap a plurality of channel structures CH in the third direction Z. For example, as shown in FIG. 6, the first impurity region 102 may be formed in the cell array region CAR of the cell substrate 100. In some embodiments, the first impurity region 102 may be a plate-shaped impurity region extending in a plane including the first direction X and the second direction Y. As used herein, "an element A overlapping an element B in a direction X" (or similar language) means that there is at least one line that extends in the direction X and intersects both the elements A and B.

The second impurity region 104 may be formed in the cell substrate 100 and may be spaced apart from the first impurity region 102. The second impurity region 104 may have the first conductivity type with an impurity concentration higher than that of the cell substrate 100. For example, the second impurity region 104 may be formed by ion-implanting a high concentration of P-type impurities (e.g., boron (B), aluminum (Al), indium (In), or gallium (Ga)) into the P-type cell substrate 100.

In some embodiments, the second impurity region 104 may be adjacent to the second surface 100*b* of the cell substrate 100. For example, the second impurity region 104 may extend inward from the second surface 100*b* of the cell substrate 100.

In some embodiments, a depth D2 of the second impurity region 104 may be greater than a depth D1 of the first impurity region 102 with respect to the second surface 100*b* of the cell substrate 100.

In some embodiments, a conductive pad 320 may be formed on the second surface 100*b* of the cell substrate 100. The conductive pad 320 may be connected to the second impurity region 104. For example, the conductive pad 320 may cover the second impurity region 104. The conductive pad 320 may include, for example, a metal such as tungsten (W), cobalt (Co), nickel (Ni), and the like, but is not limited thereto.

In some embodiments, the source plate 310 and the conductive pad 320 may be formed on the same level (e.g., on the same level in the third direction Z). As used herein, "elements A and B formed on the same level" (or similar language) may mean that the elements A and B are formed by the same fabricating process.

In some embodiments, the second impurity region 104 may surround at least a part of the first impurity region 102 when viewed in a plan view. For example, as shown in FIG. 6, the second impurity region 104 may extend along at least a part of a side surface of the first impurity region 102.

In some embodiments, the second impurity region 104 may not overlap a plurality of channel structures CH in the third direction Z. For example, as shown in FIG. 6, the second impurity region 104 may be formed in the extension region EXT of the cell substrate 100.

In some embodiments, the second impurity region 104 may include a line-shaped impurity region extending along the side surface of the first impurity region 102. For example, as shown in FIG. 6, the second impurity region 104 may include first line-shaped impurity regions 104*x* extending in the first direction X and second line-shaped impurity regions 104*y* extending in the second direction Y. In some embodiments, the first line-shaped impurity regions 104*x* and the second line-shaped impurity regions 104*y* may be connected to each other to completely surround the first impurity region 102.

The peripheral circuit structure PERI may include a peripheral circuit board 200, peripheral circuit elements PT, and peripheral circuit interconnection structures 260.

The peripheral circuit board 200 may include a semiconductor substrate such as, for example, a silicon substrate (e.g., a portion of a silicon wafer), a germanium substrate, or a silicon-germanium substrate. Alternatively, the peripheral circuit board 200 may include an SOI substrate or a GOI substrate.

The peripheral circuit elements PT may be formed on the peripheral circuit board 200. The peripheral circuit elements PT may constitute the peripheral circuit (e.g., the peripheral circuit 30 in FIG. 1) that controls the operation of the semiconductor memory device. For example, the peripheral circuit elements PT may include a control logic (e.g., the control logic 37 in FIG. 1), a row decoder (e.g., the row decoder 33 in FIG. 1), a page buffer (e.g., the page buffer 35 in FIG. 1), and the like. In the following description, the surface of the peripheral circuit board 200 on which the peripheral circuit elements PT are disposed may be referred to as a front side of the peripheral circuit board 200, and, a surface of the peripheral circuit board 200 opposite to the front side of the peripheral circuit board 200 may be referred to as a back side of the peripheral circuit board 200.

The peripheral circuit elements PT may include, for example, a transistor, but are not limited thereto. For example, the peripheral circuit elements PT may include various active elements, such as a transistor, as well as various passive elements, such as a capacitor, a register, an inductor, and the like.

The peripheral circuit interconnection structure 260 may be formed on the peripheral circuit element PT. For example, the second inter-wiring insulation film 240 may be formed on the front side of the peripheral circuit board 200, and the peripheral circuit interconnection structure 260 may be formed in the second inter-wiring insulation film 240. The peripheral circuit interconnection structure 260 may be electrically connected to the peripheral circuit element PT. The number of layers and arrangement of the peripheral circuit interconnection structure 260 are merely examples, and the present disclosure is not limited thereto.

In some embodiments, the cell structure CELL may be stacked on the peripheral circuit structure PERI. For example, the cell structure CELL may be stacked on the second inter-wiring insulation film 240.

In some embodiments, the first surface 100*a* of the cell substrate 100 may face the peripheral circuit structure PERI. For example, the front side (i.e., the first surface 100*a*) of the cell substrate 100 may face the front side of the peripheral circuit board 200.

In some embodiments, the semiconductor memory device may have a chip-to-chip (C2C) structure. The C2C structure may be a structure in which an upper semiconductor chip, including a cell structure CELL, is fabricated on a first wafer (e.g., the cell substrate 100), a lower semiconductor chip, including a peripheral circuit structure PERI, is fabricated on a second wafer (e.g., the peripheral circuit board 200), different from the first wafer, and then, the upper semiconductor chip and the lower semiconductor chip are connected to each other by, for example, a bonding method.

For example, the bonding method may refer to a method of electrically connecting a first bonding metal 190 formed in an uppermost metal layer of the upper semiconductor chip and a second bonding metal 290 formed in an uppermost metal layer of the lower semiconductor chip to each other. For example, when the bonding metal is formed of copper (Cu), the bonding method may be a Cu—Cu bonding method. However, this is merely an example, and the first bonding metal 190 and the second bonding metal 290 may be made of various other metals such as aluminum Al or tungsten (W).

When the first bonding metal 190 and the second bonding metal 290 are bonded to each other, the cell interconnection structure 180 may be connected to the peripheral circuit interconnection structure 260. Accordingly, the bit line BL and/or each of the gate electrodes GSL, WL11 to WL1*n*, WL21 to WL2*n*, and SSL may be electrically connected to the peripheral circuit element PT.

The input/output line structure 380 may be formed on the second surface 100*b* of the cell substrate 100. For example, a third interlayer insulation film 340 that covers the cell substrate 100 and the insulating substrate 101 may be formed on the second surface 100*b* of the cell substrate 100. The input/output line structure 380 may be formed on the third interlayer insulation film 340. The number of layers and arrangement of the input/output line structure 380 are merely examples, and the present disclosure is not limited thereto.

In some embodiments, the third interlayer insulation film 340 may cover the source plate 310 and/or the conductive pad 320. The third interlayer insulation film 340 may include, for example, at least one of silicon oxide, silicon oxynitride, or a low dielectric constant (low-k) material having a lower dielectric constant than silicon oxide, but are not limited thereto.

The input/output line structure 380 may be electrically connected to the cell structure CELL and/or the peripheral circuit structure PERI.

In some embodiments, a source contact 315 that connects the input/output line structure 380 to the first impurity region 102 may be formed. For example, the source contact 315 may extend in the third direction Z in the third interlayer insulation film 340 and connect the source plate 310 to the input/output line structure 380. The first impurity region 102 may be electrically connected to the input/output line structure 380 via the source plate 310 and the source contact 315. The source contact 315 may include, for example, a metal such as tungsten (W), cobalt (Co), nickel (Ni), and the like, but is not limited thereto.

In some embodiments, an erase control contact 325 that connects the input/output line structure 380 to the second impurity region 104 may be formed. For example, the erase control contact 325 may extend in the third direction Z in the third interlayer insulation film 340 and connect the conductive pad 320 to the input/output line structure 380. The second impurity region 104 may be electrically connected to the input/output line structure 380 via the conductive pad 320 and the erase control contact 325. The erase control contact 325 may include, for example, a metal such as tungsten (W), cobalt (Co), nickel (Ni), and the like, but is not limited thereto.

In some embodiments, a width (e.g., a width in a horizontal direction) of the source contact 315 and a width (e.g., a width in a horizontal direction) of the erase control contact 325 may decrease in a direction toward the second surface 100*b* of the cell substrate 100. This may be due to the nature of the etching process for forming the source contact 315 and the erase control contact 325. In some embodiments, the source contact 315 and the erase control contact 325 may be formed on the same level.

In some embodiments, a contact plug 360 that connects the input/output line structure 380 to the cell interconnection structure 180 may be formed. The contact plug 360 may be formed in the peripheral area PA. For example, the contact plug 360 may extend in the third direction Z and penetrate through the third interlayer insulation film 340, the insulating substrate 101, the first interlayer insulation film 140*a*, and the second interlayer insulation film 140*b*. The cell interconnection structure 180 may be electrically connected to the input/output line structure 380 via the contact plug 360.

In some embodiments, a width (e.g., a width in a horizontal direction) of the contact plug 360 may decrease in a direction toward the cell interconnection structure 180. This may be due to the nature of the etching process for forming the contact plug 360. In some embodiments, the source contact 315, the erase control contact 325, and the contact plug 360 may be formed on the same level.

In some embodiments, a capping insulation film 342 that covers the input/output line structure 380 may be formed. For example, the capping insulation film 342 may include a pad opening OP that exposes a portion of the input/output line structure 380. The portion of the input/output interconnection structure 380 exposed by the pad opening OP may function as an input/output pad.

Figure 7:
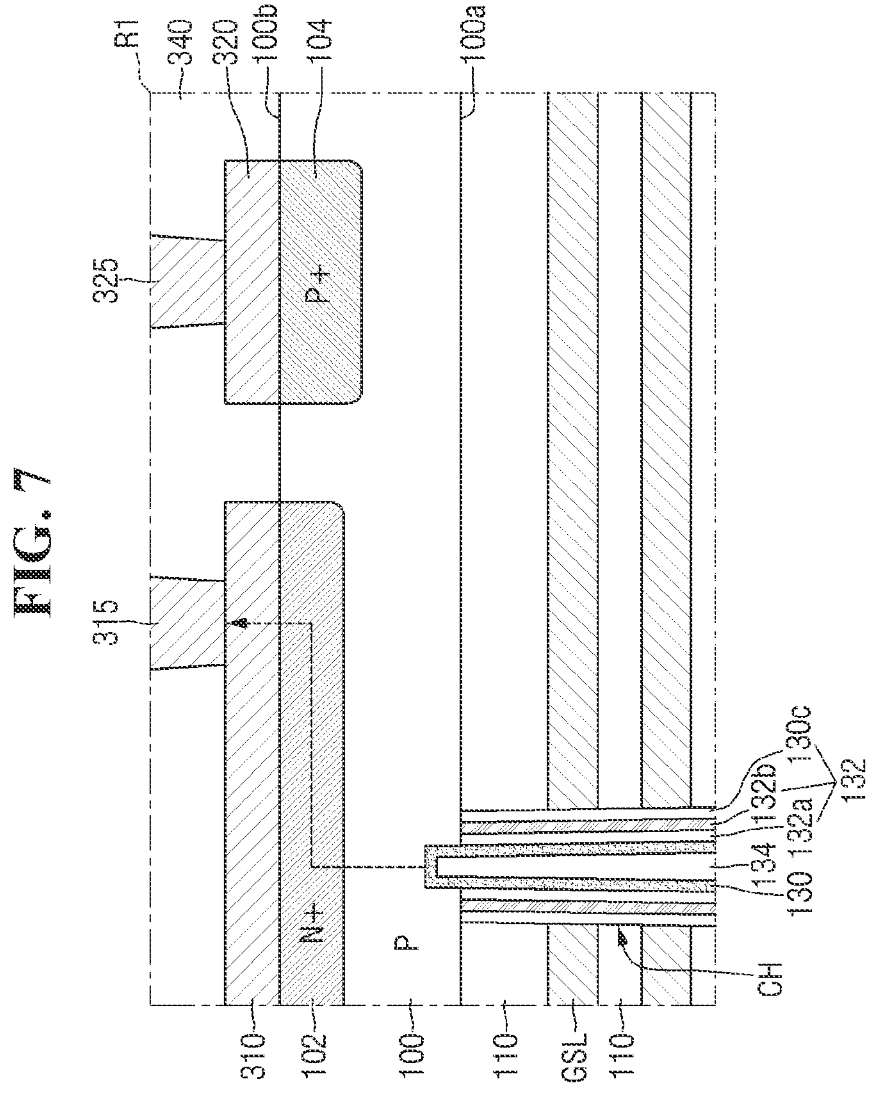
FIG. 7 is a view for describing a read operation of a semiconductor memory device according to some embodiments.

FIG. 7 is a view for describing a read operation of a semiconductor memory device according to some embodiments.

Referring to FIG. 7, a semiconductor memory device according to some embodiments performs a read operation through a first impurity region 102.

For example, during a read operation of the semiconductor memory device according to some embodiments, electrons of the semiconductor pattern 130 may flow to the first impurity region 102 through the cell substrate 100, and may exit through the source plate 310 and/or the source contact 315 connected to the first impurity region 102.

Figure 8:
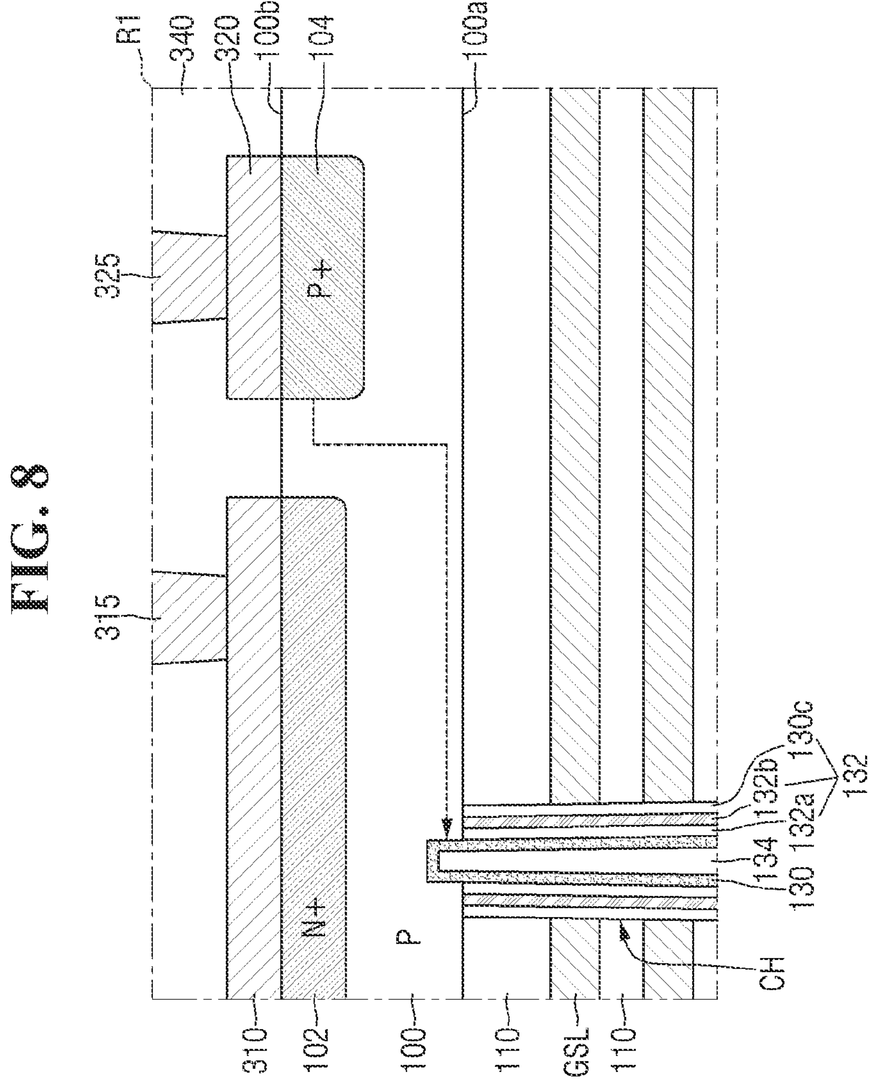
FIG. 8 is a view for describing an erase operation of a semiconductor memory device according to some embodiments.

FIG. 8 is a view for describing an erase operation of a semiconductor memory device according to some embodiments.

Referring to FIG. 8, a semiconductor memory device according to some embodiments performs an erase operation through a second impurity region 104.

For example, when a high voltage is applied to the second impurity region 104 through the erase control contact 325 and/or the conductive pad 320, holes may be supplied to the semiconductor pattern 130 through the cell substrate 100 in which the second impurity region 104 is formed. Accordingly, electrons stored in the charge storage layer 132*b* may pass through a tunnel insulation film 132*a* and be tunneled into the semiconductor pattern 130, and an erase operation of the semiconductor memory device may be performed.

In order to secure a connection path between a cell string (e.g., the cell string CSTR in FIG. 2) and a common source line (e.g., the common source line CSL in FIG. 2) in a semiconductor memory device, a common source line (hereinafter also referred to as a side-connected source structure) connected to a side surface of a semiconductor pattern (e.g., the semiconductor pattern 130 in FIG. 5) has been proposed. However, due to high process cost of the side-connected source structure, a semiconductor memory device having a C2C structure has been studied as an alternative to the side-connected source structure. As described above, in the C2C structure, an upper chip and a lower chip can be connected to each other by a bonding method, and accordingly, a semiconductor pattern may be simply exposed by performing a planarization process (e.g., a chemical mechanical polishing (CMP) process) or the like on a wafer (e.g., the first wafer) of the upper chip. That is, in the C2C structure, the common source line connected to the semiconductor pattern may be easily formed.

Meanwhile, the semiconductor memory device having a C2C structure may have degraded erase performance. For example, a cell string (e.g., the cell string CSTR in FIG. 2) including an erase control transistor may be provided for an erase operation of the semiconductor memory device. The erase control transistor may perform an erase operation of the semiconductor memory device by using gate induced drain leakage (GIDL). However, if the side-connected source structure is omitted as described above, the distance between a gate and a drain of the erase control transistor increases, which may lead to the degradation of erase control performance using GIDL.

In contrast, as described with reference to FIGS. 3 to 8, the semiconductor memory device according to some embodiments may perform an erase operation using the cell substrate 100 connected to the semiconductor pattern 130 and the second impurity region 104 formed in the cell substrate 100. For example, an erase operation of the semiconductor memory device according to some embodiments may be performed as holes are supplied to the semiconductor pattern 130 by a high voltage applied to the second impurity region 104. That is, since the semiconductor memory device according to some embodiments may perform an erase operation using the cell substrate 100 provided as a body, it may have enhanced erase control performance as compared to the semiconductor memory device using GIDL. Accordingly, even with the C2C structure, a semiconductor memory device having excellent erase control performance may be provided.

Figure 9:
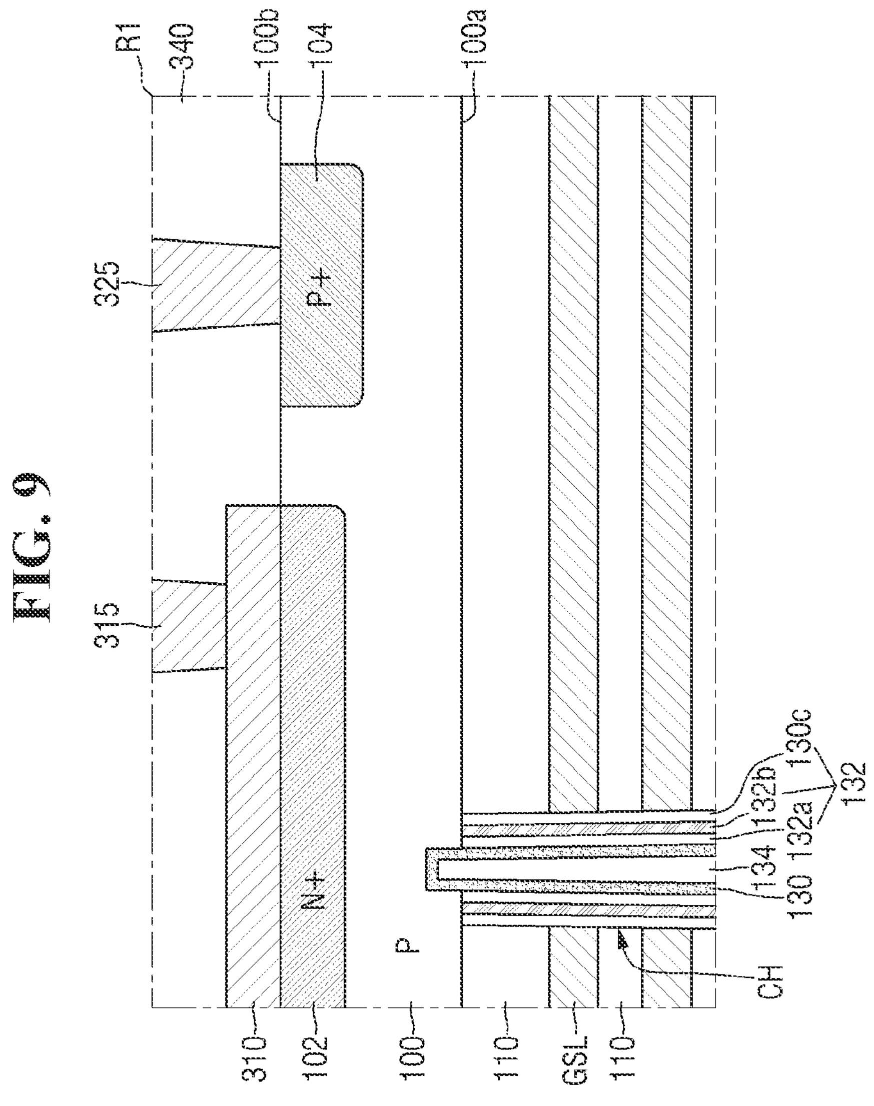
FIG. 9 is an enlarged view for describing a semiconductor memory device according to some embodiments.
Figure 10:
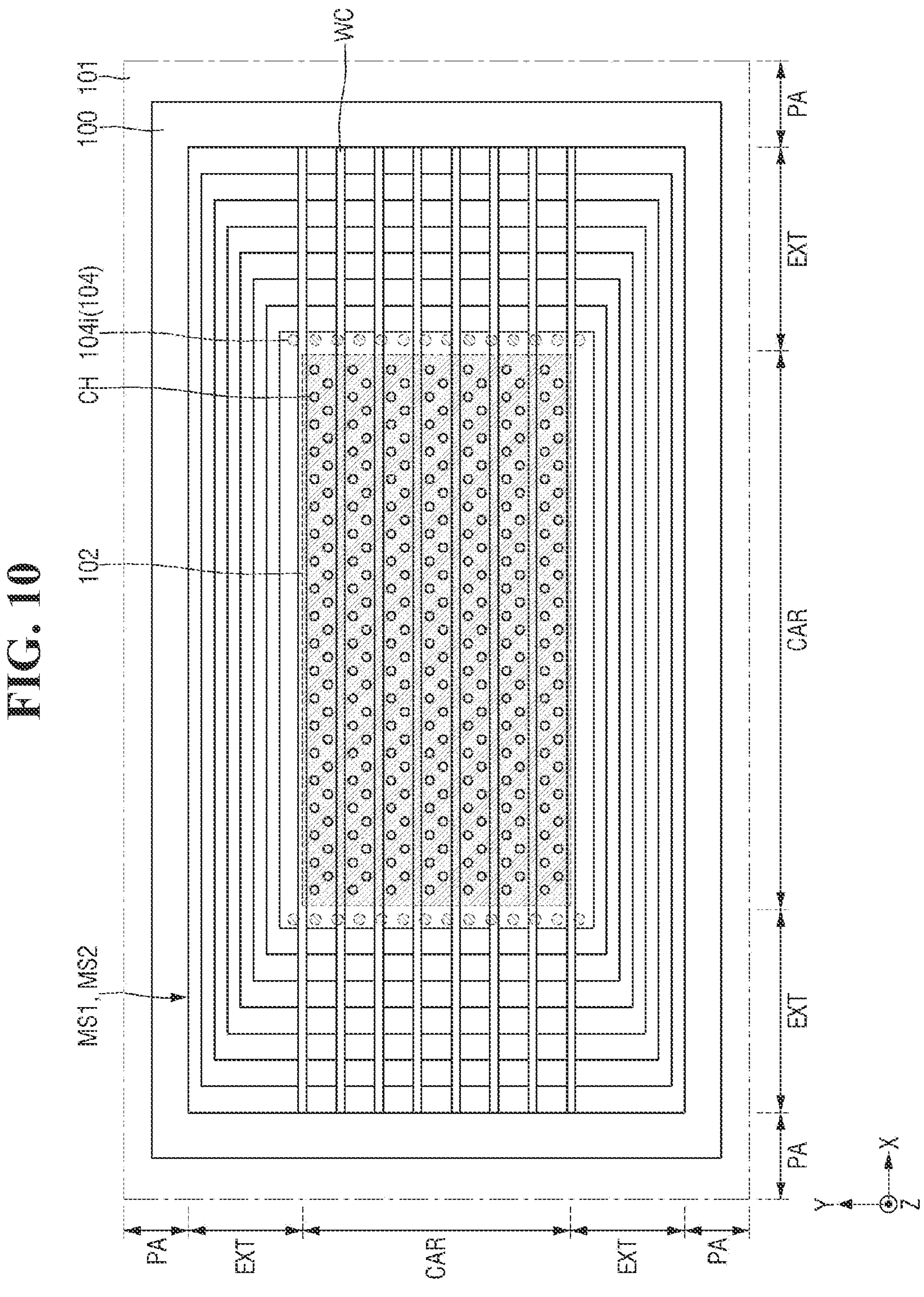
FIG. 10 is a schematic layout diagram of a first impurity region and a second impurity region of the semiconductor memory device illustrated in FIG. 9.

FIG. 9 is an enlarged view for describing a semiconductor memory device according to some embodiments. FIG. 10 is a schematic layout diagram of a first impurity region and a second impurity region of the semiconductor memory device illustrated in FIG. 9. For convenience of description, the repeated parts described with reference to FIGS. 1 to 8 will be briefly described or omitted.

Referring to FIGS. 9 and 10, in a semiconductor memory device according to some embodiments, a second impurity region 104 may include multiple impurity regions (e.g., island-shaped impurity regions) that are spaced apart from each other.

For example, as shown in FIG. 10, the second impurity region 104 may include a plurality of impurity regions (also referred to as a plurality of island-shaped impurity regions) 104*i* that are spaced apart from each other. The island-shaped impurity regions 104*i* are illustrated as being arranged along side surfaces of a first impurity region 102 extending in the second direction Y, but this is merely an example. In some embodiments, the island-shaped impurity regions 104*i* may be arranged along side surfaces of the first impurity region 102 extending in the first direction X. In still some other embodiments, the island-shaped impurity regions 104*i* may be arranged along the edge of the first impurity region 102.

In some embodiments, an erase control contact 325 may be in contact with the second impurity region 104. For example, the conductive pad 320 described with reference to FIGS. 3 to 8 may be omitted, and a plurality of erase control contacts in contact with the island-shaped second impurity regions 104 may be formed. However, this is merely an example, and a conductive pad 320 that covers the second impurity region 104 may be formed. For example, a plurality of conductive pads 320 that cover the island-shaped second impurity regions 104 may be formed.

Figure 11:
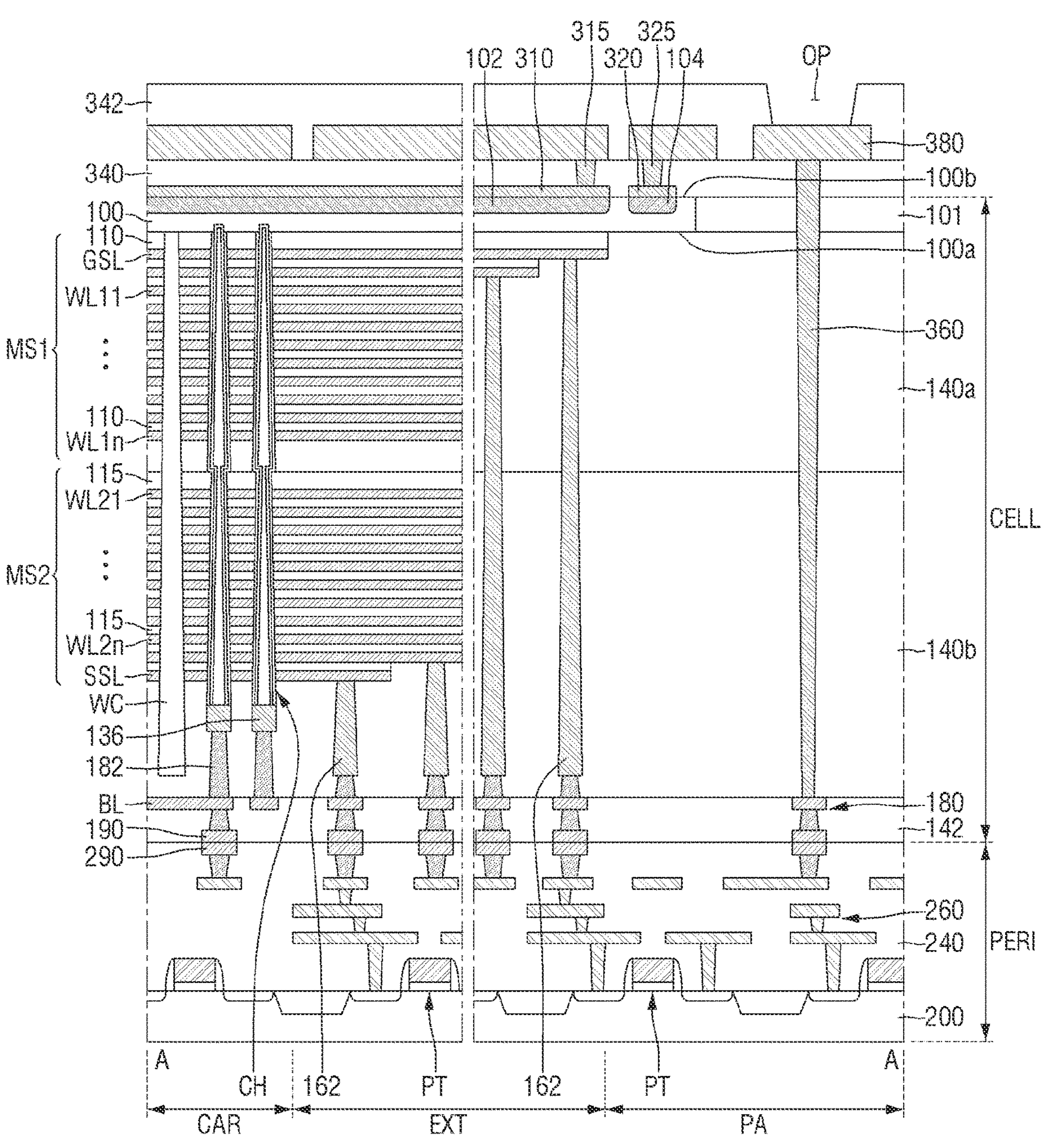
FIG. 11 is a cross-sectional view of a semiconductor memory device according to some embodiments.
Figure 12:
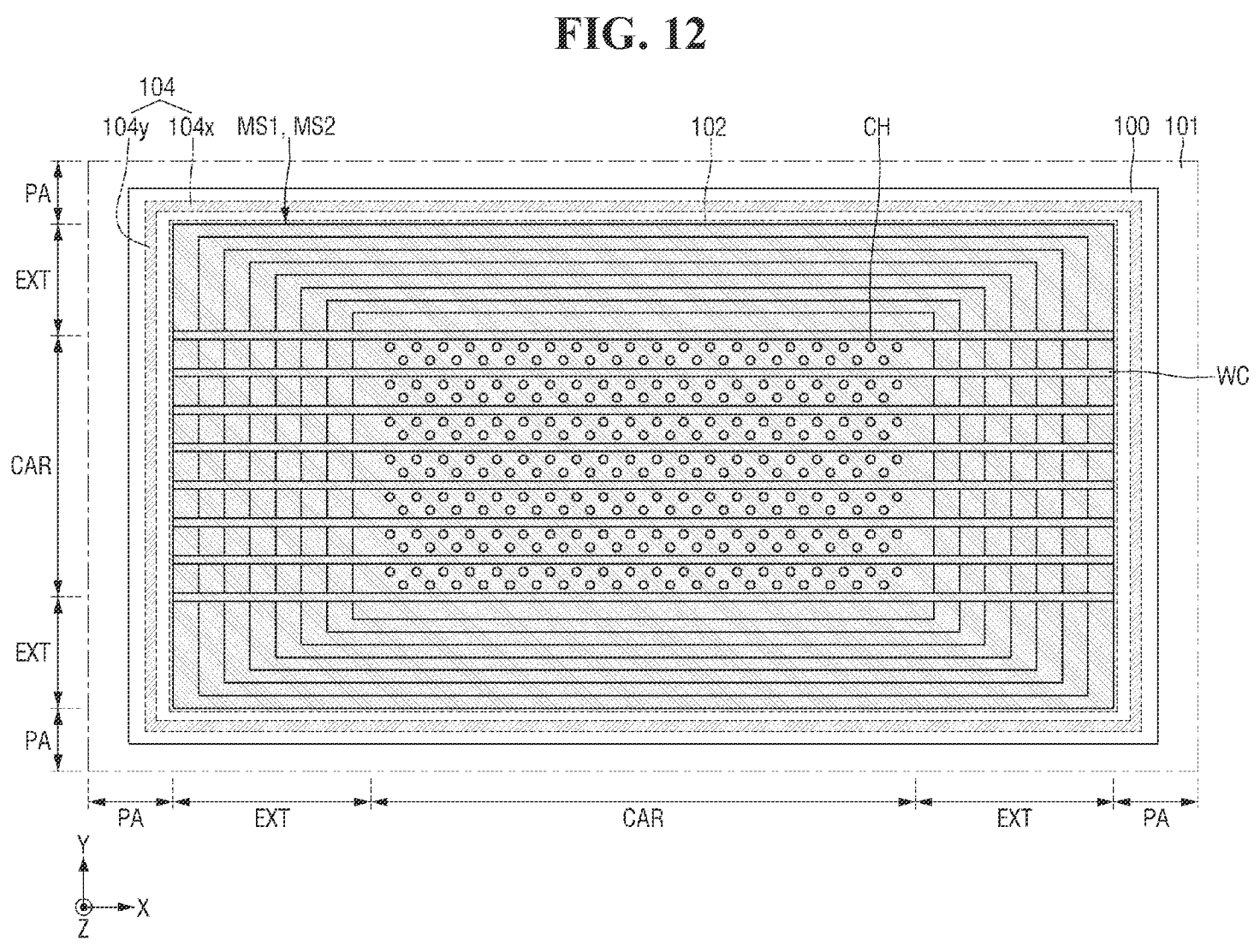

FIG. 11 is a cross-sectional view illustrating a semiconductor memory device according to some embodiments. FIG. 12 is a schematic layout diagram of a first impurity region and a second impurity region of the semiconductor memory device illustrated in FIG. 11. For convenience of description, the repeated parts described with reference to FIGS. 1 to 8 will be briefly described or omitted.

Referring to FIGS. 11 and 12, in a semiconductor memory device according to some embodiments, a first impurity region 102 may be formed in a cell array region CAR and an extension region EXT. For example, the first impurity region 102 may be a plate-shaped impurity region that are provided in the cell array region CAR and the extension region EXT.

In some embodiments, the second impurity region 104 may surround at least a part of the first impurity region 102 when viewed in a plan view. For example, the second impurity region 104 may be formed in the cell substrate 100 of the peripheral region PA.

In some embodiments, the second impurity region 104 may include a line-shaped impurity region extending along the side surface of the first impurity region 102. For example, the second impurity region 104 may include first line-shaped impurity regions 104*x* extending in the first direction X and second line-shaped impurity regions 104*y* extending in the second direction Y.

Figure 13:
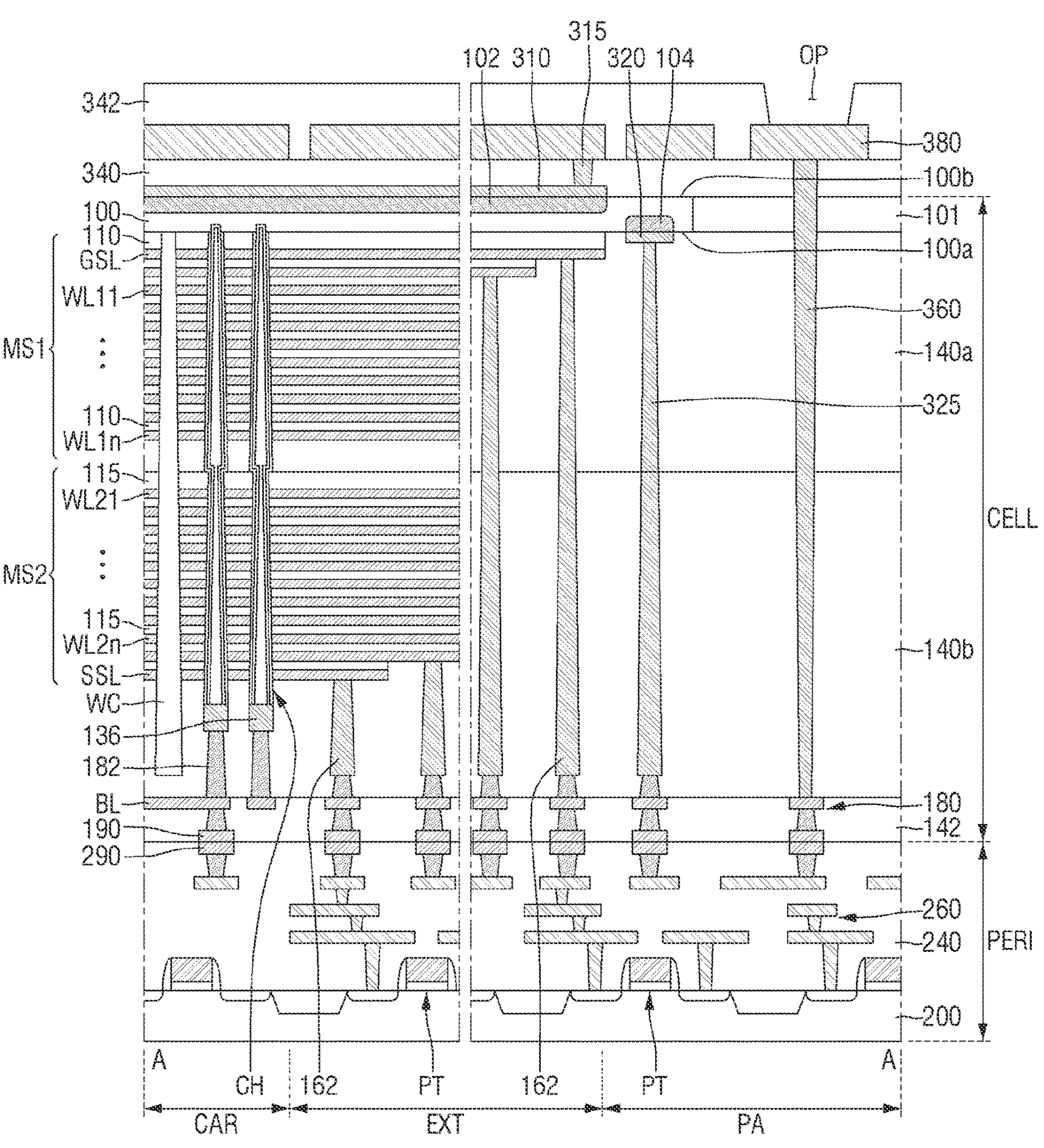
FIG. 13 is a cross-sectional view of a semiconductor memory device according to some other embodiments.

FIG. 13 is a cross-sectional view illustrating a semiconductor memory device according to some other embodiments. FIG. 14 is a schematic layout diagram of a first impurity region and a second impurity region of the semiconductor memory device illustrated in FIG. 13. For convenience of description, the repeated parts described with reference to FIGS. 1 to 12 will be briefly described or omitted.

Referring to FIGS. 13 and 14, in a semiconductor memory device according to some embodiments, a second impurity region 104 may be adjacent to a first surface 100*a* of a cell substrate 100. For example, the second impurity region 104 may extend inward from the first surface 100*a* of the cell substrate 100.

In some embodiments, the second impurity region 104 may be formed in a portion of the cell substrate 100 in the peripheral region PA. The second impurity region 104 may be exposed from mold structures MS1 and MS2. That is, the second impurity region 104 may not overlap the mold structures MS1 and MS2 in the third direction Z.

In some embodiments, a conductive pad 320 may be formed on the first surface 100*a* of the cell substrate 100. The conductive pad 320 may be connected to the second impurity region 104. For example, the conductive pad 320 may cover the second impurity region 104.

In some embodiments, an erase control contact 325 may connect a cell interconnection structure 180 to the second impurity region 104. For example, the erase control contact 325 may extend in the third direction Z in interlayer insulation films 140*a* and 140*b* and connect the conductive pad 320 to the cell interconnection structure 180. The second impurity region 104 may be electrically connected to the cell interconnection structure 180 via the conductive pad 320 and the erase control contact 325. In some embodiments, the erase control contact 325 and gate contacts 162 may be formed on the same level.

Figure 15:
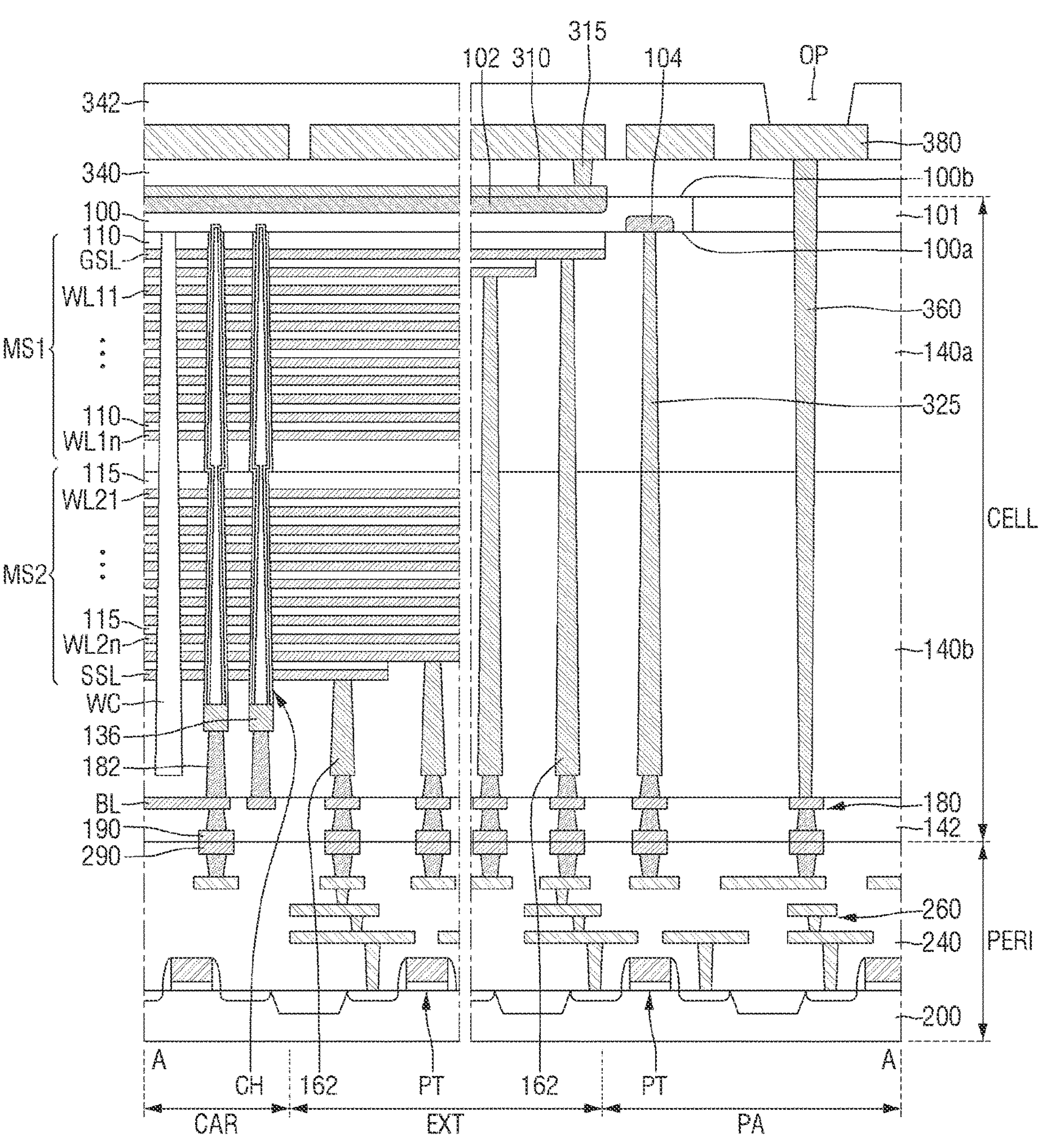
FIG. 15 is a cross-sectional view illustrating a semiconductor memory device according to some other embodiments.

FIG. 15 is a cross-sectional view illustrating a semiconductor memory device according to some embodiments. FIG. 16 is a schematic layout diagram of a first impurity region and a second impurity region of the semiconductor memory device illustrated in FIG. 15. For convenience of description, the repeated parts described with reference to FIGS. 1 to 14 will be briefly described or omitted.

Referring to FIGS. 15 and 16, in a semiconductor memory device according to some embodiments, a second impurity region 104 may include multiple impurity regions (e.g., island-shaped impurity regions) that are spaced apart from each other.

For example, as shown in FIG. 16, the second impurity region 104 may include a plurality of impurity regions (also referred to as a plurality of island-shaped impurity regions) 104*i* that are spaced apart from each other.

In some embodiments, the second impurity region 104 may be adjacent to a first surface 100*a* of the cell substrate 100. In some embodiments, the second impurity region 104 may be formed in a portion of the cell substrate 100 in the peripheral region PA.

Figure 17:
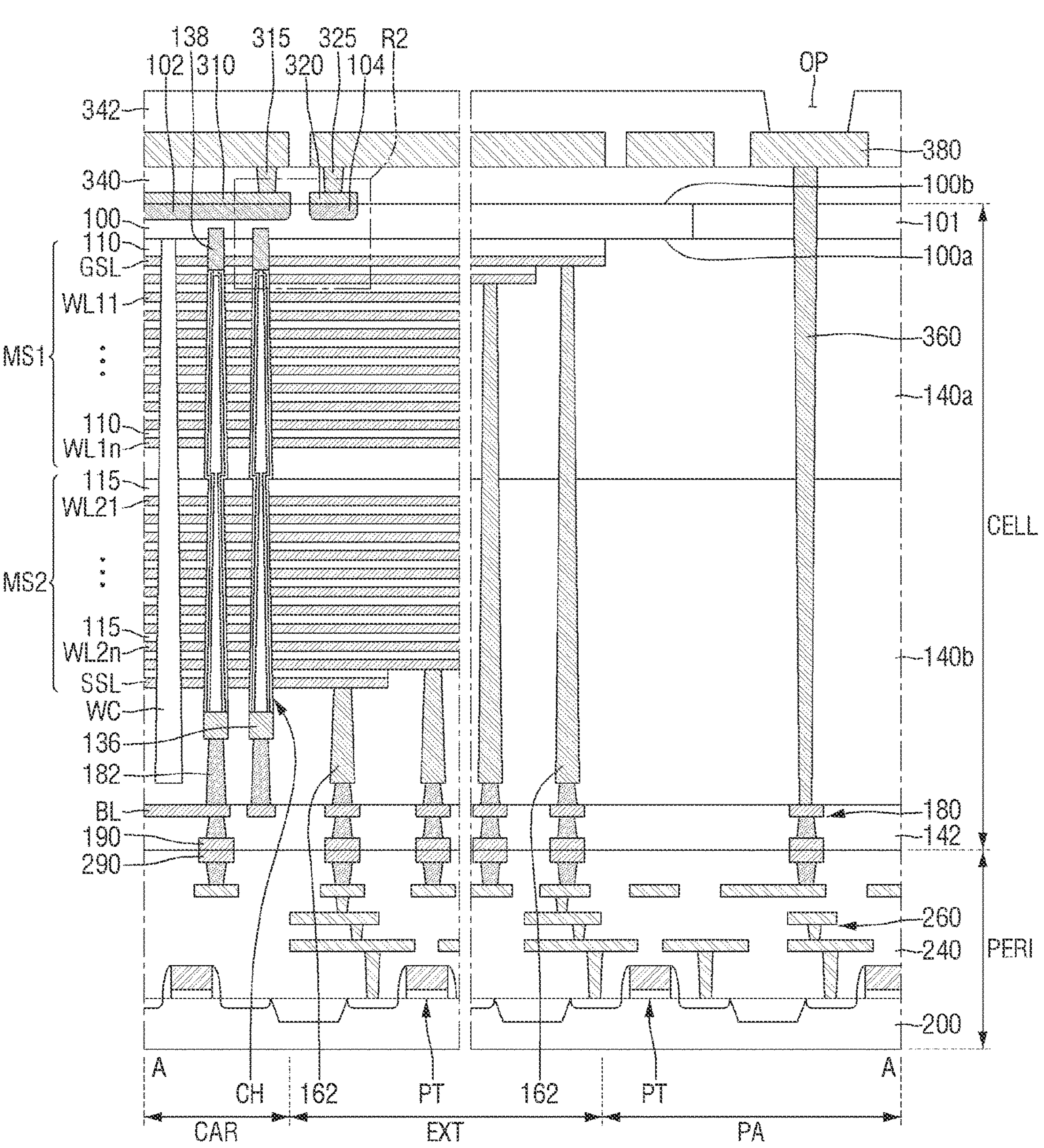
FIG. 17 is a cross-sectional view illustrating a semiconductor memory device according to some embodiments.
Figure 18:
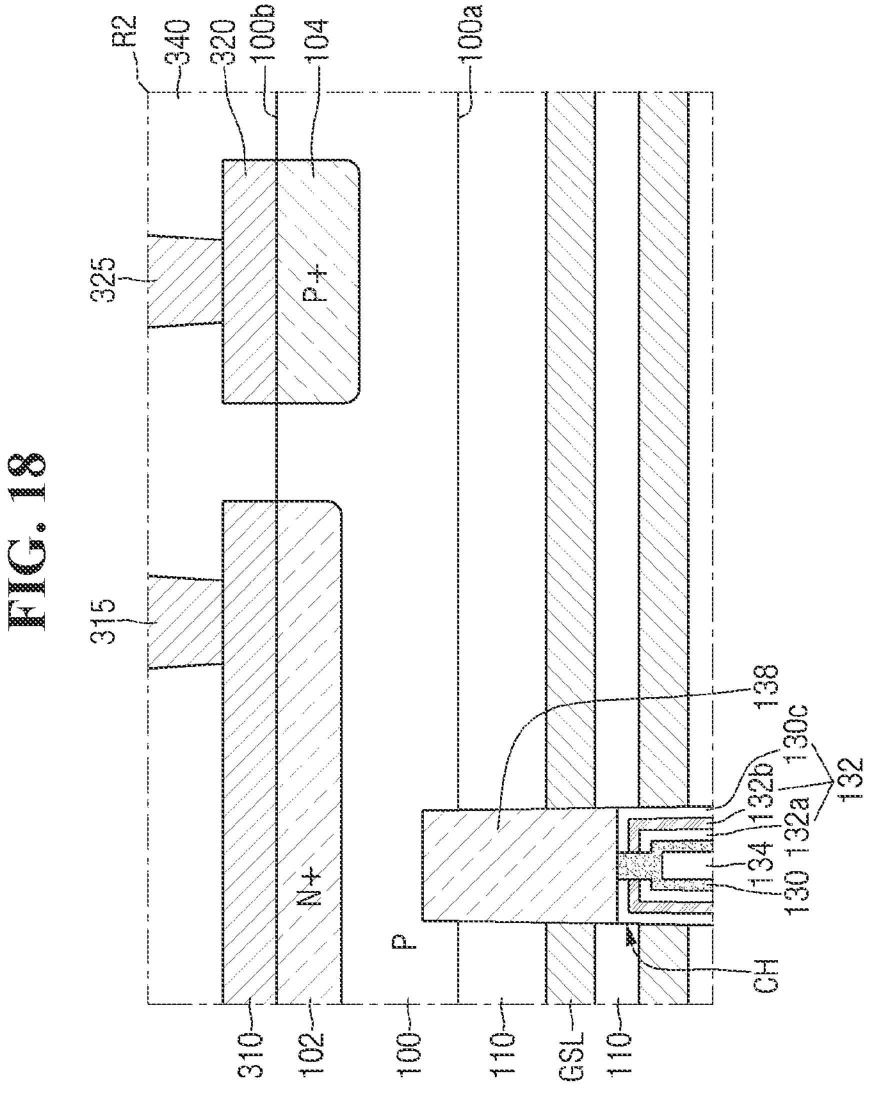
FIG. 18 is an enlarged view of the portion R2 of FIG. 17.

FIG. 17 is a cross-sectional view illustrating a semiconductor memory device according to some other embodiments. FIG. 18 is an enlarged view of the portion R2 of FIG. 17. For convenience of description, the repeated parts described with reference to FIGS. 1 to 16 will be briefly described or omitted.

Referring to FIGS. 17 and 18, in a semiconductor memory device according to some embodiments, a channel structure CH may further include a second channel pad 138.

The second channel pad 138 may be formed to be connected to one end of a semiconductor pattern 130. The second channel pad 138 may include, for example, impurity-doped polysilicon, but is not limited thereto. In some embodiments, the second channel pad 138 may be an epitaxial pattern formed by a selective epitaxial growth (SEG) process.

In some embodiments, the second channel pad 138 may penetrate through a first surface 100*a* of a cell substrate 100. For example, one end of the second channel pad 138 may be buried inside the cell substrate 100. The second channel pad 138 may improve contact resistance by increasing a contact area with the cell substrate 100.

In some embodiments, at least a portion of the second channel pad 138 may overlap a gate electrode adjacent to the cell substrate 100 among gate electrodes GSL, WL11 to WL1*n*, WL21 to WL2*n*, and SSL in a horizontal direction (e.g., the first direction X or the second direction Y). For example, the second channel pad 138 may overlap a ground selection line GSL in the horizontal direction (e.g., the first direction X or the second direction Y).

Hereinafter, a method of fabricating a semiconductor memory device according to example embodiments will be described with reference to FIGS. 1 to 38.

FIGS. 19 to 31 are views illustrating methods of fabricating a semiconductor memory device according to some embodiments. For convenience of description, the repeated parts described with reference to FIGS. 1 to 18 will be briefly described or omitted.

Figure 19:
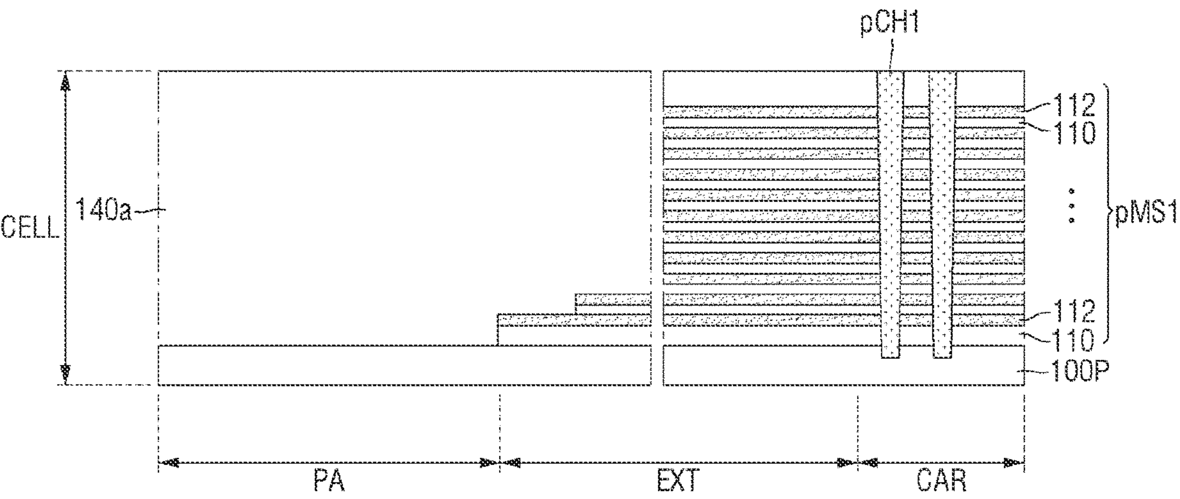

Referring to FIG. 19, a first preliminary mold pMS1 and a first preliminary channel pCH1 are formed on a base substrate 100P.

The first preliminary mold pMS1 may be formed on a front side of the base substrate 100P. The first preliminary mold pMS1 may include a plurality of first mold insulation films 110 and a plurality of first mold sacrificial films 112 that are alternately stacked on the base substrate 100P. The first mold sacrificial films 112 may include a material having an etching selectivity with respect to the first mold insulation film 110. For example, the first mold insulation film 110 may include a silicon oxide layer, and the first mold sacrificial film 112 may include a silicon nitride layer.

The first preliminary mold pMS1 in an extension region EXT may be patterned in a stair shape. Accordingly, the first preliminary mold pMS1 in the extension region EXT may be stacked in a stair shape.

The first preliminary channel pCH1 may penetrate through the first preliminary mold pMS1 in a cell array region CA. Also, the first preliminary channel pCH1 may be connected to the base substrate 100P. For example, a first interlayer insulation film 140*a* that covers the first preliminary mold pMS1 may be formed on the base substrate 100P. The first preliminary channel pCH1 may penetrate through the first interlayer insulation film 140*a* and the first preliminary channel pCH1 and may be connected to the base substrate 100P.

The first preliminary channel pCH1 may include a material having an etching selectivity with respect to a first mold insulation film 110 and a first mold sacrificial film 112. For example, the first preliminary channel pCH1 may include poly silicon (Si).

Figure 20:
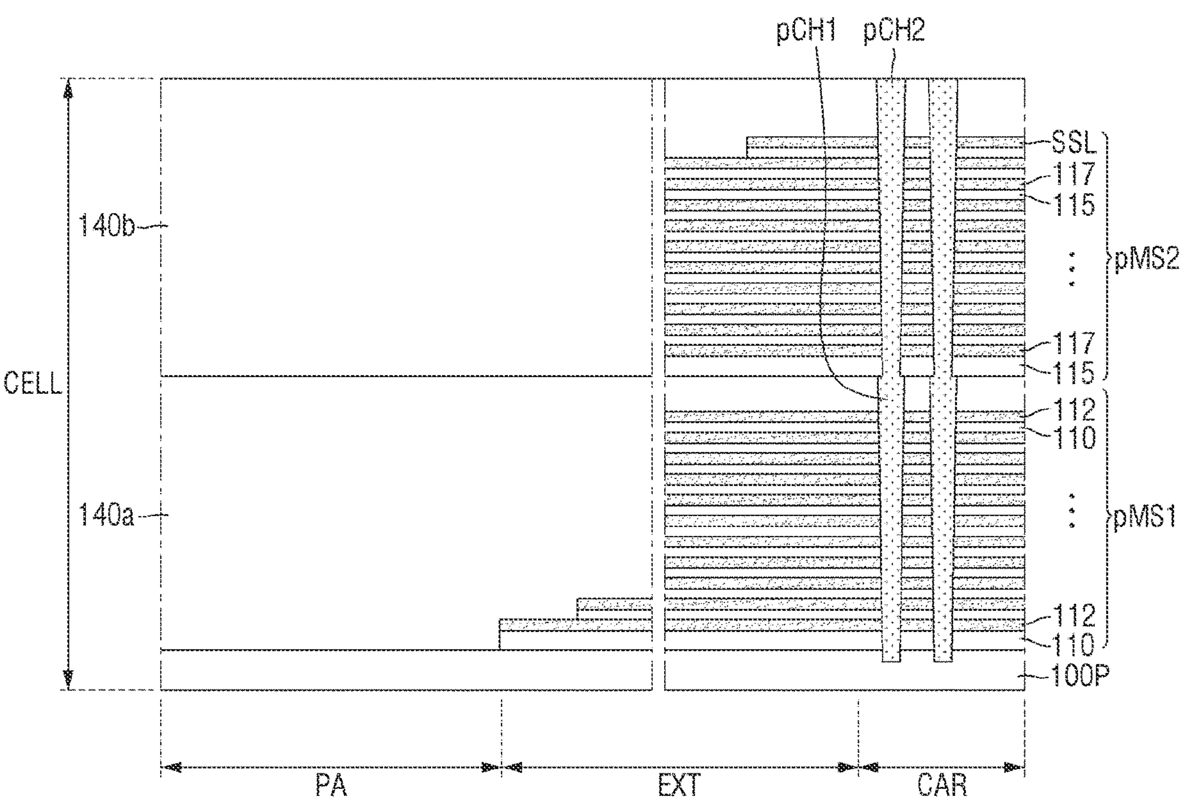

Referring to FIG. 20, a second preliminary mold pMS2 and a second preliminary channel pCH2 are formed on the first preliminary mold pMS1.

The second preliminary mold pMS2 may include a plurality of second mold insulation films 115 and a plurality of second mold sacrificial films 117 that are alternately stacked on the first preliminary mold pMS1. Since formation of the second preliminary mold pMS2 is similar to formation of the first preliminary mold pMS1, a detailed description thereof will not be provided below.

The second preliminary channel pCH2 may penetrate through the second preliminary mold pMS2 in the cell array region CA. In addition, the second preliminary channel pCH2 may be connected to the first preliminary channel pCH1. Since formation of the second preliminary channel pCH2 is similar to formation of the first preliminary channel pCH1, a detailed description thereof will not be provided below.

Figure 21:
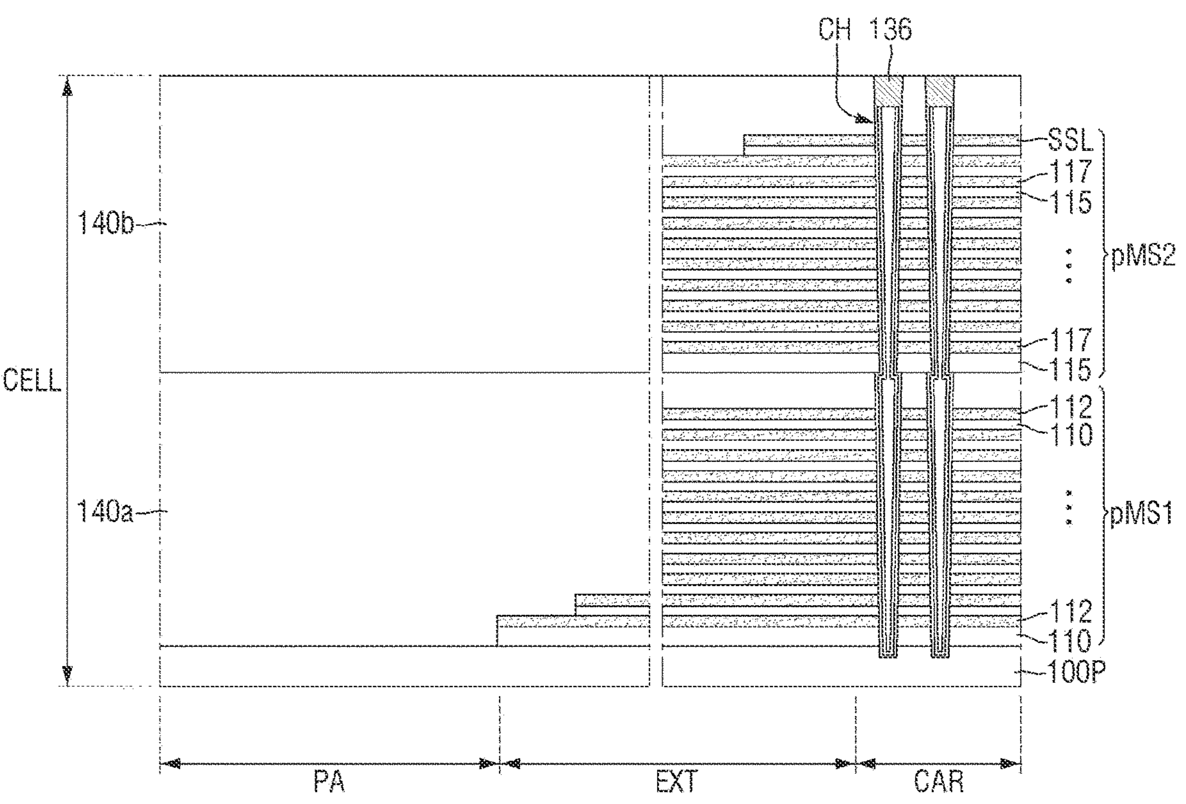

Referring to FIG. 21, a channel structure CH is formed.

For example, the first preliminary channel pCH1 and the second preliminary channel pCH2 may be selectively removed. Thereafter, the channel structure CH that replaces a region where the first preliminary channel pCH1 and the second preliminary channel pCH2 are removed may be formed. Accordingly, the channel structure CH may be formed on the cell array region CA.

Figure 22:
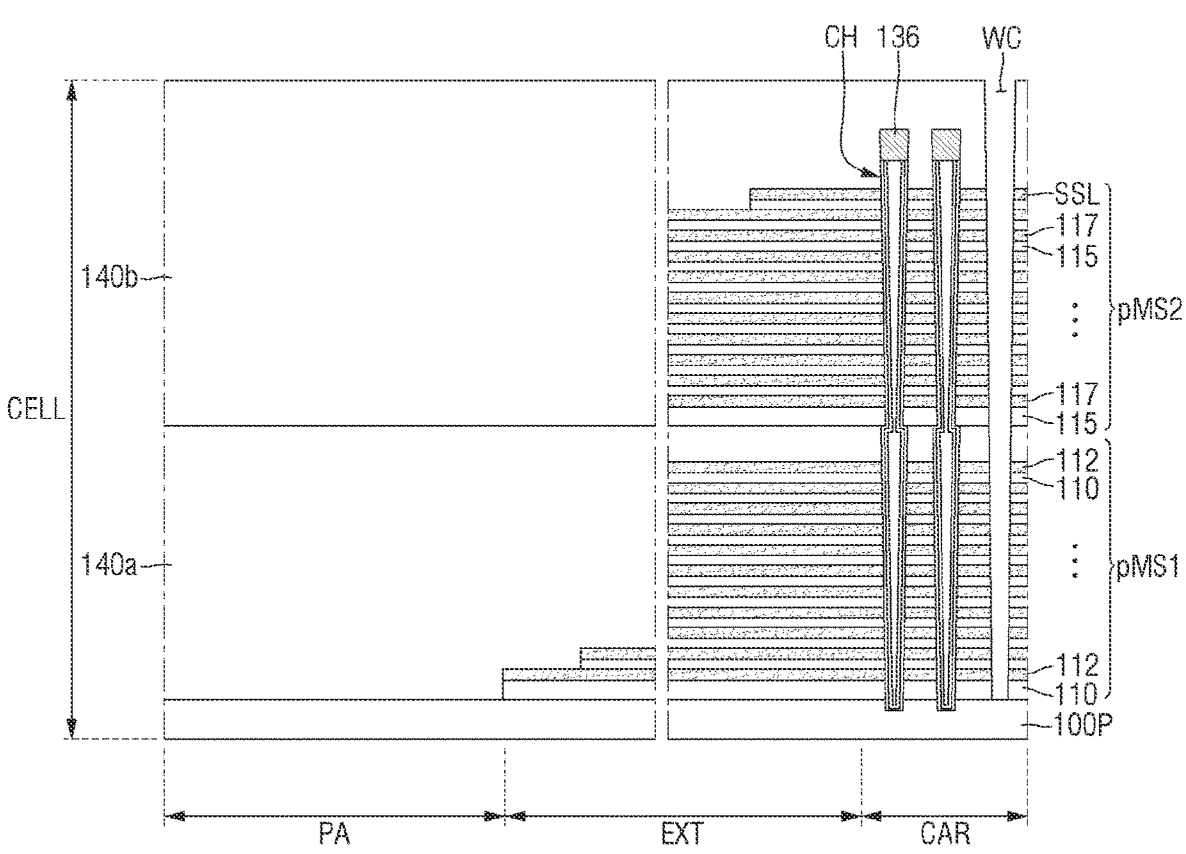

Referring to FIG. 22, a word line cut region WC is formed.

The word line cut region WC may extend in the first direction (e.g., the first direction X in FIG. 3) and cut the first preliminary mold pMS1 and the second preliminary mold pMS2.

Figure 23:
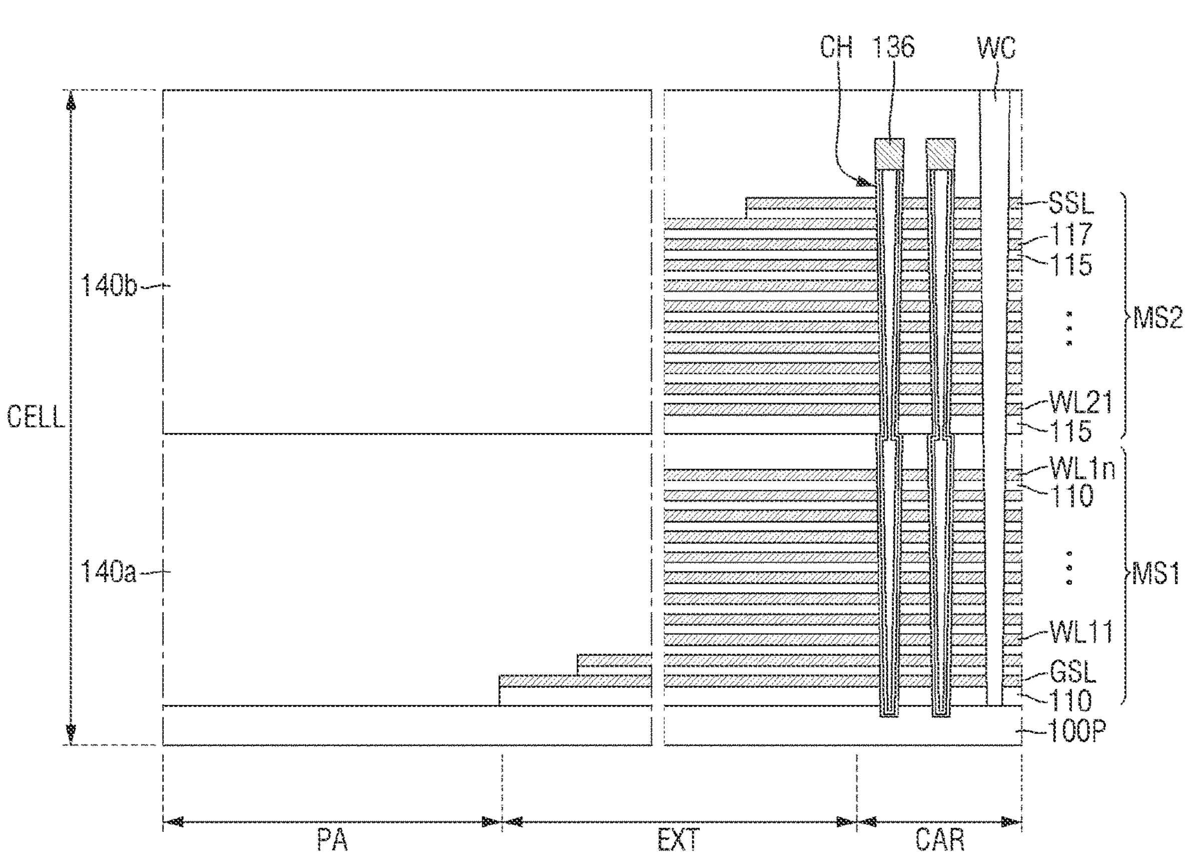

Referring to FIG. 23, a plurality of gate electrodes GSL, WL11 to WL1*n*, WL21 to WL2*n*, and SSL are formed.

For example, the mold sacrificial films 112 and 117 exposed by the word line cut region WC may be selectively removed. Thereafter, the gate electrodes GSL, WL11 to WL1*n*, WL21 to WL2*n*, and SSL that replace regions where the mold sacrificial films 112 and 117 are removed may be formed. Accordingly, a first mold structure MS1 including a plurality of first gate electrodes GSL and WL11 to WL1*n* and a second mold structure MS2 including a plurality of second gate electrodes WL21 to WL2*n* and SSL may be formed. After the first mold structure MS1 and the second mold structure MS2 are formed, the word line cut region WC may be filled with a filling material.

Figure 24:
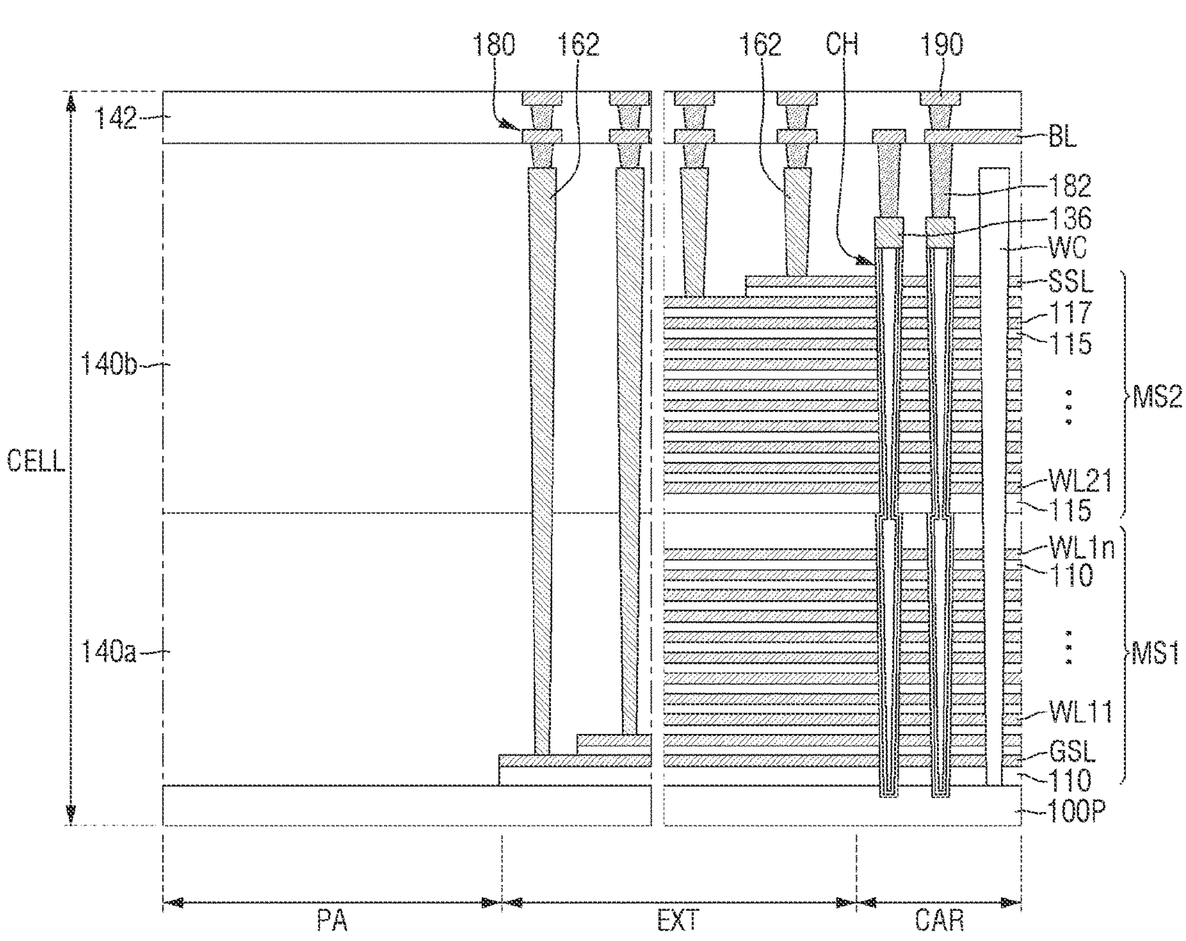

Referring to FIG. 24, gate contacts 162, a bit line contact 182, a bit line BL, and a cell interconnection structure 180 are formed on the mold structures MS1 and MS2.

A plurality of gate contacts 162 may be connected to the plurality of gate electrodes GSL, WL11 to WL1*n*, WL21 to WL2*n*, and SSL, respectively. The bit line BL may be formed on the second interlayer insulation film 140*b*. The bit line BL may be electrically connected to the channel structures CH through the bit line contact 182. The cell interconnection structure 180 may be electrically connected to the bit lines BL and the gate contacts 162.

Figure 25:
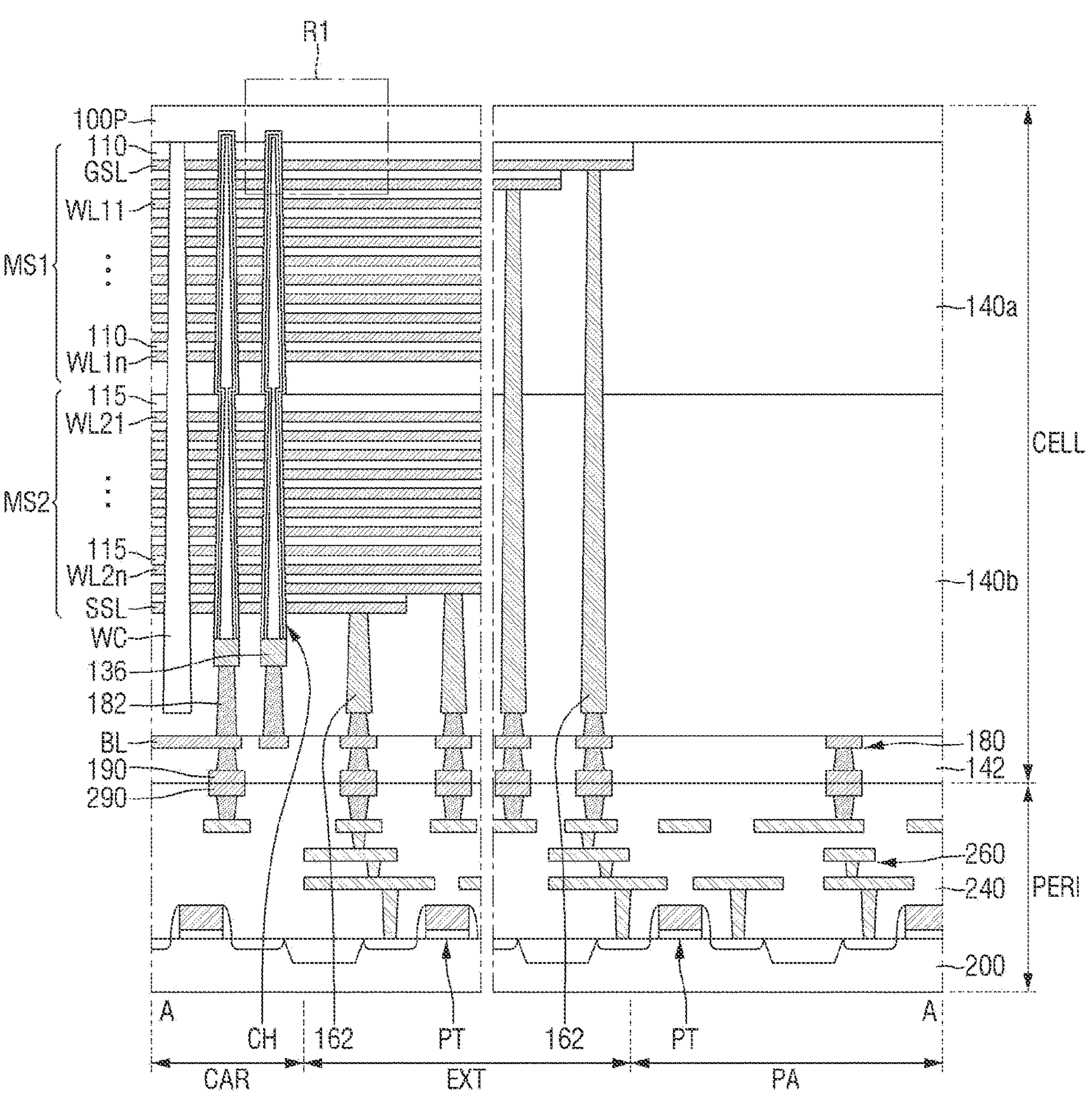
Figure 26:
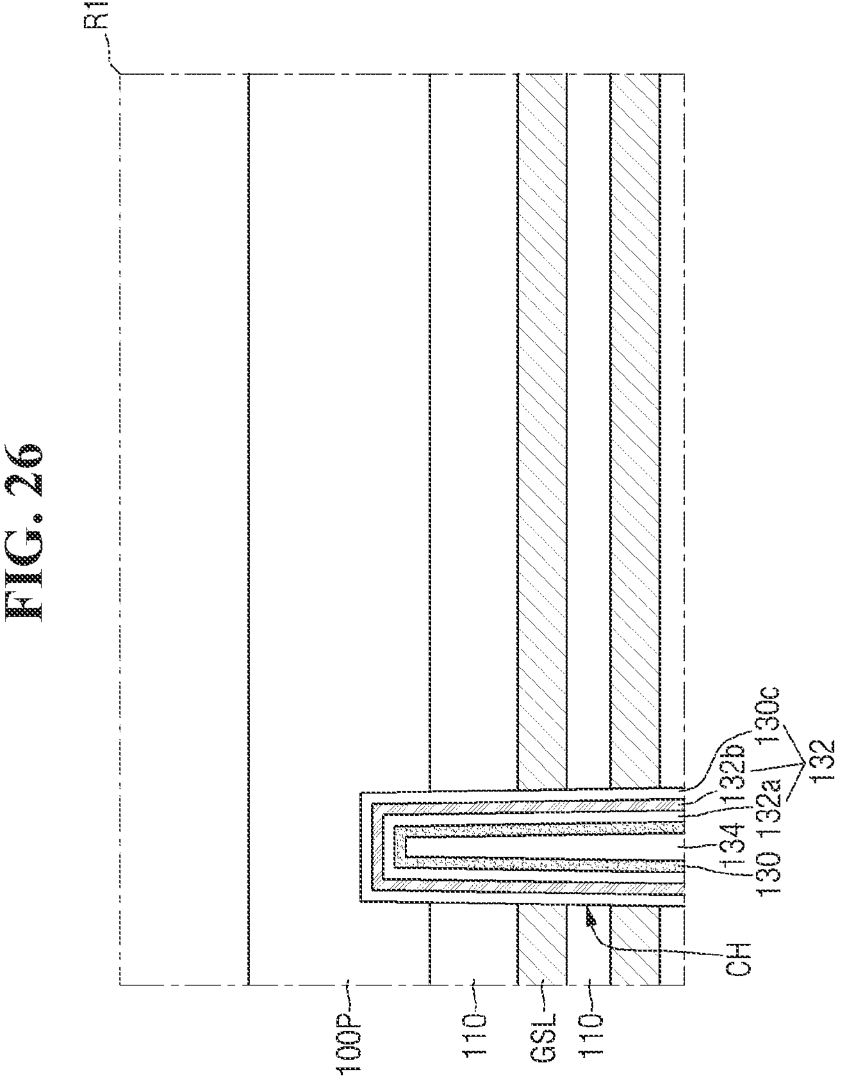

Referring to FIGS. 25 and 26, the cell structure CELL is stacked on the peripheral circuit structure PERI.

In some embodiments, the cell structure CELL and the peripheral circuit structure PERI may be stacked such that the front side of the base substrate 100P faces the front side of the peripheral circuit board 200. For example, the cell interconnection structure 180 may be stacked on the peripheral circuit interconnection structure 260.

For example, the first bonding metal 190 formed in the uppermost metal layer of the cell structure CELL and the second bonding metal 290 formed in the uppermost metal layer of the peripheral circuit structure PERI may be bonded to each other. When the first bonding metal 190 and the second bonding metal 290 are formed of copper (Cu), the bonding method may be a Cu—Cu bonding method. However, this is merely an example, and the first bonding metal 190 and the second bonding metal 290 may be made of various other metals such as aluminum Al or tungsten (W).

Figure 27:
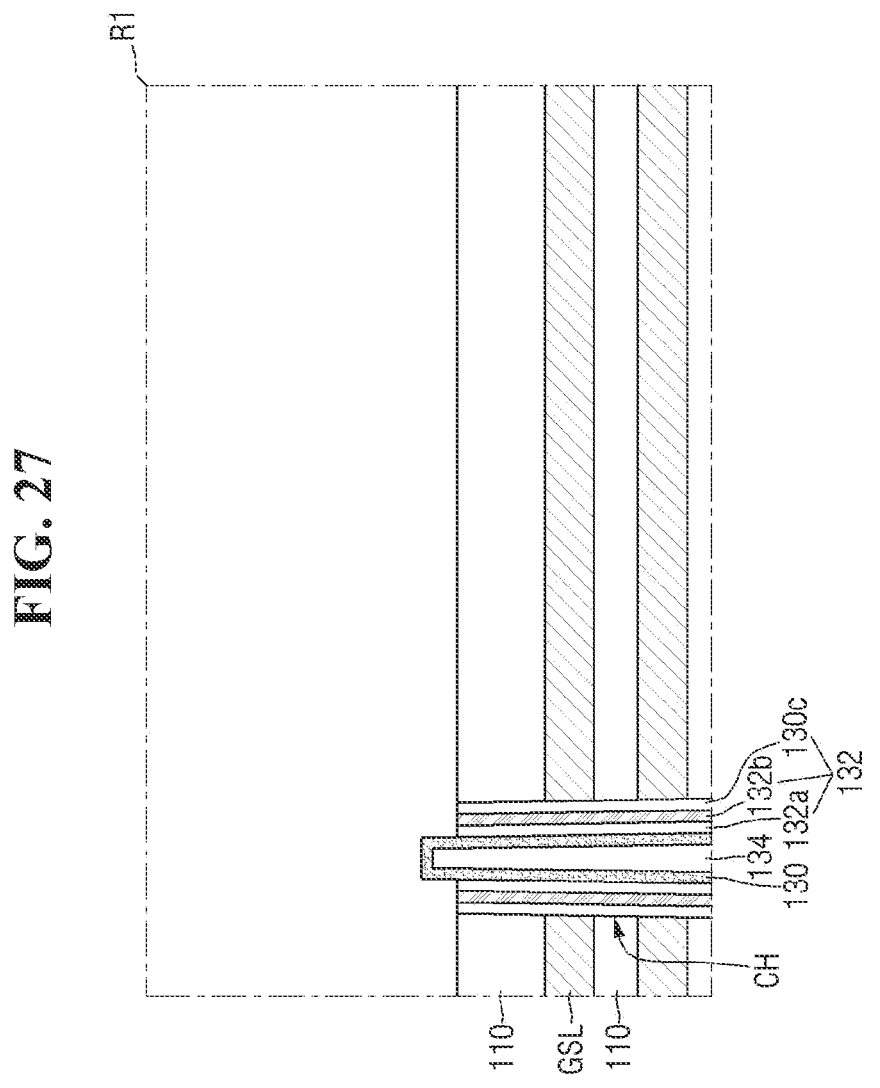

Referring to FIGS. 26 and 27, one end of the semiconductor pattern 130 is exposed.

For example, a planarization process or a recess process may be performed on a back side of the base substrate 100P. Accordingly, one end of the channel structure CH may be exposed by removing at least a portion of the base substrate 100P. Also, a portion of the data storage film 132 of the exposed channel structure CH may be removed.

In some embodiments, one end of the semiconductor pattern 130 may protrude further than one end of the data storage film 132. In some embodiments, one end of the data storage film 132 may be coplanar with the surface of the first mold insulation film 110.

Figure 28:
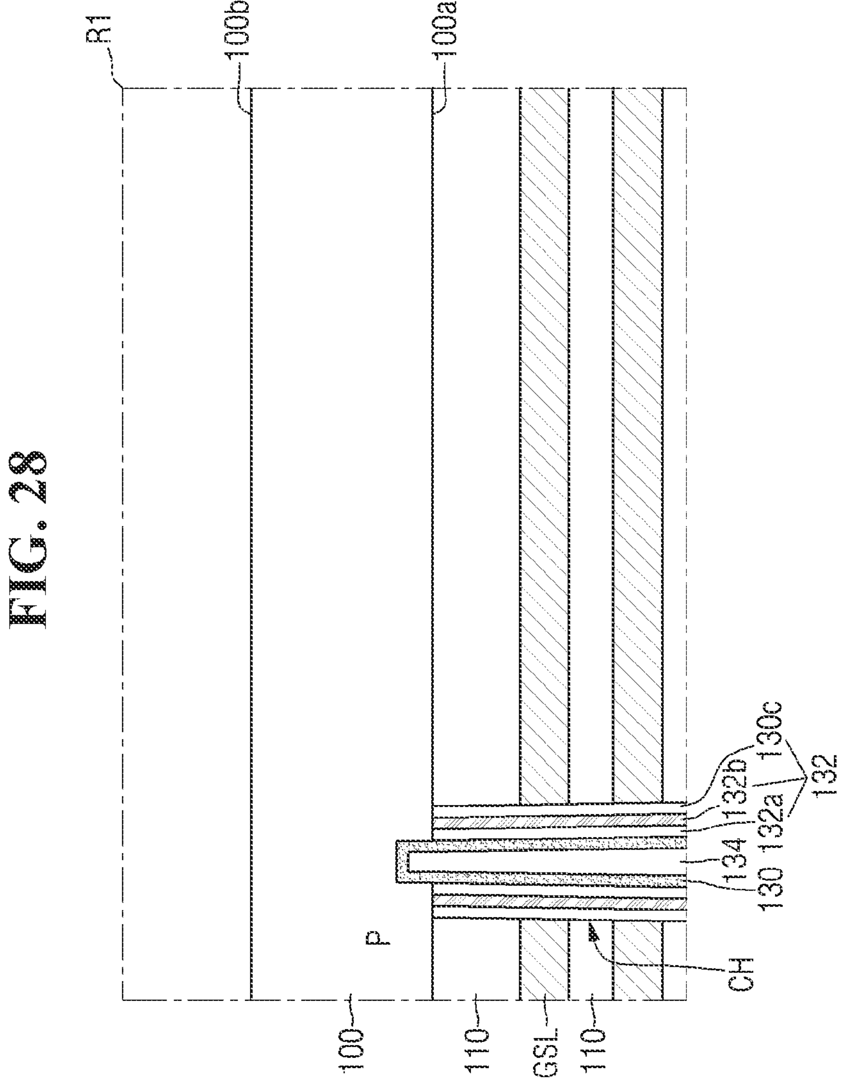

Referring to FIG. 28, the cell substrate 100 connected to the semiconductor pattern 130 is formed.

For example, the cell substrate 100 may be deposited on the surface of the first mold insulation film 110 from which the base substrate 100P is removed. The cell substrate 100 may include the first surface 100*a* on which the channel structure CH and the gate electrodes GSL, WL11 to WL1*n*, WL21 to WL2*n*, and SSL are disposed and the second surface 100*b* opposed to the first surface 100*a*.

In some embodiments, the cell substrate 100 may include impurities and may be of a first conductivity type. For example, the cell substrate 100 may include P-type impurities (e.g., boron (B), aluminum (Al), indium (In), gallium (Ga), or the like).

Figure 29:
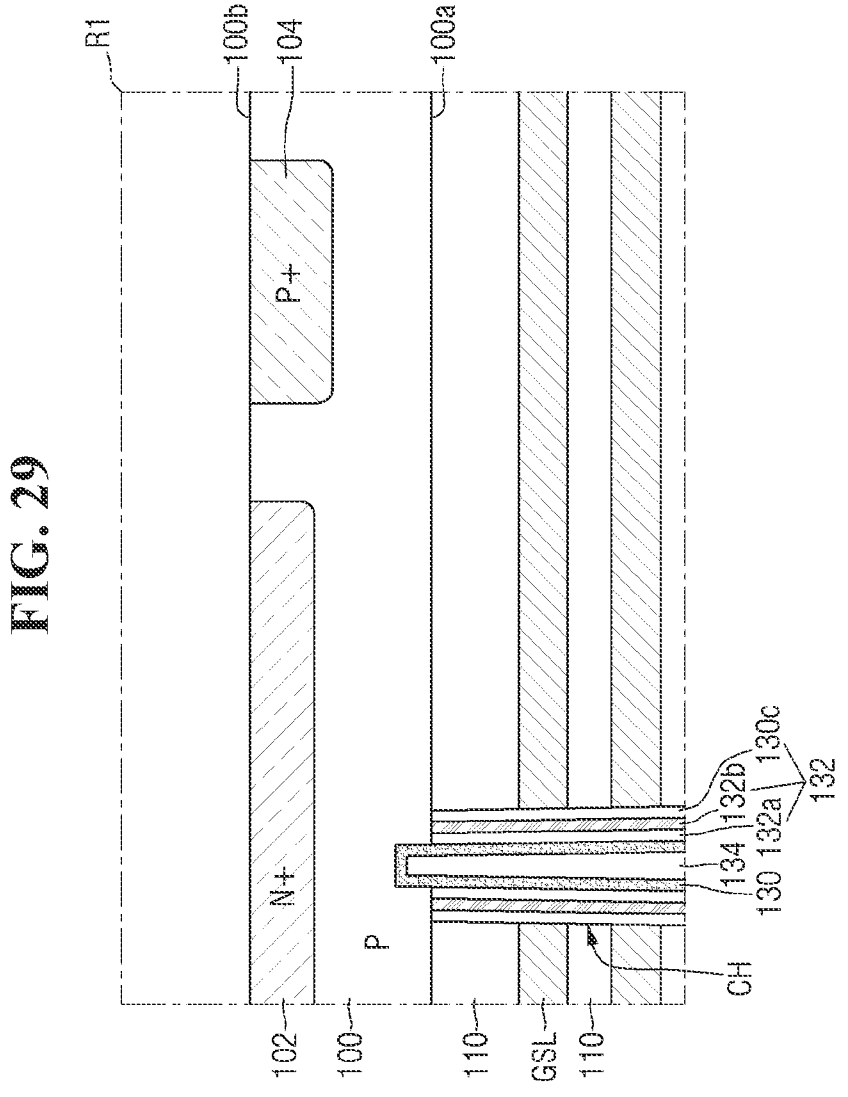

Referring to FIG. 29, a first impurity region 102 and a second impurity region 104 are formed in the cell substrate 100.

For example, a first ion-implantation process may be performed on the second surface 100*b* of the cell substrate 100. Accordingly, the first impurity region 102 may be formed in the cell substrate 100 adjacent to the second surface 100*b*. The first impurity region 102 may be of a second conductivity type that is different from the first conductivity type. For example, the first impurity region 102 may be formed by ion-implanting a high concentration of N-type impurities (e.g., phosphorus (P) or arsenic (As)) into the cell substrate 100 of the P-type.

In addition, for example, a second ion-implantation process may be performed on the second surface 100*b* of the cell substrate 100. Accordingly, the second impurity region 104 may be formed in the cell substrate 100 adjacent to the second surface 100*b*. The second impurity region 104 may have the first conductivity type with an impurity concentration higher than that of the cell substrate 100. For example, the second impurity region 104 may be formed by ion-implanting a high concentration of P-type impurities (e.g., boron (B), aluminum (Al), indium (In), or gallium (Ga)) into the P-type cell substrate 100.

Figure 30:
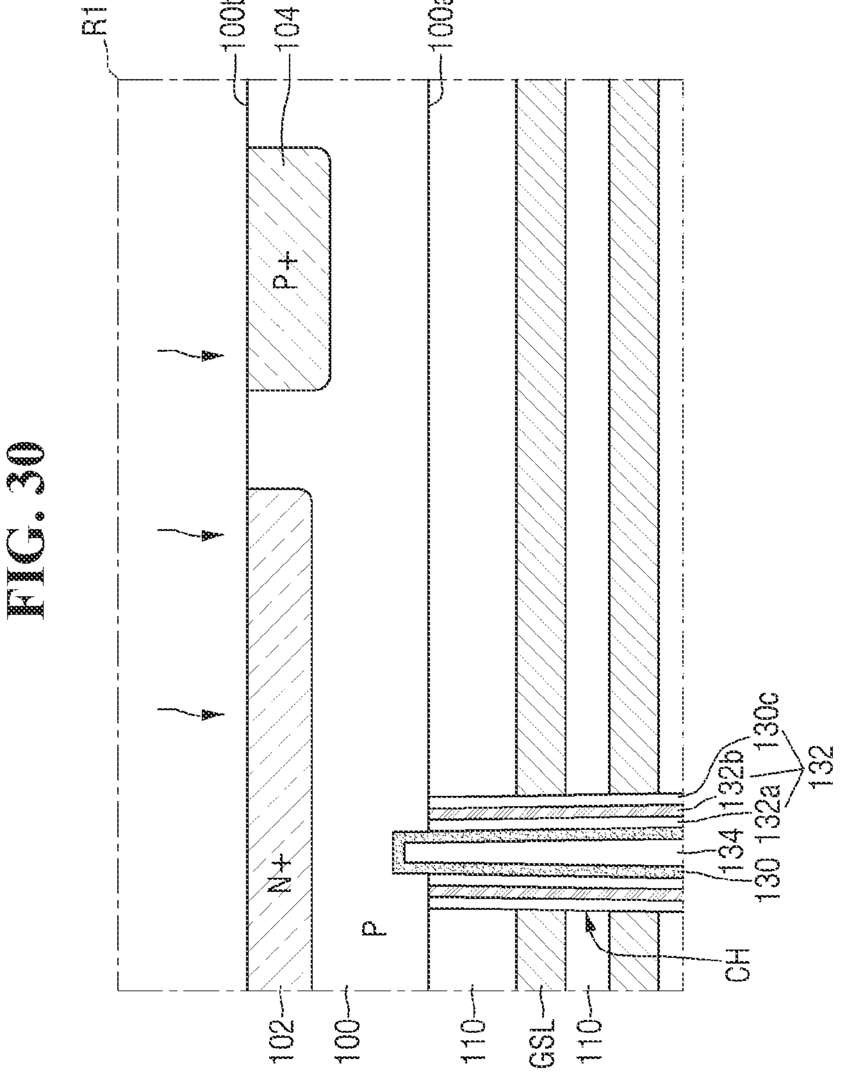

Referring to FIG. 30, a dopant activation process is performed on the second surface 100*b* of the cell substrate 100.

As the dopant activation process is performed, the dopant of the first impurity region 102 and/or the second impurity region 104 may be activated. In some embodiments, the dopant activation process may include a laser annealing process. If the laser annealing process is used, even in a C2C structure (e.g., after the cell structure CELL is stacked on the peripheral circuit structure PERI), the dopant of the first impurity region 102 and/or the second impurity region 104 may be activated. If a general annealing process is performed, the semiconductor memory device having a C2C structure may be damaged due to the relatively low melting point of the cell interconnection structure 180 and/or the peripheral circuit interconnection structure 260. In contrast, the laser annealing process can be performed locally on the second surface 100*b* of the cell substrate 100, and thus the dopant of the first impurity region 102 and/or the second impurity region 104 may be activated without damaging the cell interconnection structure 180 and/or the peripheral circuit interconnection structure 260.

Figure 31:
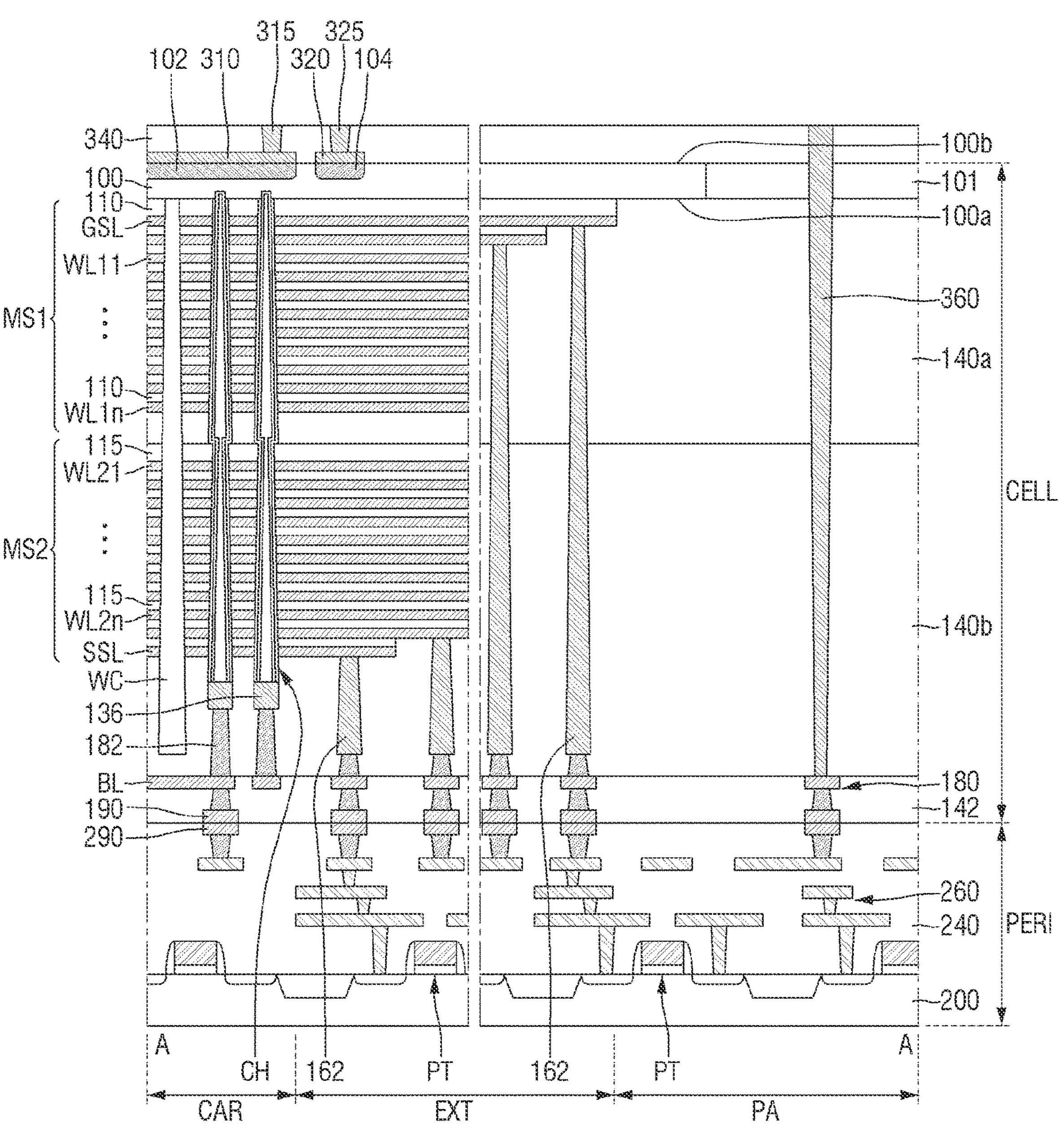

Referring to FIG. 31, the source plate 310, the conductive pad 320, the source contact 315, and the erase control contract 325 are formed on the second surface 100*b* of the cell substrate 100.

The source plate 310 may be connected to the first impurity region 102. The conductive pad 320 may be connected to the second impurity region 104. In addition, the third interlayer insulation film 340 that covers the source plate 310 and the conductive pad 320 may be formed. The source contact 315 may extend in the third direction Z in the third interlayer insulation film 340 and may be connected to the source plate 310. The erase control contact 325 may extend in the third direction Z in the third interlayer insulation film 340 and may be connected to the conductive pad 320.

In some embodiments, the contact plug 360 connected to the cell interconnection structure 180 may be formed. The contact plug 360 may be formed in the peripheral area PA. For example, the contact plug 360 may extend in the third direction Z and penetrate through the third interlayer insulation film 340, the insulating substrate 101, the first interlayer insulation film 140*a*, and the second interlayer insulation film 140*b*.

Referring back to FIG. 4, the input/output line structure 380 and the capping insulation film 342 are formed on the third interlayer insulation film 340. Accordingly, the semiconductor memory device described above with reference to FIGS. 3 to 8 may be fabricated.

FIGS. 32 to 35 are views illustrating methods of fabricating a semiconductor memory device according to some other embodiments. For convenience of description, the repeated parts described with reference to FIGS. 1 to 31 will be briefly described or omitted.

Figure 32:
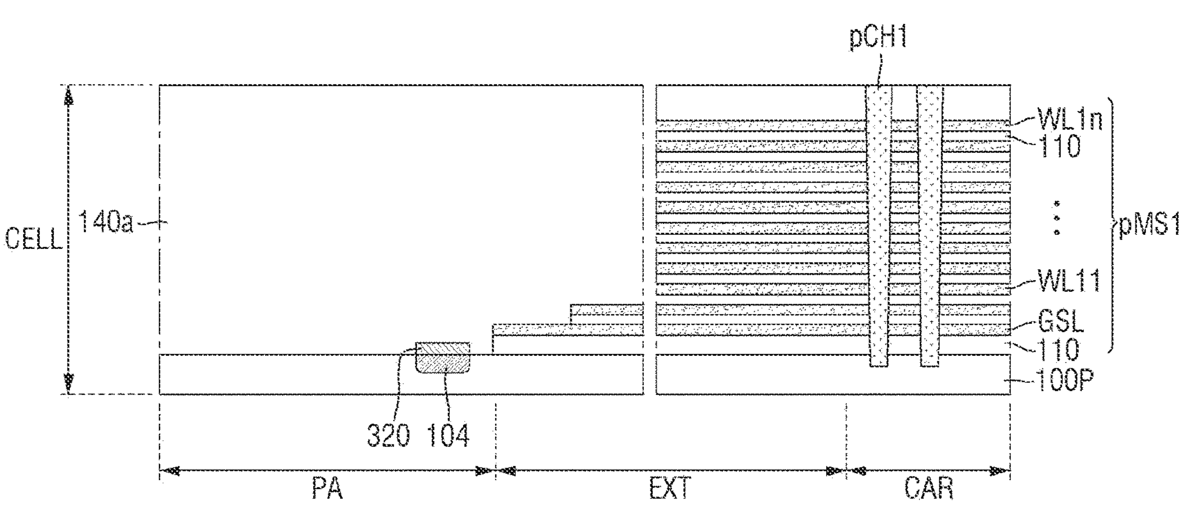

Referring to FIG. 32, a second impurity region 104 is formed in a base substrate 100P.

For example, a first ion-implantation process may be performed on the front side of the base substrate 100P. Accordingly, the second impurity region 104 adjacent to the front side of the base substrate 100P may be formed. The second impurity region 104 may have the first conductivity type with an impurity concentration higher than that of the base substrate 100P. For example, the second impurity region 104 may be formed by ion-implanting a high concentration of P-type impurities (e.g., boron (B), aluminum (Al), indium (In), or gallium (Ga)) into the P-type base substrate 100P.

In some embodiments, the second impurity region 104 may be formed in the cell substrate 100 of the peripheral region PA.

The second impurity region 104 may be formed before the first preliminary mold pMS1 and the first preliminary channel pCH1 are formed, or may be formed after the first preliminary mold pMS1 and the first preliminary channel pCH1 are formed.

In some embodiments, the conductive pad 320 may be formed on the front side of the base substrate 100P. The conductive pad 320 may be connected to the second impurity region 104.

Figure 33:
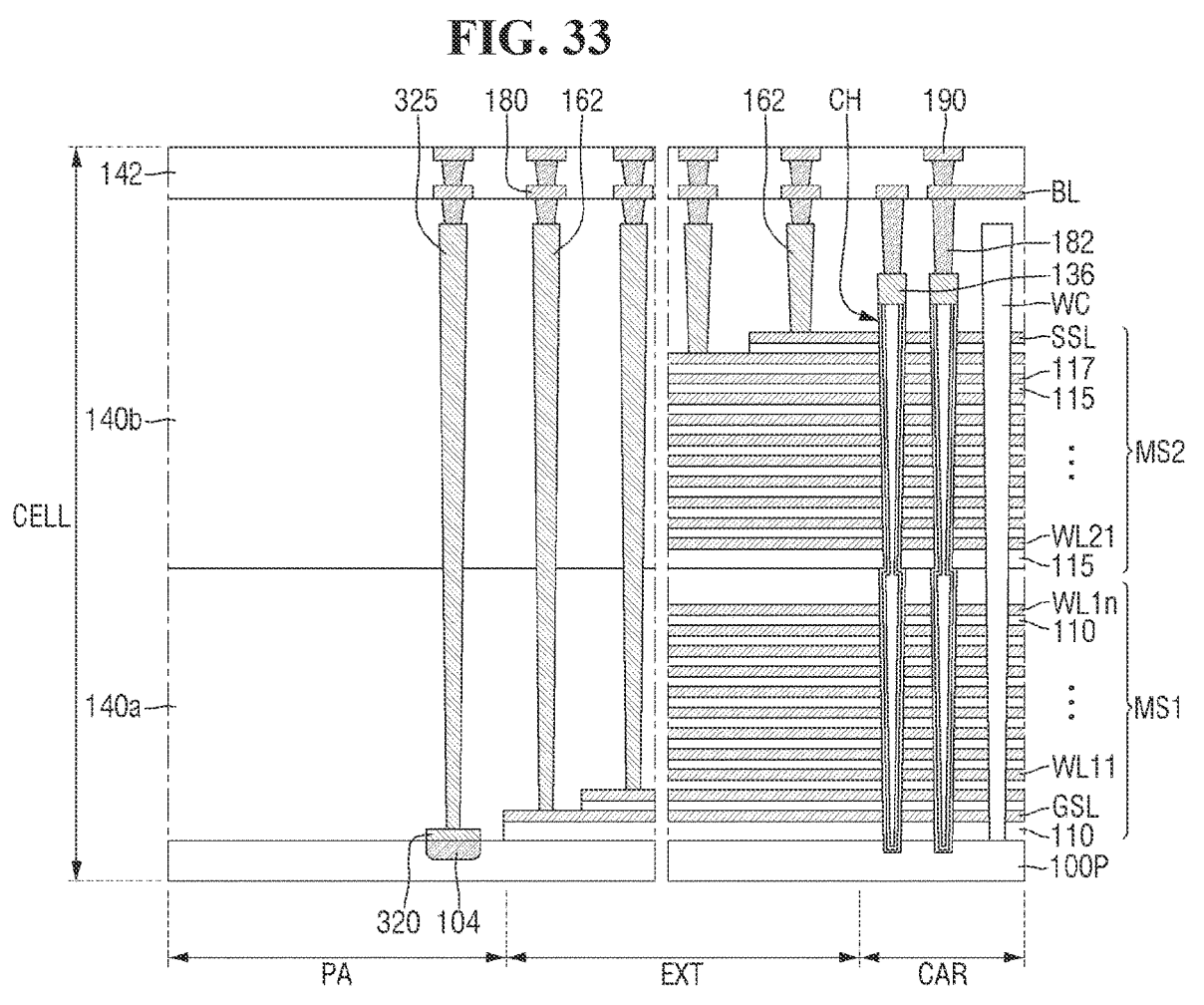

Referring to FIG. 33, the erase control contact 325 connected to the second impurity region 104 is formed.

For example, the processes described above with reference to FIGS. 20 to 23 may be performed. The gate electrode 162 and the erase control contact 325 may be formed. The erase control contact 325 may extend in the third direction Z in the interlayer insulation films 140*a* and 140*b* and may be connected to the conductive pad 320. In some embodiments, the erase control contact 325 and the gate contact 162 may be formed on the same level.

Thereafter, a bit line contact 182, a bit line BL, and a cell interconnection structure 180 may be formed on the mold structures MS1 and MS2. Since formation of the gate contact 162, the bit line contact 182, the bit line BL, and the cell interconnection structure 180 is similar to formation described above with reference to FIG. 24, detailed descriptions thereof will not be provided below.

Figure 34:
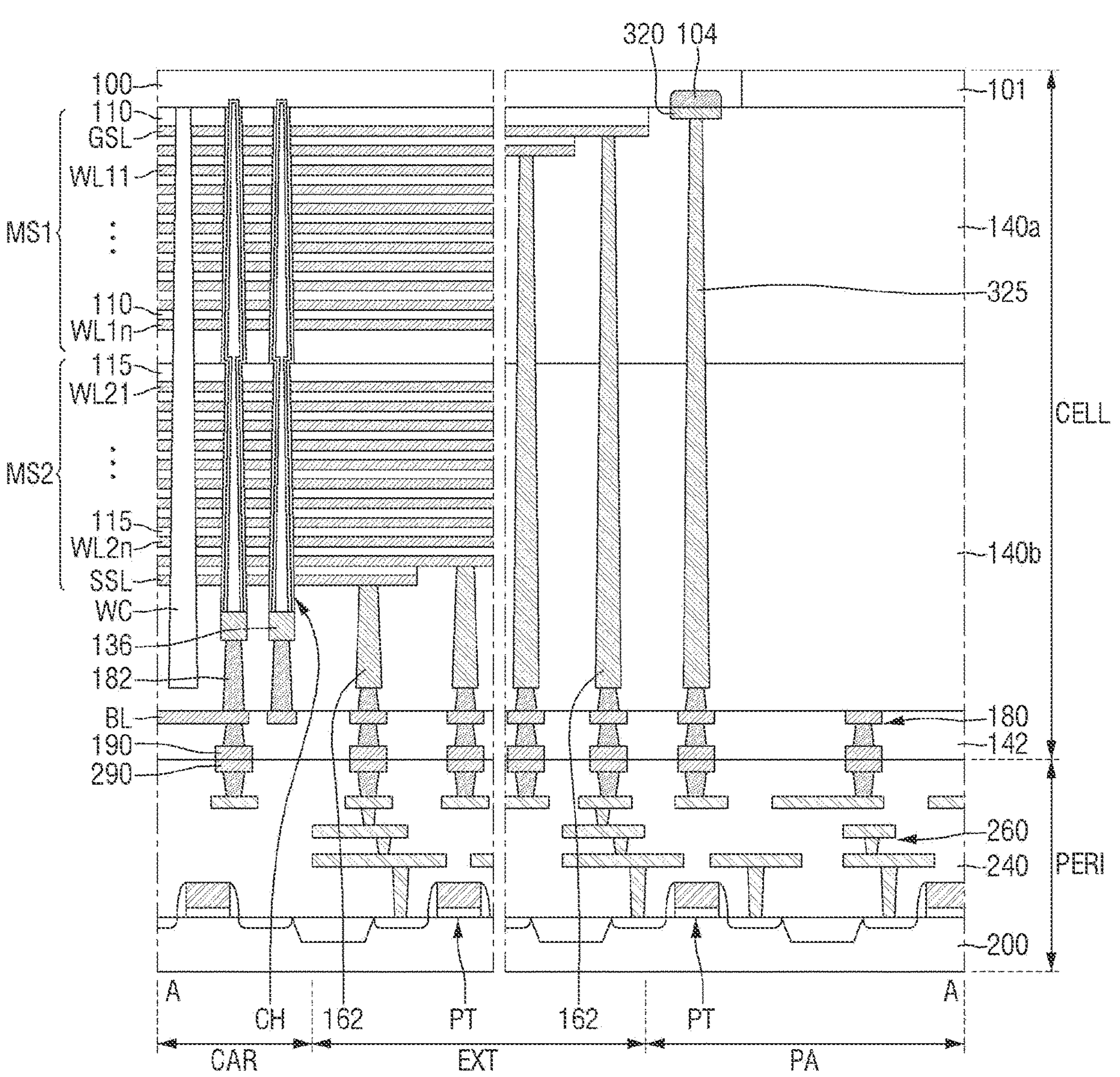

Referring to FIG. 34, a cell structure CELL is stacked on a peripheral circuit structure PERI.

Since stacking of the cell structure CELL on the peripheral circuit structure PERI is similar to processes described above with reference to FIGS. 25 and 26, a detailed description thereof will not be provided below. After the cell structure CELL is stacked on the peripheral circuit structure PERI, at least a portion of the base substrate 100P may be removed to form the cell substrate 100. For example, an insulating substrate 101 that replaces a portion of the base substrate 100P may be formed. Accordingly, the cell substrate 100 in which the second impurity region 104 is formed may be provided.

Figure 35:
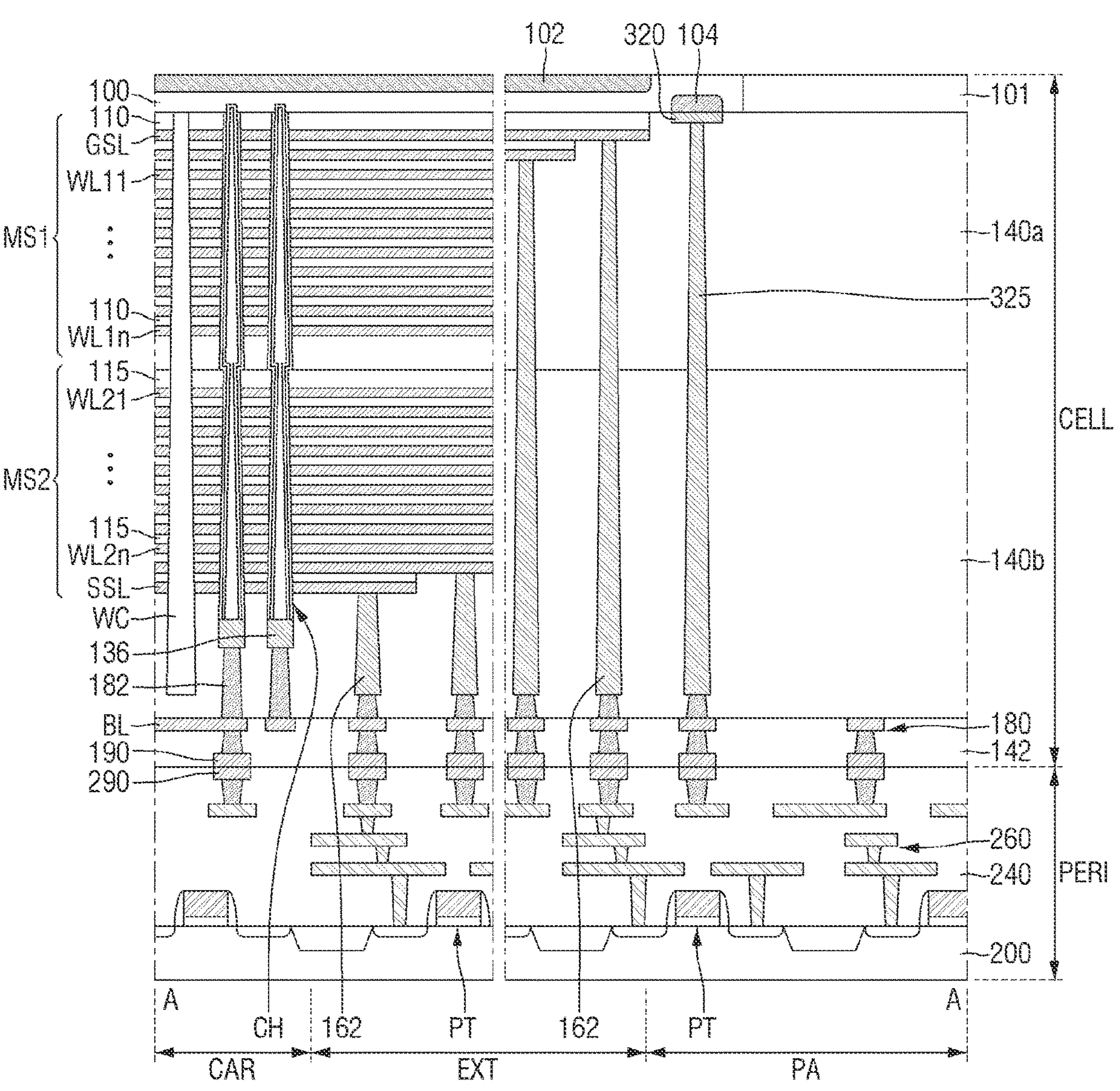

Referring to FIG. 35, a first impurity region 102 is formed in the cell substrate 100.

Since formation of the first impurity region 102 is similar to processes described above with reference to FIG. 29, a detailed description thereof will not be provided below.

Thereafter, the processes described above with reference to FIGS. 31 and 4 may be performed. Accordingly, the semiconductor memory device described above with reference to FIGS. 11 and 12 may be fabricated.

Figure 36:
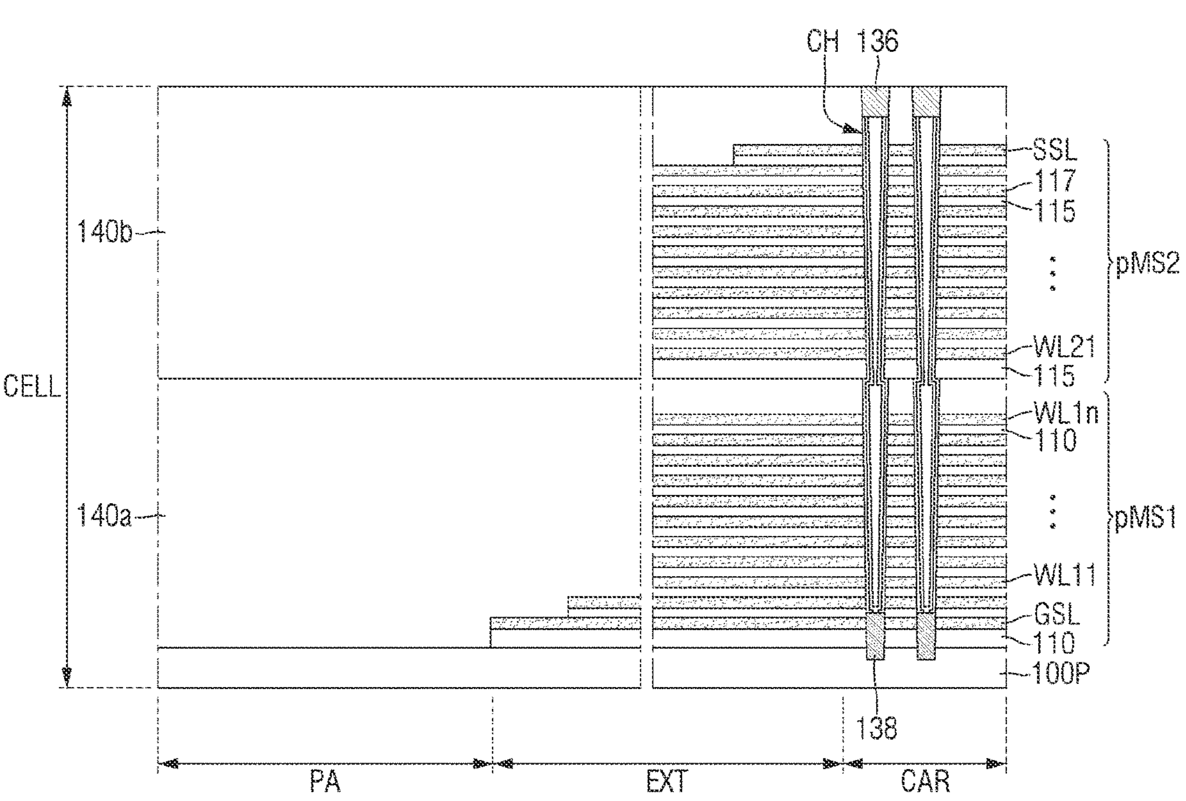
FIGS. 36 to 38 are views illustrating methods of fabricating a semiconductor memory device according to some other embodiments.
Figure 37:
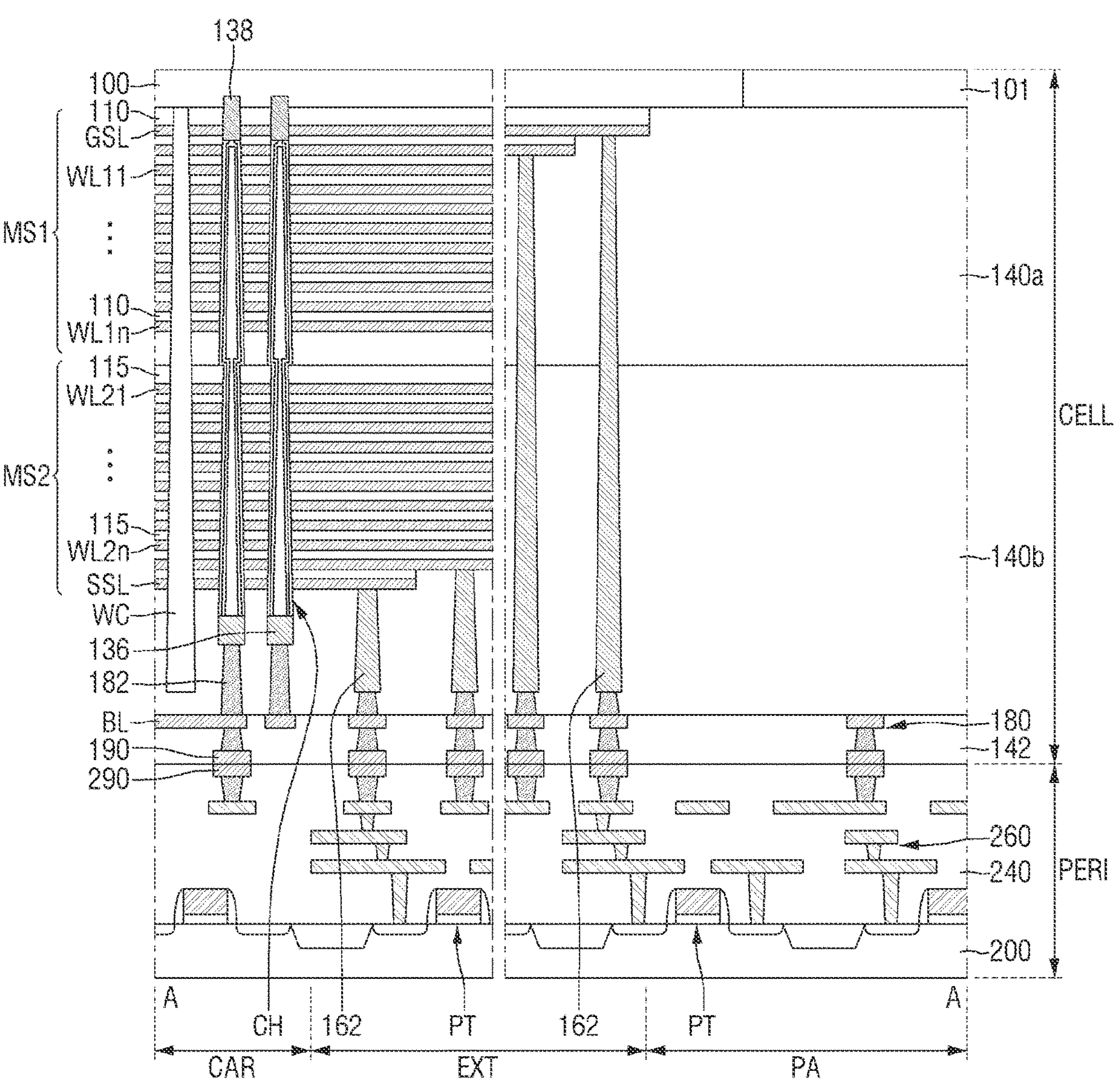
Figure 38:
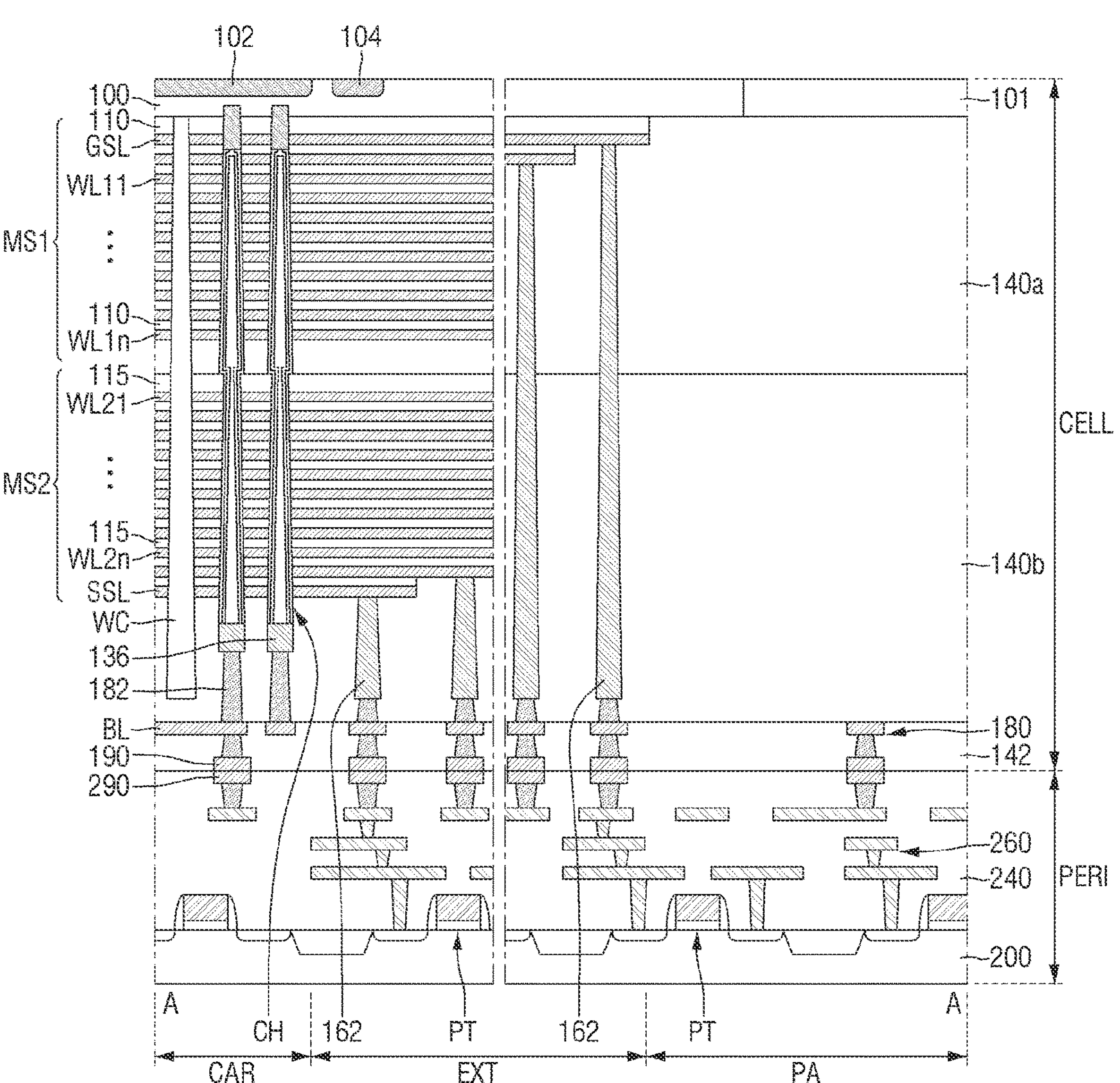

FIGS. 36 to 38 are views illustrating methods of fabricating a semiconductor memory device according to some other embodiments. For convenience of description, the repeated parts described with reference to FIGS. 1 to 31 will be briefly described or omitted. For reference, FIG. 36 is a view illustrating an intermediate stage of fabrication performed after the structure in FIG. 20 is formed.

Referring to FIG. 36, a channel structure CH including a second channel pad 138 is formed.

For example, the first preliminary channel pCH1 and the second preliminary channel pCH2 may be selectively removed. Thereafter, a second channel pad 138 grown from the base substrate 100P may be formed by a selective epitaxial growth (SEG) process. Accordingly, the channel structure CH including the second channel pad 130 connected to the base substrate 100P may be formed.

Referring to FIG. 37, a cell structure CELL is stacked on a peripheral circuit structure PERI.

For example, the processes described above with reference to FIGS. 22 to 26 may be performed. After the cell structure CELL is stacked on the peripheral circuit structure PERI, at least a portion of the base substrate 100P may be removed to form the cell substrate 100. For example, an insulating substrate 101 that replaces a portion of the base substrate 100P may be formed. Accordingly, the cell substrate 100 connected to the second channel pad 138 may be provided.

Referring to FIG. 38, a first impurity region 102 and a second impurity region 104 are formed in the cell substrate 100.

Since formation of the first impurity region 102 and the second impurity region 104 is similar to processes described above with reference to FIGS. 28 to 30, detailed descriptions thereof will not be provided below.

Thereafter, the stages described above with reference to FIGS. 31 and 4 may be performed. Accordingly, the semiconductor memory device described above with reference to FIGS. 17 and 18 may be fabricated.

Hereinafter, an electronic system including a semiconductor memory device according to example embodiments will be described with reference to FIGS. 1 to 18 and FIGS. 39 to 41.

Figure 39:
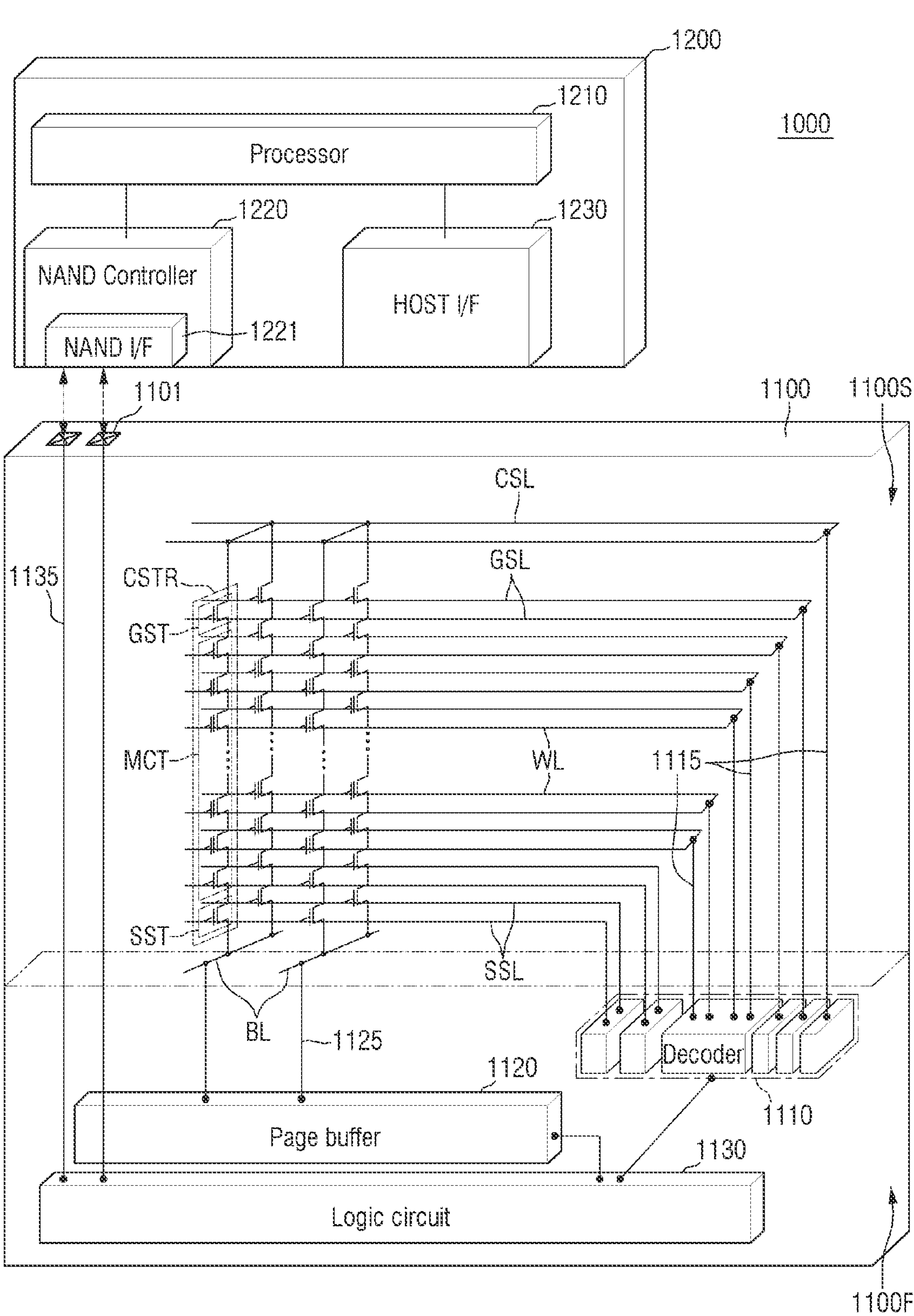
FIG. 39 is an example block diagram illustrating an electronic system according to some embodiments.
Figure 40:
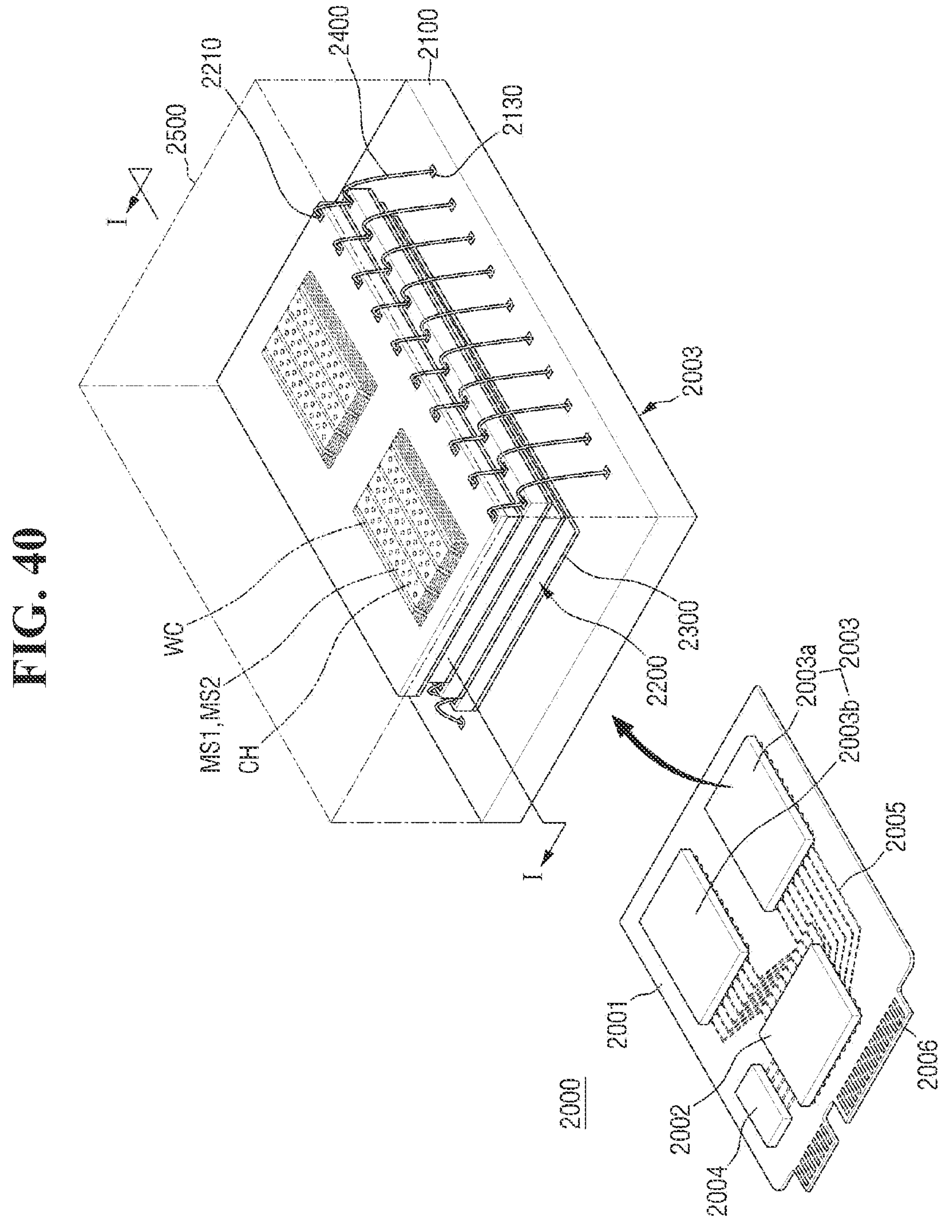
FIG. 40 is an example perspective view of an electronic system according to some embodiments.
Figure 41:
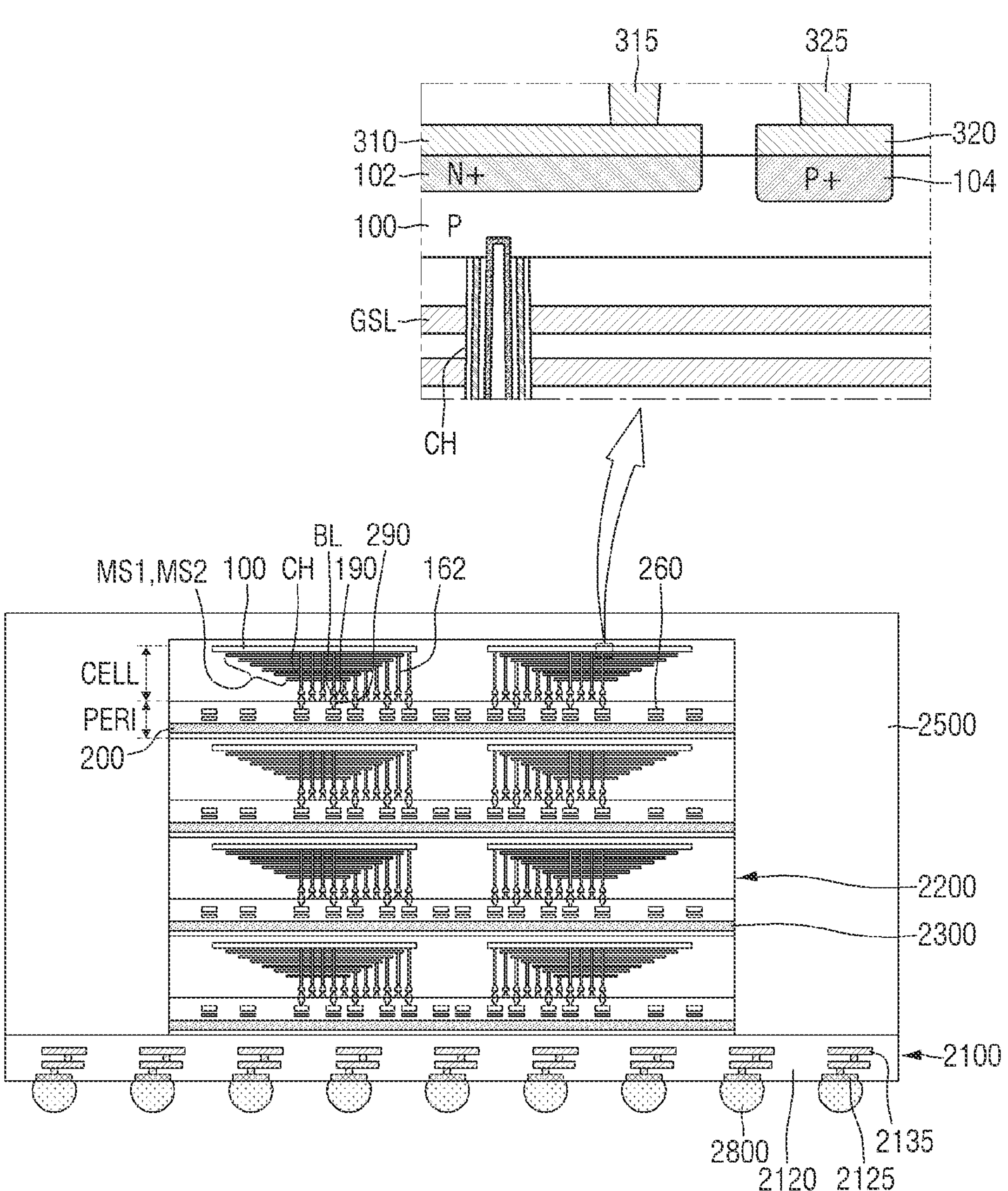
FIG. 41 is a schematic cross-sectional view taken along the line I-I of FIG. 40.

FIG. 39 is an example block diagram illustrating an electronic system according to some embodiments. FIG. 40 is an example perspective view of an electronic system according to some embodiments. FIG. 41 is a schematic cross-sectional view taken along the line I-I of FIG. 40. For convenience of description, the repeated parts described with reference to FIGS. 1 to 18 will be briefly described or omitted.

Referring to FIG. 39, an electronic system 1000 according to some embodiments may include a semiconductor memory device 1100 and a controller 1200 electrically connected to the semiconductor memory device 1100. The electronic system 1000 may be a storage device including one or a plurality of semiconductor memory devices 1100, or may be an electronic device including a storage device. For example, the electronic system 1000 may be a solid state drive (SSD) device, a universal serial bus (USB) device, a computing system, a medical apparatus, or a communication apparatus, each of which includes a single or a plurality of semiconductor devices 1100.

The semiconductor memory device 1100 may be a non-volatile memory device (e.g., a NAND flash memory device). For example, the semiconductor memory device 1100 may be the semiconductor memory device described above with reference to FIGS. 1 to 18. The semiconductor memory device 1100 may include a first structure 1100F and a second structure 1100S on the first structure 1100F.

The first structure 1100F may be a peripheral circuit structure that includes a decoder circuit 1110 (e.g., the row decoder 33 of FIG. 1), a page buffer 1120 (e.g., the page buffer 35 of FIG. 1), and a logic circuit 1130 (e.g., the control logic 37 of FIG. 1). The first structure 1100F may correspond to, for example, the peripheral circuit structure PERI described above with reference to FIGS. 1 to 18.

The second structure 1100S may include the common source line CSL, a plurality of bit lines BL, and a plurality of cell strings CSTR, which are described above with reference to FIG. 2. The cell strings CSTR may be connected to the decoder circuit 1110 through the word line WL, at least one string selection line SSL, and at least one ground selection line GSL. In addition, the cell strings CSTR may be connected to the page buffer 1120 through the bit lines BL. The second structure 1100S may correspond to, for example, the cell structure CELL described above with reference to FIGS. 1 to 18.

In some embodiments, the common source line CSL and the cell strings CSTR may be electrically connected to the decoder circuit 1110 through first connection lines 1115 that extend from the first structure 1100F toward the second structure 1100S. The first connection lines 1115 may correspond to, for example, the gate contacts 162 described above with reference to FIGS. 1 to 18. That is, the gate contacts 162 may electrically connect gate electrodes GSL, WL, and SSL to the decoder circuit 1110 (e.g., the row decoder 33 of FIG. 1).

In some embodiments, the bit lines BL may be electrically connected to the page buffer 1120 through second connection lines 1125. The second connection lines 1125 may correspond to, for example, the bit line contacts 182 described above with reference to FIGS. 1 to 18. That is, the bit line contacts 182 may electrically connect the bit lines BL to the page buffer 1120 (e.g., the page buffer 35 of FIG. 1).

The semiconductor memory device 1100 may communicate with the controller 1200 through an input/output pad 1101 electrically connected to the logic circuit 1130 (e.g., the control logic 37 of FIG. 1). The input/output pad 1101 may be electrically connected to the logic circuit 1130 through an input/output connection line 1135 that extends from the first structure 1100F toward the second structure 1100S. The connection line 1135 may correspond to, for example, the contact plug 360 described above with reference to FIGS. 1 to 18.

The controller 1200 may include a processor 1210, a NAND controller 1220, and a host interface 1230. In some embodiments, the electronic system 1000 may include a plurality of semiconductor devices 1100, and in this case, the controller 1200 may control the plurality of semiconductor devices 1100.

The processor 1210 may control overall operations of the electronic system 1000 including the controller 1200. The processor 1210 may operate based on predetermined firmware, and may control the NAND controller 1220 to access the semiconductor device 1100. The NAND controller 1220 may include a NAND interface 1221 that processes communication with the semiconductor device 1100. The NAND interface 1221 may be used to transfer therethrough a control command to control the semiconductor memory device 1100, data which is intended to be written on memory cell transistors MCT of the semiconductor memory device 1100, and/or data which is intended to be read from the memory cell transistors MCT of the semiconductor device 1100. The host interface 1230 may provide the electronic system 1000 with communication with an external host. When a control command is received through the host interface 1230 from an external host, the semiconductor memory device 1100 may be controlled by the processor 1210 in response to the control command.

Referring to FIGS. 40 and 41, an electronic system according to some embodiments may include a main board 2001, a controller 2002 mounted on the main board 2001, one or more semiconductor packages 2003, and a dynamic random access memory (DRAM) 2004. The semiconductor package 2003 and the DRAM 2004 may be connected to the main controller 2002 through wiring patterns 2005 provided in the main board 2001.

The main board 2001 may include a connector 2006 including a plurality of pins which have connection with an external host. The number and arrangement of the plurality of pins on the connector 2006 may be changed based on a communication interface between the electronic system 2000 and the external host. In some embodiments, the electronic system 2000 may communicate with the external host through one or more interfaces, e.g., USB, peripheral component interconnect express (PIC-Express), serial advanced technology attachment (SATA), and/or M-PHY for universal flash storage (UFS). In some embodiments, the electronic system 2000 may operate with power supplied through the connector 2006 from the external host. The electronic system 2000 may further include a power management integrated circuit (PMIC) that distributes the power supplied from the external host to the main controller 2002 and the semiconductor package 2003.

The main controller 2002 may write data to the semiconductor package 2003, may read data from the semiconductor package 2003, or may increase an operating speed of the electronic system 2000.

The DRAM 2004 may be a buffer memory that reduces a difference in speed between the external host and the semiconductor package 2003 that serves as a data storage space. The DRAM 2004 included in the electronic system 2000 may operate as a cache memory, and may provide a space for temporary data storage in a control operation of the semiconductor package 2003. When the DRAM 2004 is included in the electronic system 2000, the main controller 2002 may include not only a NAND controller for control of the semiconductor package 2003, but also a DRAM controller for control of the DRAM 2004.

The semiconductor package 2003 may include a first semiconductor package 2003*a* and a second semiconductor package 2003*b* that are spaced apart from each other. Each of the first and second semiconductor packages 2003*a* and 2003*b* may include a plurality of semiconductor chips 2200. Each of the first and second semiconductor packages 2003*a* and 2003*b* may include a package substrate 2100, semiconductor chips 2200 on the package substrate 2100, adhesive layers 2300 on bottom surfaces of the semiconductor chips 2200, connection structures 2400 that electrically connect the semiconductor chips 2200 to the package substrate 2100, and a molding layer 2500 that lies on the package substrate 2100 and covers the semiconductor chips 2200 and the connection structures 2400.

The package substrate 2100 may be, for example, a printed circuit board including package upper pads 2130. Each of the semiconductor chips 2200 may include one or more input/output pads 2210. The input/output pad 2210 may correspond to the input/output pad 1101 of FIG. 39.

In some embodiments, the connection structures 2400 may be, for example, bonding wires that electrically connect the input/output pads 2210 to the package upper pads 2130. Therefore, on each of the first and second semiconductor packages 2003*a* and 2003*b*, the semiconductor chips 2200 may be electrically connected to each other in a wire bonding manner, and may be electrically connected to the package upper pads 2130 of the package substrate 2100. In some embodiments, on each of the first and second semiconductor packages 2003*a* and 2003*b*, the semiconductor chips 2200 may be electrically connected to each other using through-silicon vias (TSV) instead of the connection structures 2400 or the bonding wires.

In some embodiments, the main controller 2002 and the semiconductor chips 2200 may be included in a single package. In some embodiments, the main controller 2002 and the semiconductor chips 2200 may be mounted on a separate interposer substrate other than the main board 2001, and may be connected to each other through wiring lines formed in the interposer substrate.

In some embodiments, the package substrate 2100 may be, for example, a printed circuit board. The package substrate 2100 may include a package substrate body 2120, package upper pads 2130 on a top surface of the package substrate body 2120, lower pads 2125 disposed or exposed on a bottom surface of the package substrate body 2120, and internal wiring lines 2135 that lie in the package substrate body 2120 and electrically connect the upper pads 2130 to the lower pads 2125. The upper pads 2130 may be electrically connected to connection structures 2400. The lower pads 2125 may be connected through conductive connectors 2800 to the wiring patterns 2005 in the main board 2001 of the electronic system 2000 shown in FIG. 40.

In the electronic system according to some embodiments, each of the semiconductor chips 2200 may include the semiconductor memory device described above with reference to FIGS. 1 to 18. For example, each of the semiconductor chips 2200 may include a peripheral circuit structure PERI and a cell structure CELL stacked on the peripheral circuit structure PERI. In some embodiments, the peripheral circuit structure PERI may include the peripheral circuit board 200 and the peripheral circuit interconnection structure 260 which are described above with reference to FIGS. 3 to 8. In addition, in an example, the cell structure CELL may include the cell substrate 100, the mold structures MS1 and MS2, the channel structures CH, the bit lines BL, the gate contacts 162, the first impurity region 102, the second impurity region 104, the source plate 310, the source contact, the conductive contact 320, and the erase control contact 325, which are described above with reference to FIGS. 3 to 8. The peripheral circuit structure PERI and the cell structure CELL may be bonded to each other through a first bonding metal 190 and a second bonding metal 290.

As used herein, an element or region that is "covering" or "surrounding" or "filling" another element or region may completely or partially cover or surround or fill the other element or region. Further, the term "and/or" includes any and all combinations of one or more of the associated listed items.

While the present inventive concept has been particularly shown and described with reference to example embodiments thereof, it will be understood by those of ordinary skill in the art that various changes in form and details may be made therein without departing from the scope of the present invention as defined by the following claims. It is therefore desired that the embodiments described herein be considered in all respects as illustrative and not restrictive, reference being made to the appended claims rather than the foregoing description to indicate the scope of the present invention.

What is claimed:

1. A semiconductor memory device comprising:
a peripheral circuit structure; and
a cell structure on the peripheral circuit structure,
wherein the cell structure comprises:
a cell substrate including a first surface facing the peripheral circuit structure and a second surface opposite to the first surface, the cell substrate having a first conductivity type;
a plurality of gate electrodes stacked on the first surface of the cell substrate;
a channel structure that intersects the plurality of gate electrodes and is electrically connected to the cell substrate;
a first impurity region in the cell substrate adjacent to the second surface, the first impurity region having a second conductivity type different from the first conductivity type; and
a second impurity region that is in the cell substrate and is spaced apart from the first impurity region, the second impurity region having the first conductivity type with a higher impurity concentration than that of the cell substrate, wherein at least a portion of the cell substrate is positioned between the first impurity region and the second impurity region.

2. The semiconductor memory device of claim 1, wherein
the semiconductor memory device comprises a cell array region in which the channel structure is provided and an extension region in which the plurality of gate electrodes are stacked in a stair shape,
the first impurity region is in a first portion of the cell substrate in the cell array region, and
the second impurity region is around at least a portion of the first impurity region in a plan view.

3. The semiconductor memory device of claim 2, wherein the second impurity region is in a second portion of the cell substrate in the extension region.

4. The semiconductor memory device of claim 1, wherein the second impurity region is adjacent to the second surface of the cell substrate.

5. The semiconductor memory device of claim 1, further comprising:
a source plate extending on the first impurity region and the second surface of the cell substrate; and
a source contact electrically connected to the source plate.

6. The semiconductor memory device of claim 1, further comprising:
an erase control contact that is electrically connected to the second impurity region and is on the second surface of the cell substrate.

7. The semiconductor memory device of claim 6, further comprising:
a conductive pad extending on the second impurity region and on the second surface of the cell substrate,
wherein the erase control contact is electrically connected to the conductive pad.

8. The semiconductor memory device of claim 1, wherein the first conductivity type is a P-type and the second conductivity type is an N-type.

9. The semiconductor memory device of claim 1, wherein the channel structure comprises a semiconductor pattern that comprises a portion in the plurality of gate electrodes and is electrically connected to the cell substrate, and a data storage film interposed between the semiconductor pattern and the plurality of gate electrodes.

10. The semiconductor memory device of claim 9, wherein
the semiconductor pattern protrudes into the first surface of the cell substrate and comprises an end portion in the cell substrate, and
the data storage film is on the first surface of the cell substrate.

11. A semiconductor memory device comprising a peripheral circuit structure and a cell structure on the peripheral circuit structure,
wherein the peripheral circuit structure comprises:
a peripheral circuit board;
a peripheral circuit element on the peripheral circuit board; and
a peripheral circuit interconnection structure electrically connected to the peripheral circuit element, and the cell structure comprises:

a cell substrate having a P-type conductivity and including a first surface facing the peripheral circuit structure and a second surface opposite to the first surface;

a mold structure comprising a plurality of gate electrodes stacked on the first surface of the cell substrate;

a plurality of channel structures, each of which extends in a vertical direction that is not parallel to the first surface of the cell substrate, extends through the mold structure, and is electrically connected to the cell substrate;

a bit line that is electrically connected to the plurality of channel structures and is between the peripheral circuit structure and the mold structure;

a plurality of gate contacts that are electrically connected to the plurality of gate electrodes, respectively and are on the mold structure;

a cell interconnection structure that is electrically connected to the bit line and the plurality of gate contacts and contacts the peripheral circuit interconnection structure;

a first impurity region that has an N-type conductivity, overlaps the plurality of channel structures in the vertical direction and is in the cell substrate adjacent to the second surface; and a second impurity region that has a P-type conductivity, is around at least a portion of the first impurity region in a plan view and is in the cell substrate, the second impurity region having a higher impurity concentration than that of the cell substrate, wherein at least a portion of the cell substrate is positioned between the first impurity region and the second impurity region.

12. The semiconductor memory device of claim 11, wherein the second impurity region does not overlap the plurality of channel structures in the vertical direction.

13. The semiconductor memory device of claim 11, wherein the second impurity region comprises a line-shaped impurity region extending along a side surface of the first impurity region.

14. The semiconductor memory device of claim 11, wherein the second impurity region comprises a plurality of impurity regions that are spaced apart from each other and are arranged along a side surface of the first impurity region.

15. The semiconductor memory device of claim 11, further comprising an input/output line structure that is electrically connected to the first impurity region and the second impurity region and is on the second surface of the cell substrate.

16. The semiconductor memory device of claim 15, further comprising:

a source plate extending on the first impurity region and on the second surface of the cell substrate; and a source contact extending in the vertical direction and electrically connecting the input/output line structure to the source plate.

17. The semiconductor memory device of claim 15, further comprising a contact plug that extends in the vertical direction and electrically connects the cell interconnection structure to the input/output line structure.

18. An electronic system comprising:

a main substrate;

a semiconductor memory device that is on the main substrate and comprises a peripheral circuit structure and a cell structure on the peripheral circuit structure; and a controller that is electrically connected to the semiconductor memory device and is on the main substrate, wherein the cell structure comprises:

a cell substrate including a first surface facing the peripheral circuit structure and a second surface opposite to the first surface, the cell substrate having a first conductivity type;

a plurality of gate electrodes stacked on the first surface of the cell substrate;

a channel structure that intersects the plurality of gate electrodes and is electrically connected to the cell substrate;

a first impurity region in the cell substrate adjacent to the second surface of the cell substrate, the first impurity region having a second conductivity type different from the first conductivity type; and a second impurity region that is in the cell substrate and is spaced apart from the first impurity region, the second impurity region having the first conductivity type with a higher impurity concentration than that of the cell substrate, wherein at least a portion of the cell substrate is positioned between the first impurity region and the second impurity region.

19. The electronic system of claim 18, wherein the controller is configured to perform a read operation through the first impurity region, and the controller is configured to perform an erase operation through the second impurity region.

20. The electronic system of claim 18, wherein the first conductivity type is a P-type, and the second conductivity type is an N-type.

* * * * *